(12) United States Patent
Uenoyama et al.

(10) Patent No.: US 12,046,874 B2
(45) Date of Patent: Jul. 23, 2024

(54) LIGHT-EMITTING DEVICE

(71) Applicant: HAMAMATSU PHOTONICS K.K., Hamamatsu (JP)

(72) Inventors: Soh Uenoyama, Hamamatsu (JP); Kazuyoshi Hirose, Hamamatsu (JP); Yoshitaka Kurosaka, Hamamatsu (JP); Hiroshi Tanaka, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 870 days.

(21) Appl. No.: 17/054,000

(22) PCT Filed: May 14, 2019

(86) PCT No.: PCT/JP2019/019158
§ 371 (c)(1),
(2) Date: Nov. 9, 2020

(87) PCT Pub. No.: WO2019/221133
PCT Pub. Date: Nov. 21, 2019

(65) Prior Publication Data
US 2021/0273411 A1 Sep. 2, 2021

(30) Foreign Application Priority Data
May 15, 2018 (JP) ................ 2018-093545

(51) Int. Cl.
*H01S 5/00* (2006.01)
*H01S 5/026* (2006.01)
(Continued)

(52) U.S. Cl.
CPC ............ *H01S 5/2027* (2013.01); *H01S 5/026* (2013.01); *H01S 5/11* (2021.01); *H01S 5/18361* (2013.01);
(Continued)

(58) Field of Classification Search
CPC .......... H01S 5/2027; H01S 5/026; H01S 5/11; H01S 5/18361; H01S 5/18375; H01S 5/18377; H01S 5/185; H01S 5/42
See application file for complete search history.

(56) References Cited

U.S. PATENT DOCUMENTS 9,843,160 B1   12/2017   Schubert et al.
2013/0215483 A1   8/2013   Han et al.
(Continued)

FOREIGN PATENT DOCUMENTS

CN   102916344 A   2/2013
CN   102969414 A   3/2013
(Continued)

OTHER PUBLICATIONS

Huang, Yao-Wei, et al., "Gate-Tunable Conducting Oxide Metasurfaces," Nano Letters, Aug. 26, 2016, vol. 16, p. 5319-p. 5325.
(Continued)

*Primary Examiner* — Kinam Park
(74) *Attorney, Agent, or Firm* — Faegre Drinker Biddle & Reath LLP

(57) ABSTRACT

The present embodiment relates to a light-emitting device comprising a reflective metasurface modulating a phase for each of pixels constituting a one- or two-dimensional array. The light-emitting device comprises a surface emitting laser element, a light guide layer, and the metasurface. The metasurface has a light transmissive layer including a dielectric layer, one metal film on one surface thereof, and the other metal film on the other surface thereof. In each of unit regions corresponding to the pixels, the light transmissive layer includes a portion exposed without being covered with the metal film. The width of each unit region and the thickness of the light transmissive layer are smaller than the wavelength of the laser light to the metasurface. The metasurface modulates the phase of the laser light for each unit
(Continued)

region. A first light output surface outputs the modulated laser.

19 Claims, 46 Drawing Sheets

(51) Int. Cl.
*H01S 5/11* (2021.01)
*H01S 5/183* (2006.01)
*H01S 5/185* (2021.01)
*H01S 5/20* (2006.01)
*H01S 5/42* (2006.01)
*G02F 1/015* (2006.01)
*G02F 1/29* (2006.01)
*H01S 5/12* (2021.01)

(52) U.S. Cl.
CPC ...... *H01S 5/18375* (2013.01); *H01S 5/18377* (2013.01); *H01S 5/185* (2021.01); *H01S 5/42* (2013.01); *G02F 1/0151* (2021.01); *G02F 1/292* (2013.01); *G02F 2202/30* (2013.01); *H01S 5/12* (2013.01); *H01S 5/183* (2013.01)

(56) References Cited

U.S. PATENT DOCUMENTS

| | | |
|---|---|---|
| 2016/0209680 A1 | 7/2016 | Chen et al. |
| 2017/0082842 A1* | 3/2017 | Shaltout ............... H01S 5/1042 |
| 2017/0090221 A1* | 3/2017 | Atwater ................ G02B 1/002 |
| 2017/0176651 A1 | 6/2017 | Lee et al. |
| 2017/0307953 A1 | 10/2017 | Menegoli et al. |
| 2017/0338624 A1 | 11/2017 | Takiguchi et al. |
| 2018/0006426 A1 | 1/2018 | Takiguchi et al. |
| 2018/0052501 A1* | 2/2018 | Jones, Jr. ............. G02B 5/3025 |
| 2018/0074226 A1 | 3/2018 | Nomoto et al. |
| 2019/0252856 A1* | 8/2019 | Hirose ................... H01S 5/187 |
| 2021/0240052 A1* | 8/2021 | Uenoyama ............. G02F 1/355 |

FOREIGN PATENT DOCUMENTS

| | | |
|---|---|---|
| CN | 103988379 A | 8/2014 |
| CN | 105191029 A | 12/2015 |
| JP | 2016-122711 A | 7/2016 |
| JP | 2016-129208 A | 7/2016 |
| JP | 2018-045073 A | 3/2018 |
| JP | 2018-046395 A | 3/2018 |
| WO | WO-2015/008627 A1 | 1/2015 |
| WO | WO-2016/013466 A1 | 1/2016 |
| WO | WO 2016/111332 A1 | 7/2016 |
| WO | WO-2017/217168 A1 | 12/2017 |
| WO | WO-2018/047717 A1 | 3/2018 |

OTHER PUBLICATIONS

Kitt, A.L., et al., "Visible metasurfaces and ruled diffraction gratings: a comparison," Optical Materials Express, Nov. 23, 2015, vol. 5, No. 12, p. 2895-p. 2901.
Kurosaka, Yoshitaka, et al., "Effects of non-lasing band in two-dimensional photonic-crystal lasers clarified using omnidirectional band structure," Opt. Express 20, 2012, p. 21773-p. 21783.
Pors, Anders, et al., "Analog Computing Using Reflective Plasmonic Metasurfaces," Nano Letters, Dec. 18, 2014, vol. 15, p. 791-p. 797.
Yao, Yu et al., "Electrically Tunable Metasurface Perfect Absorbers for Ultrathin Mid-Infrared Optical Modulators", Nano Letters, Oct. 13, 2014, vol. 14, p. 6526-p. 6532.
International Preliminary Report on Patentability mailed Nov. 26, 2020 for PCT/JP2019/019158.

* cited by examiner

Fig.10 (a)
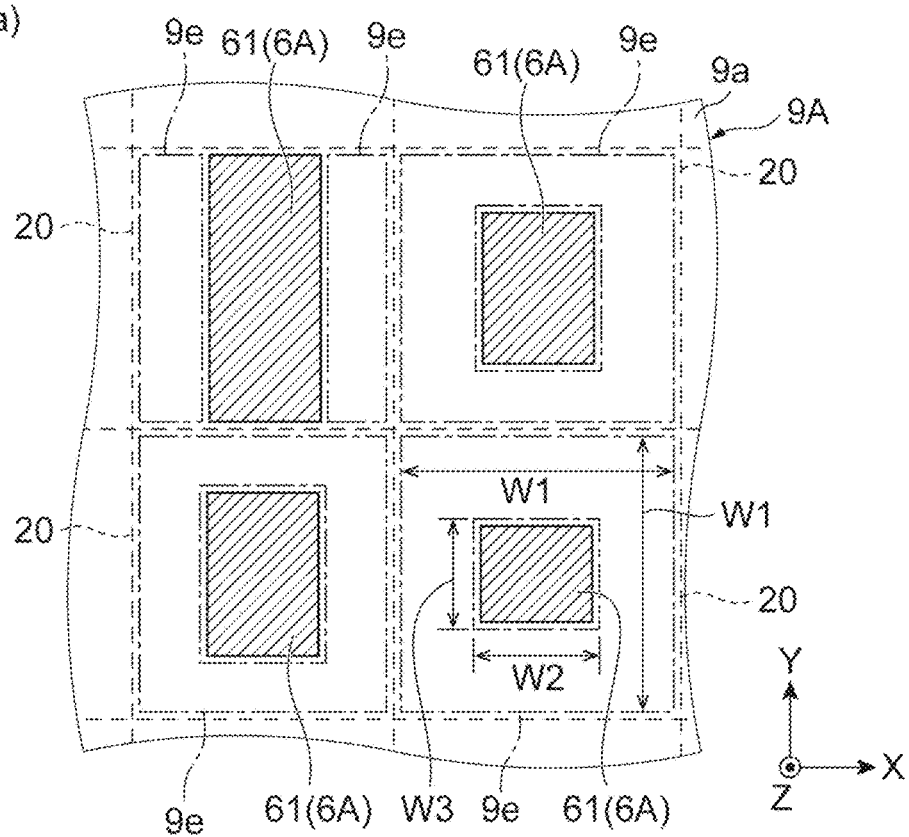
(b)
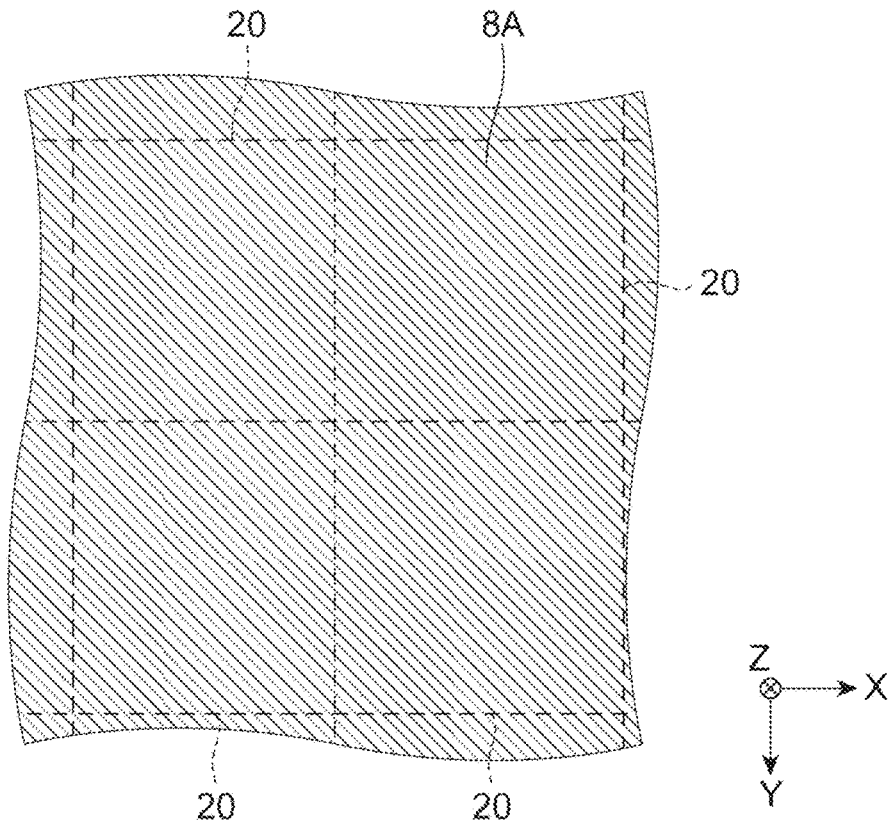

Fig.12
(a)
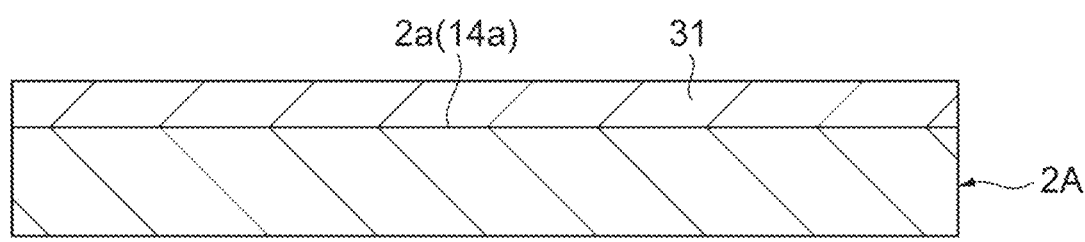
(b)
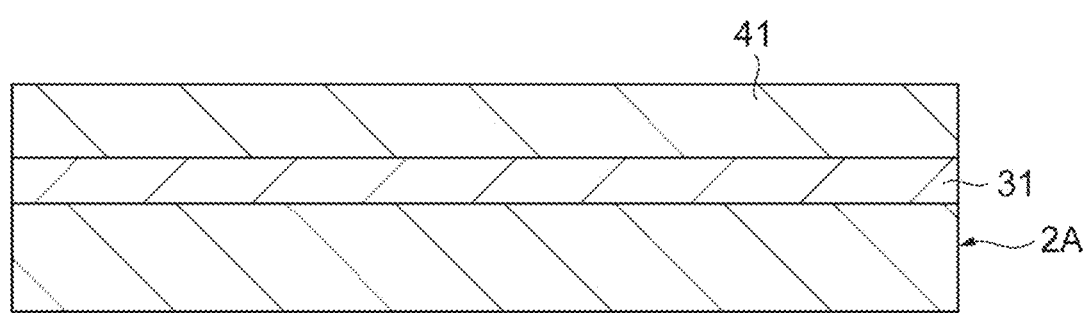
(c)
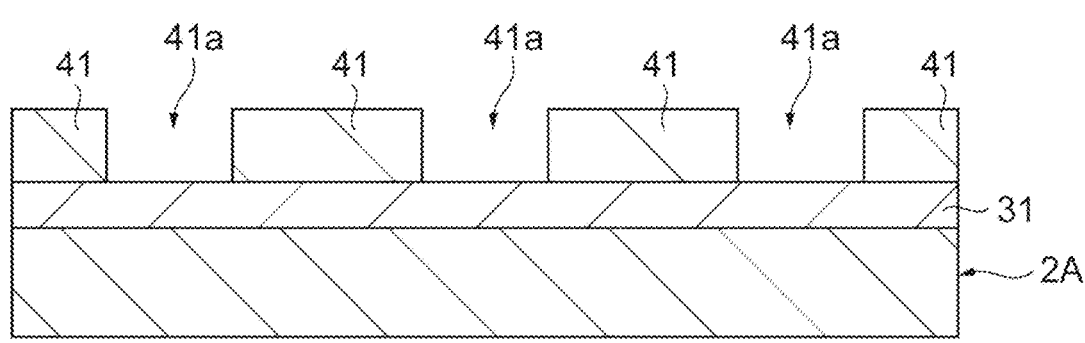
(d)
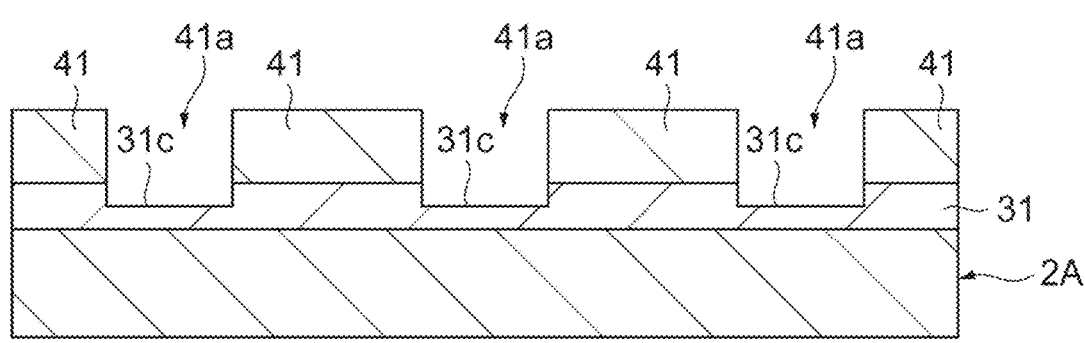

Fig.13
(a)
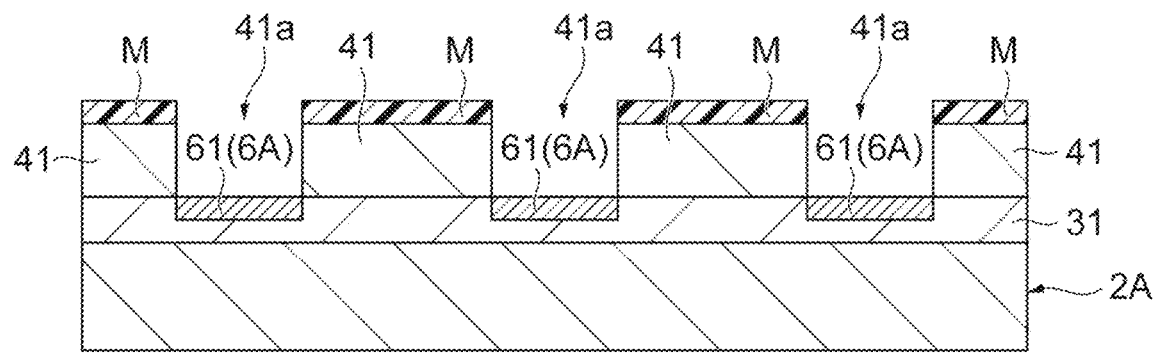
(b)
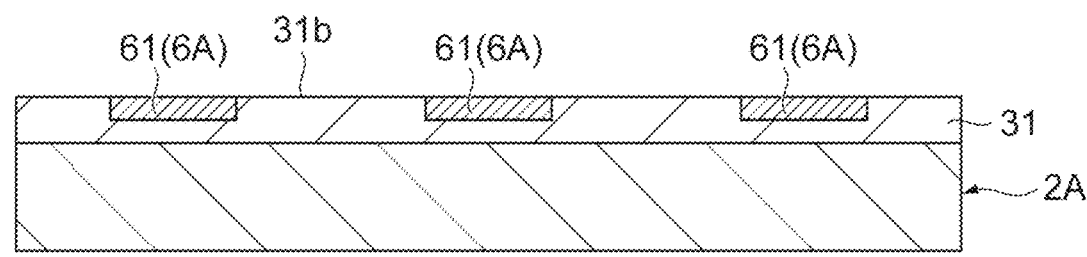
(c)
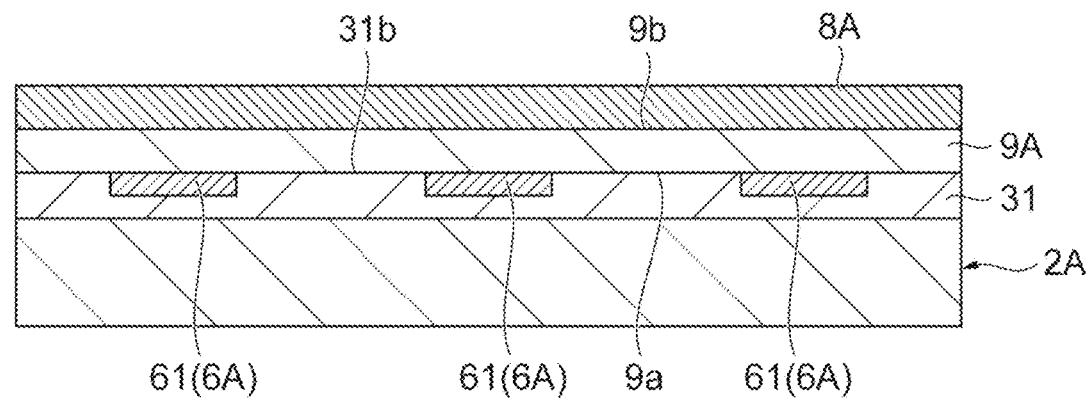

*Fig.16* (a)
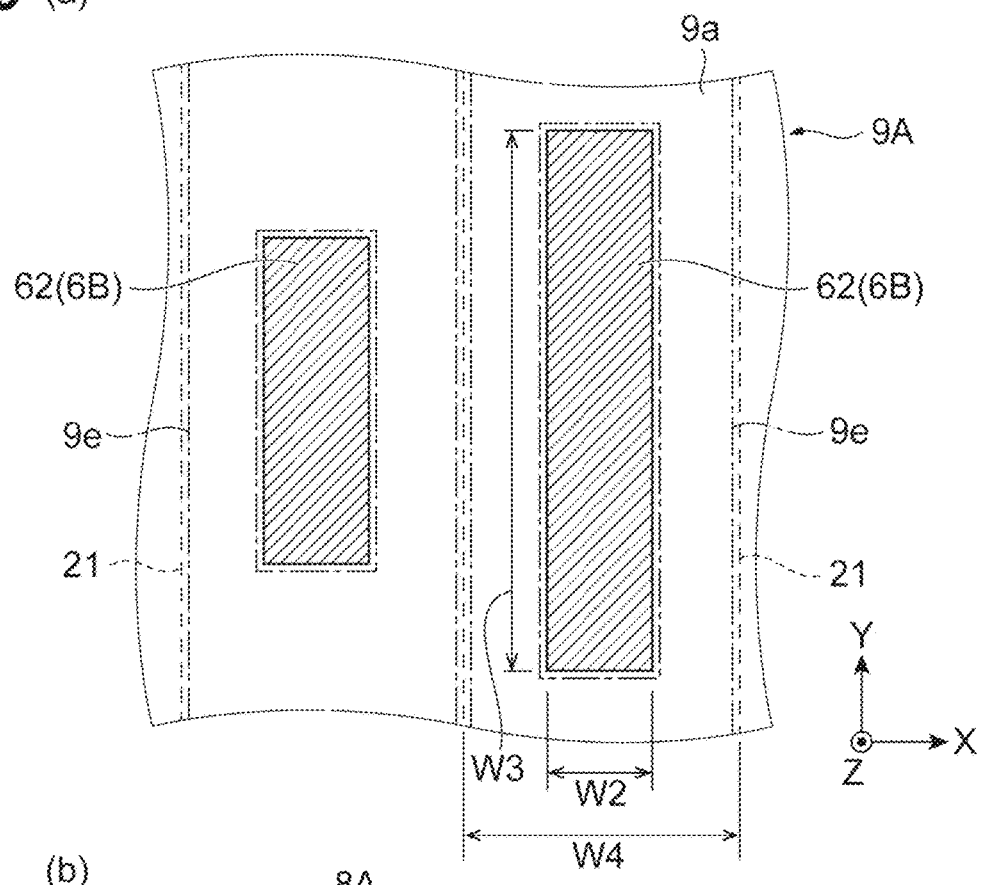
(b)
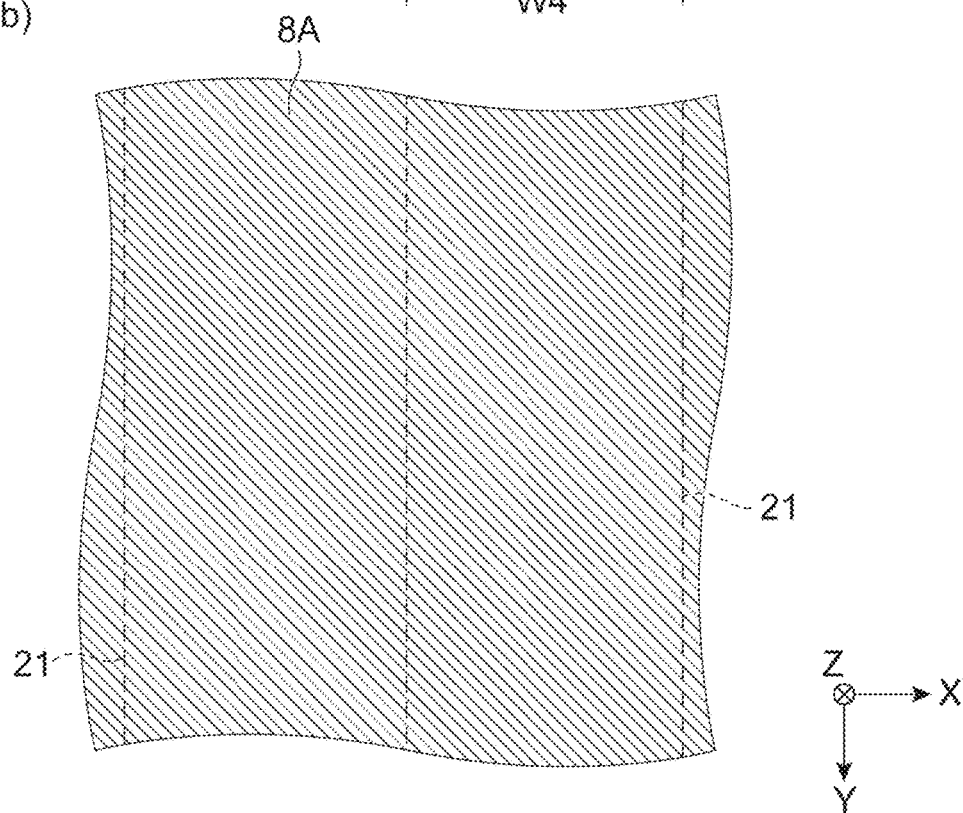

Fig.19 (a)
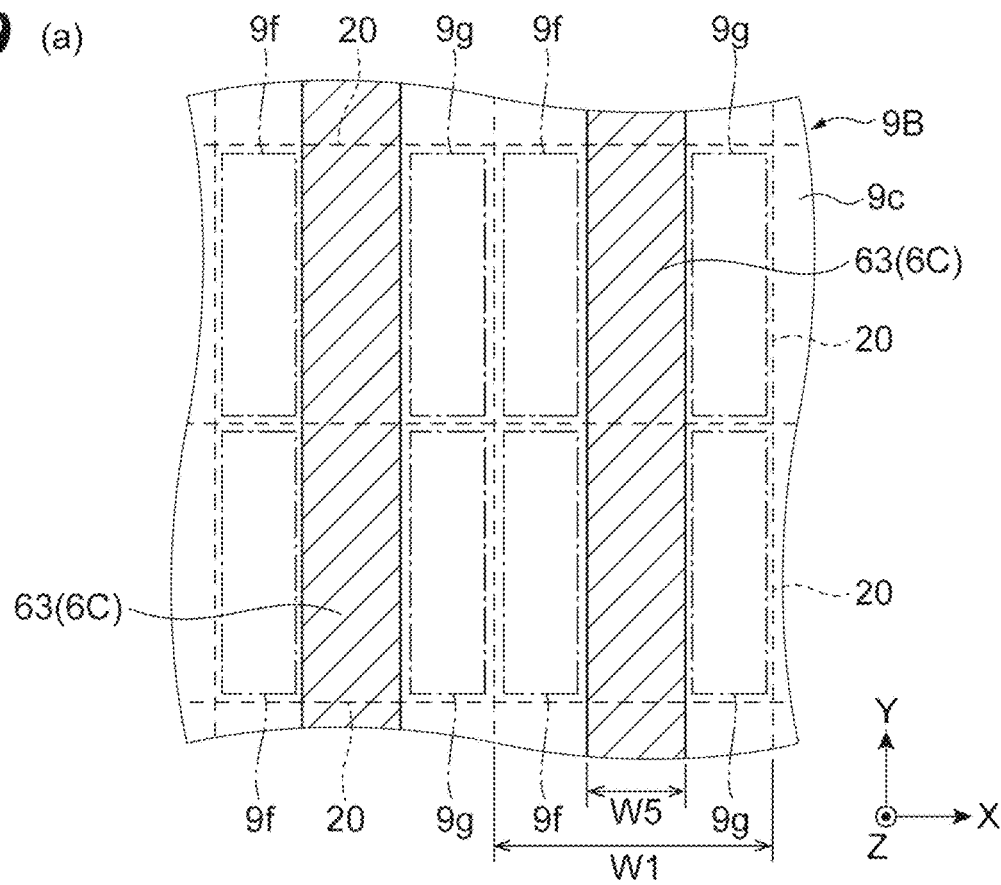
(b)
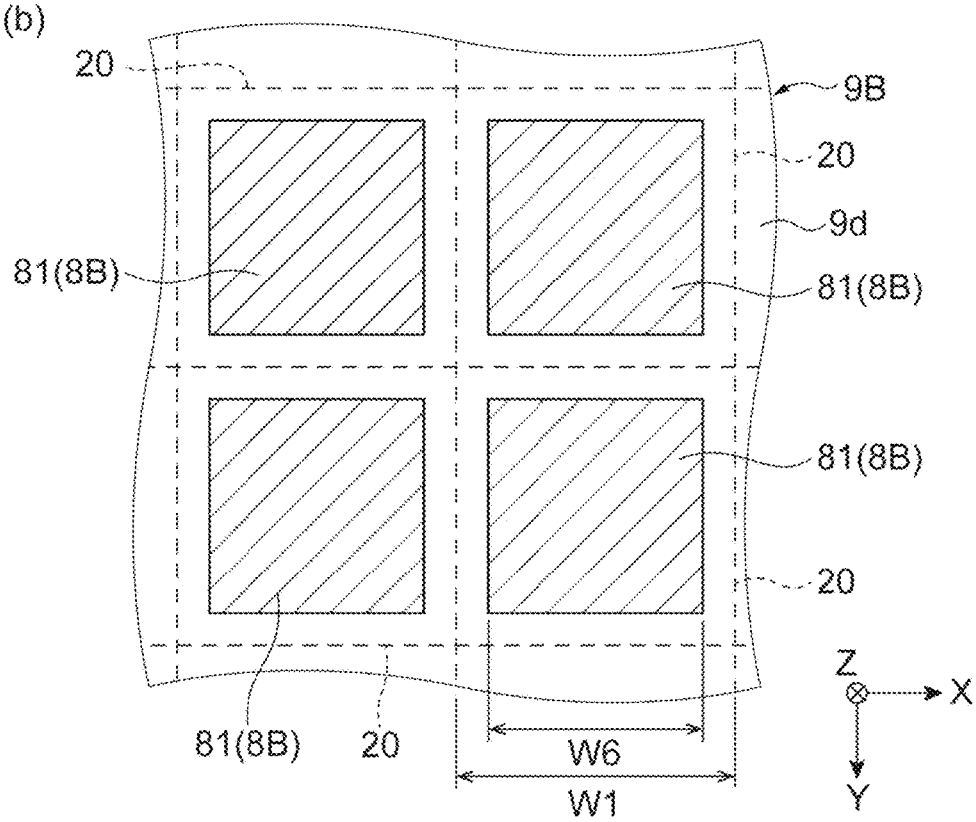

Fig.21
(a)
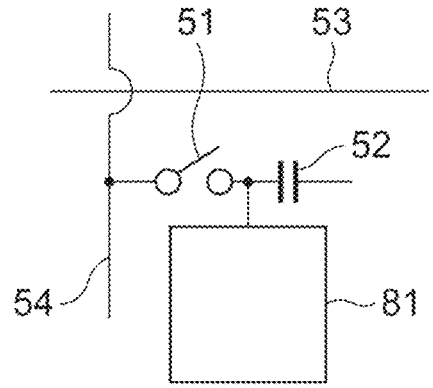
(b)
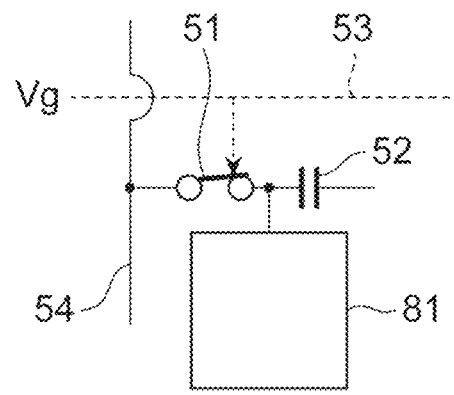
(c)
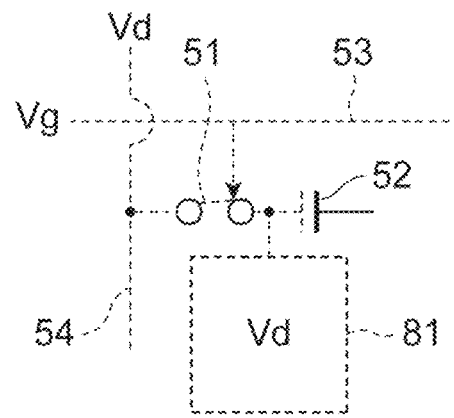
(d)
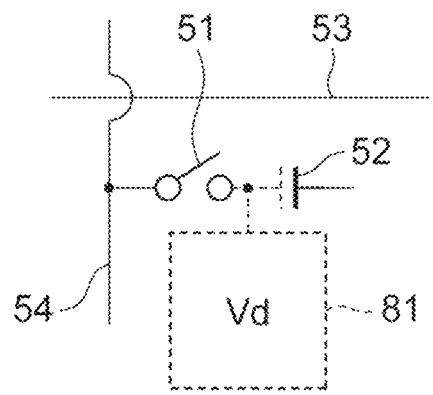

Fig.24
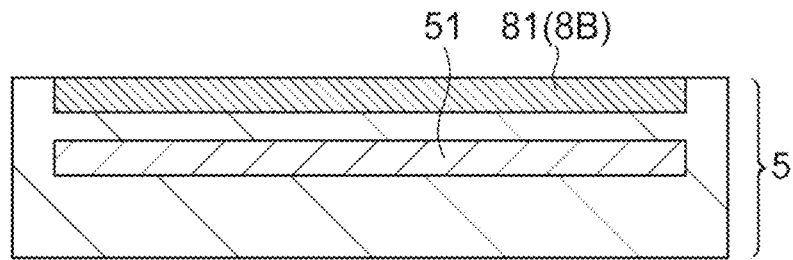
(a)
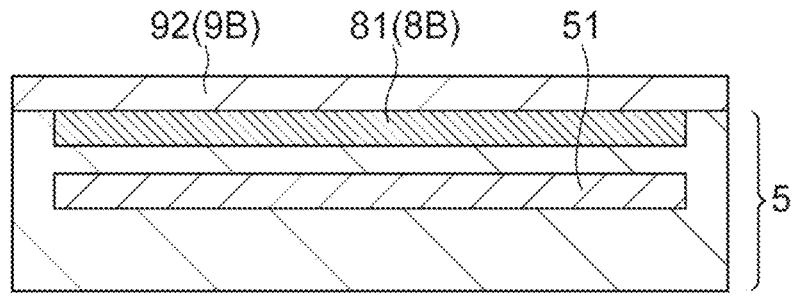
(b)
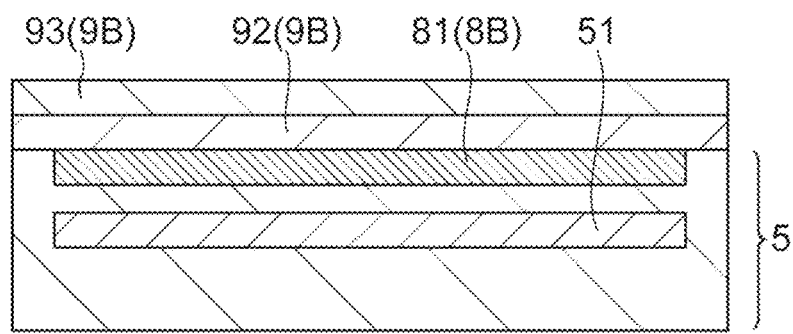
(c)
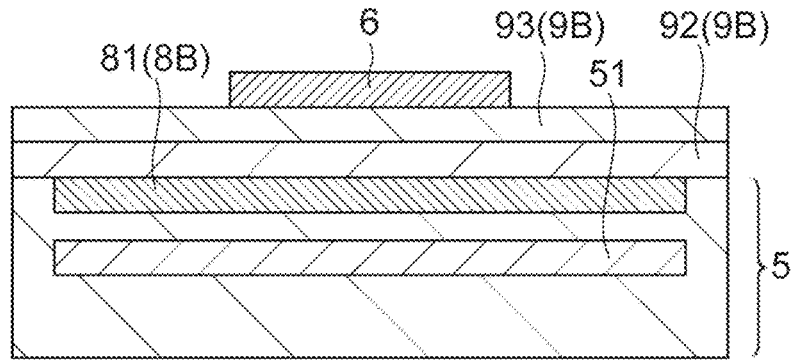
(d)
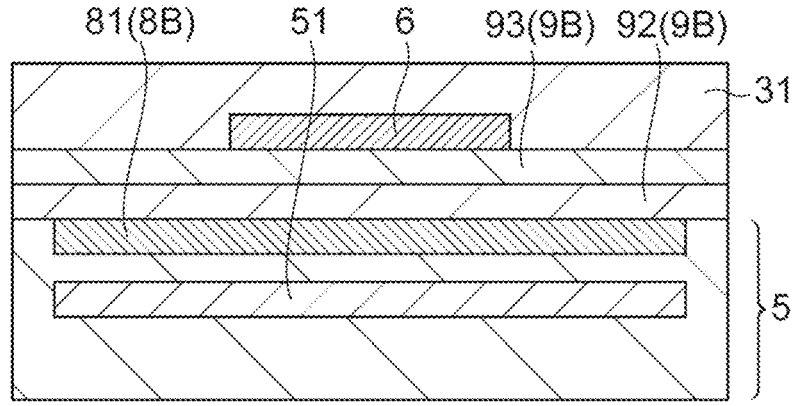
(e)

Fig.26 (a)
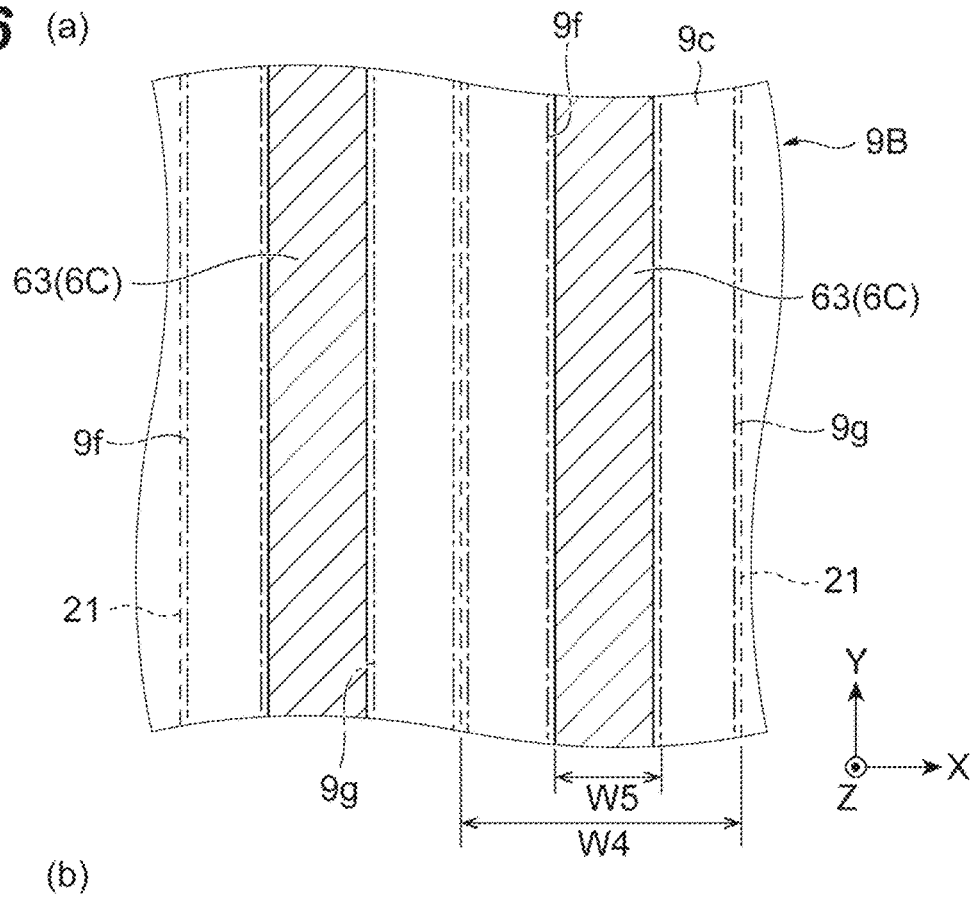
(b)
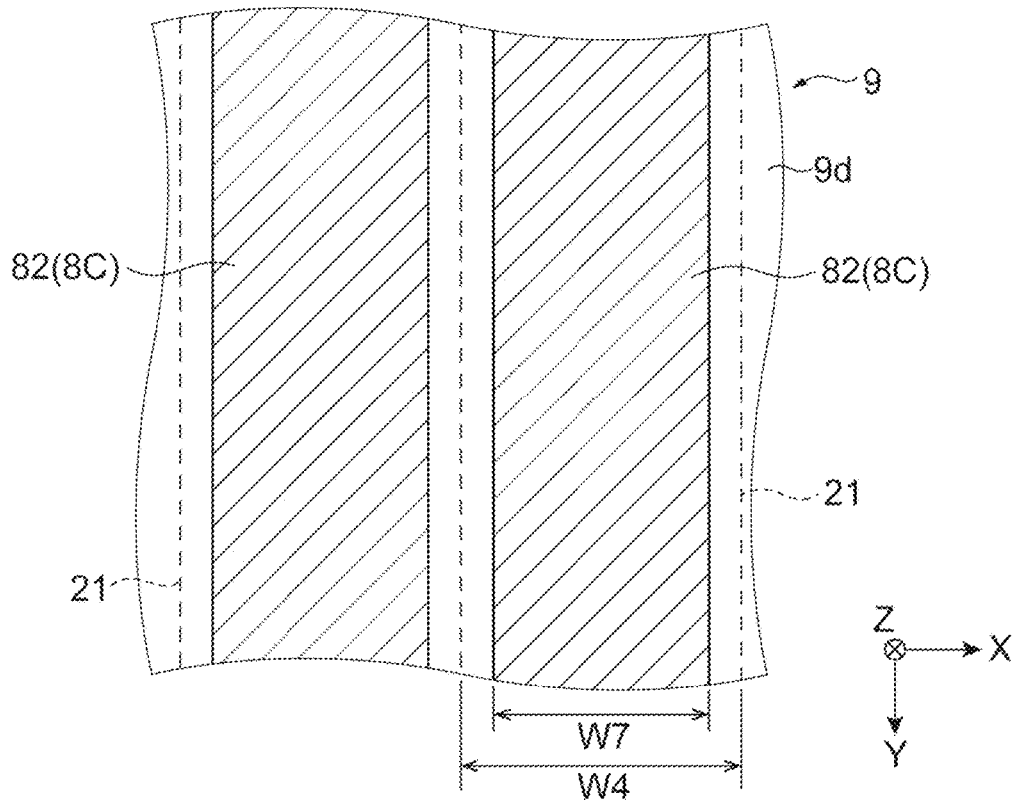

*Fig.33A*

| A2 | A1 |
|---|---|
| A3 | A4 |

ORIGINAL IMAGE

*Fig.33B*

| A4 | A3 |
|---|---|
| A2 ROTATION | A1 ROTATION |
| A1 | A2 |
| A3 ROTATION | A4 ROTATION |

RESULTING BEAM PATTERN

Fig.42
(a)
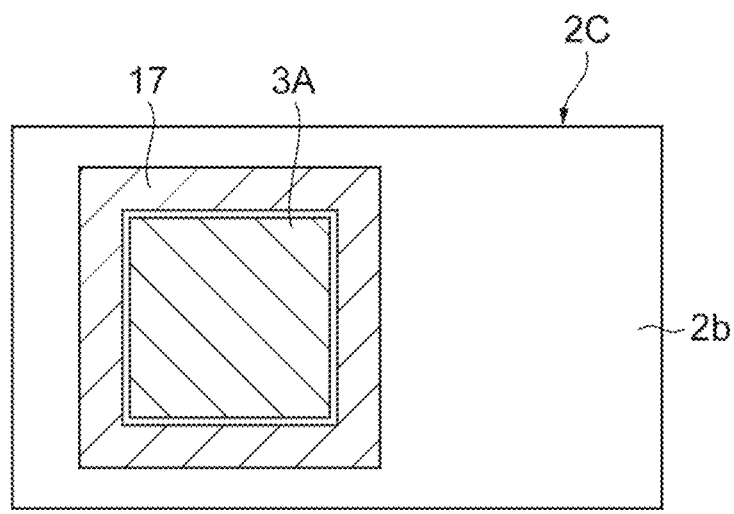
(b)
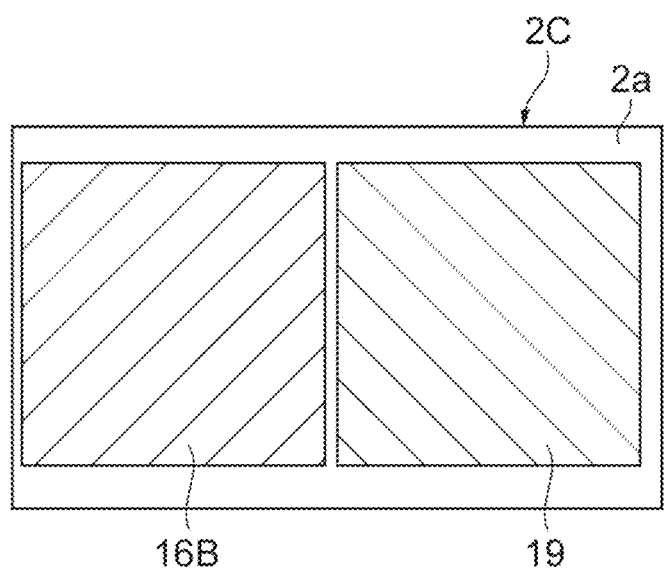

LIGHT-EMITTING DEVICE

TECHNICAL FIELD

The present invention relates to a light-emitting device.

BACKGROUND ART

Non Patent Literature 1 discloses a technology related to a reflective metasurface. This metasurface includes a mirror layer made of gold (Au), an ITO layer provided on the mirror layer, an $Al_2O_3$ layer provided on the ITO layer, and a nano antenna made of gold (Au) provided on the $Al_2O_3$ layer. Then, it is described that by setting a bias between the mirror layer and the nano antenna, the phase of input light can be modulated according to the setting pattern (optical phase) of the bias.

CITATION LIST

Non Patent Literature

Non Patent Literature 1: Yao-Wei, Huang et al., "Gate-tunable conducting oxide metasurfaces", Nano Letters, Vol. 16, pp. 5319-5325 (2016)
Non Patent Literature 2: Y. Kurosaka et al.," Effects of non-lasing band in two-dimensional photonic-crystal lasers clarified using omnidirectional band structure," Opt. Express 20, 21773-21783 (2012)

SUMMARY OF INVENTION

Technical Problem

The inventors have found the following problems as a result of examining the above-described conventional technology. That is, in recent years, metasurfaces have attracted attention as a structure capable of arbitrarily controlling the phase, intensity, or polarization of light. Unlike an optical element such as a conventional lens, the metasurface can control the phase of input light and the like by an extremely thin surface structure formed on a flat surface. For example, a metal-insulator-metal (MIM) type metasurface includes a lower metal film as a reflective film, a dielectric layer provided on the lower metal film, and an upper metal film provided on the dielectric layer. The width of the upper metal film and the thickness of the dielectric layer are sufficiently smaller than the wavelength of input light. Then, the surface of the dielectric layer is exposed from both sides of the upper metal film, and light is inputted to the surface of the dielectric layer. The light propagating in the dielectric layer is reflected on the lower metal film and is outputted from the surface of the dielectric layer to the outside. At this time, the phase of the output light changes according to the width of the upper metal film. Such a structure is called a static metasurface.

On the other hand, the metasurface of Non Patent Literature 1 has a structure in which the width of the upper metal film is set to be constant and a transparent conductive layer such as ITO is added to the structure described above, and a bias is set between the lower metal film and the upper metal film. In a state where the bias is set, metallization (state where the electron density becomes concentratively high near the interface between the dielectric layer and the transparent conductive layer) of a part of the transparent conductive layer occurs due to an electric field between the lower metal film and the upper metal film. At this time, the effective refractive index between the lower metal film and the upper metal film changes according to the thickness of the metallized layer (thickness of the part where the electron density becomes concentratively high). At this time, the phase of the input light changes according to the thickness of the metallized layer. The metasurface of Non Patent Literature 1 described above can control the phase of light by arbitrarily changing the applied voltage. Such a structure is called a dynamic metasurface.

However, when the metasurface is reflective, a light-emitting device including a light source and a metasurface requires an optical system for inputting light from the light source to the metasurface and an optical system for guiding light outputted from the metasurface. Therefore, the overall optical system is likely to become complicated, which becomes a factor that prevents miniaturization of the light-emitting device.

The present invention has been made to solve the above problems, and an object of the present invention is to provide a light-emitting device including a light source and a reflective metasurface, and capable of simplifying an optical system.

Solution to Problem

In order to solve the above problem, a light-emitting device according to an embodiment of the present invention includes a surface emitting laser element, a light guide layer, and a reflective metasurface. The surface emitting laser element has a first light output surface and a second light output surface opposing each other. The light guide layer is disposed on the second light output surface. The reflective metasurface is disposed on the second light output surface via the light guide layer. The reflective metasurface includes a light transmissive layer, a first metal film and a second metal film. The light transmissive layer is disposed on the opposite side of the second light output surface with respect to the light guide layer. The light transmissive layer includes a dielectric layer and further includes a first surface and a second surface. The first surface is located between the light guide layer and the dielectric layer. The second surface is located on the opposite side of the first surface with respect to the dielectric layer. The first metal film is disposed on the first surface. The second metal film is disposed on the second surface. The second metal film reflects, towards the light guide layer, the laser light inputted from the surface emitting laser element through the light guide layer to the light transmissive layer. Furthermore, in each of a plurality of unit regions set on the first surface of the light transmissive layer so as to constitute a one-dimensional array or a two-dimensional array, the light transmissive layer includes an exposed portion facing the light guide layer without being blocked by the first metal film. The width of each of the plurality of unit regions and the thickness of the light transmissive layer are smaller than the wavelength of the laser light. The reflective metasurface is configured to modulate the phase of the laser light for each unit region. The laser light that is modulated by the reflective metasurface passes through the second light output surface and then, is outputted from the first light output surface.

Advantageous Effects of Invention

According to the present embodiment, it is possible to provide a light-emitting device including a light source and a reflective metasurface, and capable of simplifying an optical system.

BRIEF DESCRIPTION OF DRAWINGS

FIG. 10A is a view showing a planar shape of a metal film 6A, and FIG. 10B is a view showing a planar shape of a metal film 8A.

FIGS. 12A to 12D are cross-sectional views showing each step in one example of a fabrication method of the metasurface 3A.

FIGS. 13A to 13C are cross-sectional views showing each step in one example of the fabrication method of the metasurface 3A.

FIG. 16A is a view showing a planar shape of a metal film 6B, and FIG. 16B is a view showing a planar shape of the metal film 8A.

FIG. 19A is a view showing a planar shape of a metal film 6C, and FIG. 19B is a view showing a planar shape of a metal film 8B.

FIGS. 21A to 21D are views for explaining an operation of a drive circuit 5 in the unit region 20 of an m-th row and an n-th column.

FIGS. 24A to 24E are cross-sectional views showing each step in one example of the fabrication method of the metasurface 3C.

FIG. 26A is a view showing a planar shape of the metal film 6C of a second modified example, and FIG. 26B is a view showing a planar shape of a metal film 8C of the second modified example.

FIGS. 33A and 33B are views for explaining points to be noted when obtaining a phase angle distribution from a Fourier transform result of an optical image and determining an arrangement of a modified refractive index region.

FIG. 42A is a plan view showing a second light output surface 2b, and FIG. 42B is a plan view showing a first light output surface 2a.

DESCRIPTION OF EMBODIMENTS

Figure 1:
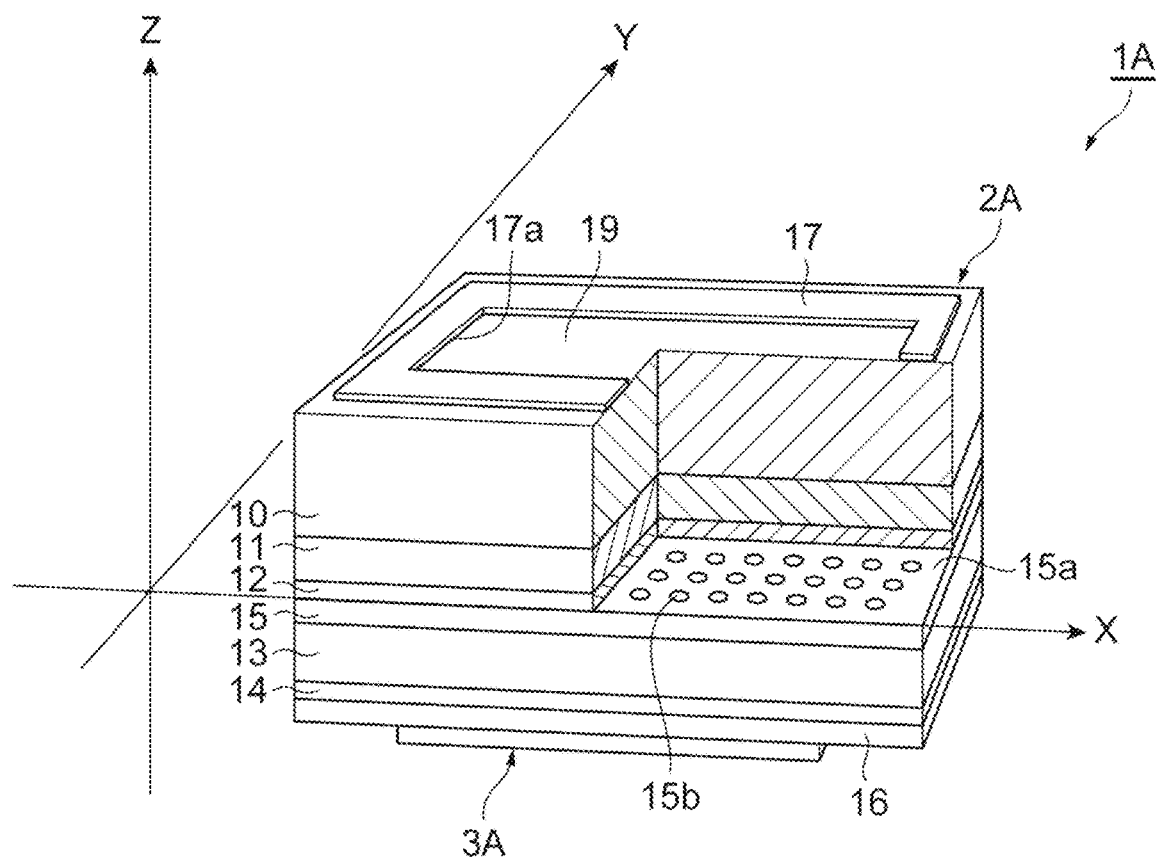
FIG. 1 is a perspective view showing a configuration of a light-emitting device 1A according to a first embodiment of the present invention.

Description of Embodiments of Invention of This Application

First, contents of the embodiments of the invention of this application will be individually listed and described.

(1) The light-emitting device according to the present embodiment includes, as one aspect thereof, a surface emitting laser element, a light guide layer, and a reflective metasurface. The surface emitting laser element includes a first light output surface and a second light output surface opposing each other. The light guide layer is disposed on the second light output surface. The reflective metasurface is disposed on the second light output surface via the light guide layer. The reflective metasurface includes a light transmissive layer, a first metal film, and a second metal film. The light transmissive layer is disposed on the opposite side of the second light output surface with respect to the light guide layer. The light transmissive layer includes a dielectric layer and further includes a first surface and a second surface. The first surface is located between the light guide layer and the dielectric layer. The second surface is located on the opposite side of the first surface with respect to the dielectric layer. The first metal film is disposed on the first surface. The second metal film is disposed on the second surface. The second metal film reflects, towards the light guide layer, the laser light inputted from the surface emitting laser element through the light guide layer to the light transmissive layer. Furthermore, in each of a plurality of unit regions set on the first surface of the light transmissive layer so as to constitute a one-dimensional array or a two-dimensional array, the light transmissive layer includes an exposed portion facing the light guide layer without being blocked by the first metal film. The width of each of the plurality of unit regions and the thickness of the light transmissive layer are smaller than the wavelength of the laser light. The reflective metasurface is configured to modulate the phase of the laser light for each unit region. The laser light that is modulated by the reflective metasurface passes through the second light output surface and then, is outputted from the first light output surface. It is to be noted that in the present description, the "width of each of the plurality of unit regions" is given by the length of the shortest side that defines the shape of each unit region. The "thickness" of each layer is given by the length along the normal direction of the first light output surface or the second light output surface.

In the light-emitting device having the structure described above, the laser light generated in the surface emitting laser element is outputted from both the first light output surface and the second light output surface, and the laser light outputted from the second light output surface is inputted to the reflective metasurface. The input laser light propagates from the first surface of the light transmissive layer through the light transmissive layer, and then is reflected on the second metal film. The laser light reflected on the second metal film is outputted again from the first surface of the light transmissive layer to the outside of the light transmissive layer. When the width of the first metal film and the thickness of the light transmissive layer are sufficiently smaller than the wavelength of light, strong magnetic resonance (plasmon resonance) due to surface plasmon coupling occurs in the light transmissive layer. Due to this magnetic resonance, the phase of the laser light passing through between the first metal film and the second metal film is modulated. The phase modulation amount depends on the effective refractive index of the light transmissive layer and the width of the first metal film. Therefore, the phase of the laser light can be spatially controlled by independently setting any one of the first metal film and the second metal film for each unit region. The phase-modulated laser light is inputted again into the surface emitting laser element from the second light output surface and outputted from the first light output surface. According to the light-emitting device, since an optical system between the light source (surface emitting laser element) and the reflective metasurface becomes unnecessary, the optical system can be simplified.

(2) As one aspect of the present embodiment, parts of the first metal film in two or more unit regions of the plurality of unit regions may have widths along a first direction defined on the first surface that are different from each other. The phase modulation amount with respect to the laser light depends on the width of the first metal film.

In this case, it is possible to preferably realize a light-emitting device including a static metasurface capable of phase modulation with respect to laser light in each of a plurality of unit regions constituting a one-dimensional array or a two-dimensional array.

(3) As one aspect of the present embodiment, the light transmissive layer may further include a transparent conductive layer disposed between the dielectric layer and the light guide layer or between the dielectric layer and the second metal film. In this case, at least one of the first metal film and the second metal film preferably includes a plurality of partial metal films disposed in each of the plurality of unit regions in a state of being separated from one another.

When a drive voltage is applied between the first metal film and the second metal film, the electron density near the interface between the transparent conductive layer and the dielectric layer increases. As a result, the portion of the transparent conductive layer near the interface is metallized, and the effective refractive index of a laminated structure changes. It is to be noted that in this description, "metallization" means a state in which the electron density becomes higher than that of the peripheral region. As described above, the phase modulation amount depends on the effective refractive index of the light transmissive layer. Since the effective refractive index can be controlled by changing the drive voltage, the phase of the laser light to be output can be controlled. In addition, at least any one of the first metal film and the second metal film preferably includes the plurality of partial metal films disposed in each of the plurality of unit regions in a state of being separated from one another. Therefore, by individually controlling the voltages of the plurality of partial metal films, independent phase modulation can be performed for each unit region.

Therefore, it is possible to preferably realize a light-emitting device including a dynamic metasurface capable of phase modulation of laser light in each of a plurality of unit regions constituting a one-dimensional array or a two-dimensional array.

(4) As one aspect of the present embodiment, the light-emitting device may further include a drive circuit configured to control a voltage applied between the first metal film and the second metal film.

In this case, the drive circuit is configured to individually control the voltages of the plurality of partial metal films of at least any of the first metal film and the second metal film. As one aspect of the present embodiment, the drive circuit is configured to set the first metal film to the reference potential, and the first metal film extends over two or more unit regions of the plurality of unit regions. With this configuration, the reference potential can be easily disposed to the first metal film sandwiched between the light guide layer and the light transmissive layer.

(5) As one aspect of the present embodiment, the transparent conductive layer preferably contains at least one of indium oxide and zinc oxide whose resistance is reduced by a dopant. In this case, it is possible to preferably achieve the operation of the transparent conductive layer described above.

(6) As one aspect of the present embodiment, the surface emitting laser element preferably includes a substrate, an active layer, and a photonic crystal layer, and the substrate includes a main surface and a back surface opposing the main surface. The active layer and the photonic crystal layer are disposed on the main surface of the substrate.

The photonic crystal layer includes a base layer and a plurality of modified refractive index regions having a refractive index different from the refractive index of the base layer. The plurality of modified refractive index regions are arrayed on a reference plane perpendicular to the thickness direction of the photonic crystal layer. In such configuration, the surface emitting laser element can operate as a photonic crystal surface emitting laser (PCSEL). The PCSEL can control the optical mode distribution in the direction parallel with the main surface by the photonic crystal layer. For example, in comparison with a vertical cavity surface emitting laser (VCSEL), which is another type of surface emitting laser element, it is possible in principle for the PCSEL to increase the light-emitting area while maintaining a single mode. That is, it is possible in principle to increase the light-emitting area while keeping the wavefront in a good state. Therefore, a more complicated phase modulation pattern can be realized by increasing the number of unit regions in the reflective metasurface.

(7) As one aspect of the present embodiment, the surface emitting laser element is an element that outputs light that forms an optical image along a normal direction of the main surface of the substrate, a tilt direction intersecting with the normal direction, or both the normal direction and the tilt direction, and the surface emitting laser element preferably has the substrate, the active layer, and a phase modulation layer. The substrate has a main surface and a back surface opposing the main surface. The active layer and the phase modulation layer are disposed on the main surface of the substrate. The phase modulation layer includes a base layer and a plurality of modified refractive index regions having a refractive index different from the refractive index of the base layer. The plurality of modified refractive index regions constitute a two-dimensional array on a reference plane perpendicular to the thickness direction of the phase modulation layer.

In an imaginary square lattice in which a lattice point is associated with each of the plurality of modified refractive index regions set on the reference plane, the center of gravity of each of the plurality of modified refractive index regions is arranged at a position apart from the corresponding lattice point of the imaginary square lattice, the position forming a rotation angle for forming at least a part of the optical image around the corresponding lattice point with reference to a line segment connecting between adjacent lattice points. As one aspect of the present embodiment, in an imaginary square lattice in which a lattice point is associated with each of the plurality of modified refractive index regions set on the reference plane, the center of gravity of each of the plurality of modified refractive index regions may be arranged on a straight line passing through lattice points of the imaginary square lattice and tilted with respect to the square lattice. In this case, the distance, on the straight line, between the center of gravity of each of the plurality of modified refractive index regions and the corresponding lattice point may be set so that at least a part of the optical image is formed.

(8) As one aspect of the present embodiment, the planar shape defined on the reference plane of each of the plurality of modified refractive index regions does not have a rotational symmetry of 180°.

That is, the rotational symmetry of 180° is excluded from the symmetry of the planar shape of each of the plurality of modified refractive index regions. In this case, the linear polarization property of the light outputted from the surface emitting laser element is enhanced. As one aspect of the present embodiment, the dielectric layer preferably contains at least any of aluminum oxide, silicon oxide, and magnesium fluoride. In this case, the dielectric layer described above can be preferably realized. As one aspect of the present embodiment, a part of the dielectric layer preferably constitutes the first surface. As one aspect of the present embodiment, the light guide layer preferably contains at least any of aluminum oxide, silicon oxide, magnesium fluoride, and calcium fluoride. In this case, the operation of the light guide layer described above can be preferably realized.

(9) As one aspect of the present embodiment, the surface emitting laser element may further have a first electrode disposed on the first light output surface. In this aspect, the first electrode preferably has a shape surrounding a laser light output region on the first light output surface. As one aspect of the present embodiment, the surface emitting laser element may further have a first electrode disposed side by side with the laser light output region on the first light output surface.

In any aspect, the laser light phase-modulated by the reflective metasurface can be outputted from the first light output surface while avoiding the first electrode disposed on the first light output surface.

(10) As one aspect of the present embodiment, the surface emitting laser element may further have a second electrode disposed on the second light output surface. In this aspect, the second electrode preferably has a shape surrounding the reflective metasurface. That is, according to this aspect, while the reflective metasurface is disposed on the second light output surface together with the second electrode, the current from the second electrode can be sufficiently diffused near the center portion of the active layer of the surface emitting laser element.

(11) As one aspect of the present embodiment, the light-emitting device preferably further includes a ¼ wavelength plate and a polarizing plate. The ¼ wavelength plate is disposed between the second light output surface and the reflective metasurface. The polarizing plate is disposed on the first light output surface. In this case, it becomes possible to block light directly reaching the first light output surface from the surface emitting laser element, and to extract only light reaching the first light output surface via the second light output surface and the reflective metasurface.

Thus, each aspect listed in this [Description of Embodiments of Invention of This Application] column is applicable to each of all remaining aspects or to all combinations of these remaining aspects.

Details of Embodiments of Invention of This Application

Hereinafter, a specific structure of the light-emitting device according to the present embodiment will be described in detail with reference to the accompanying drawings. It is to be noted that the present invention is not limited to these examples, but is shown by the claims, and is intended to include all modified examples within the meaning and scope equivalent of the claims. In the description of the drawings, identical elements are given identical reference numerals and redundant description is omitted. In the following description, the planar shape refers to a shape viewed from the thickness direction of the light-emitting device.

First Embodiment

Figure 2:
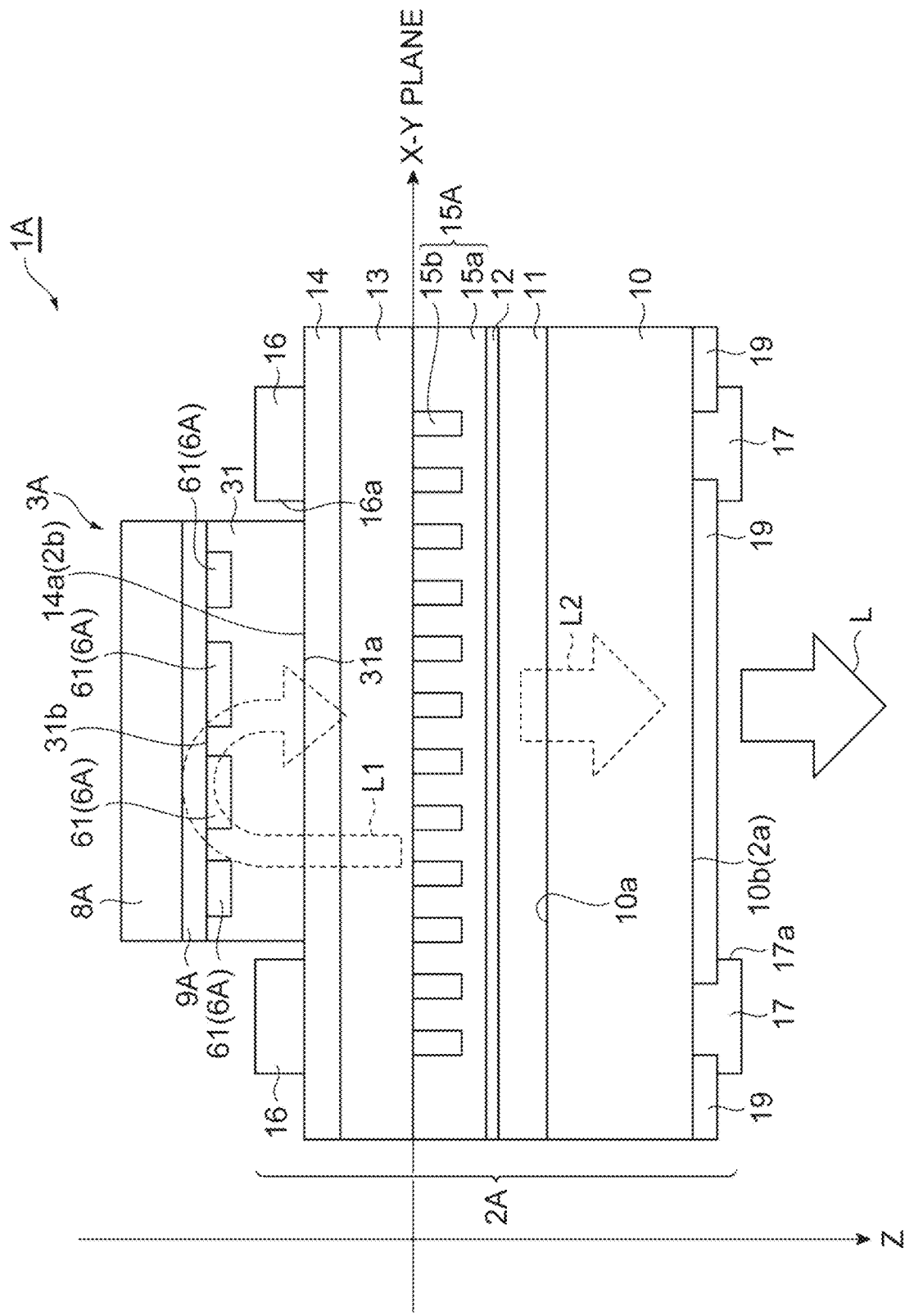
FIG. 2 is a view schematically showing a cross-sectional structure of the light-emitting device 1A.

FIG. 1 is a perspective view showing the configuration of a light-emitting device 1A according to the first embodiment of the present invention. FIG. 2 is a view schematically showing a cross-sectional structure of the light-emitting device 1A. It is to be noted that an XYZ orthogonal coordinate system in which an axis extending along the thickness direction of the light-emitting device 1A is a Z-axis is defined. The light-emitting device 1A includes a surface emitting laser element 2A and a reflective metasurface (hereinafter simply referred to as "metasurface") 3A configured integrally with the surface emitting laser element 2A. The surface emitting laser element 2A forms a standing wave in an X-Y in-plane direction, and outputs laser lights L1 and L2 in a direction (Z-axis direction) perpendicular to a main surface 10a of a semiconductor substrate 10.

As shown in FIGS. 1 and 2, the light-emitting device 1A further includes a light guide layer 31. The light guide layer 31 is located between the surface emitting laser element 2A and the metasurface 3A, and mutually bonds the surface emitting laser element 2A and the metasurface 3A. The light guide layer 31 transmits the laser light L1 reciprocating between the surface emitting laser element 2A and the metasurface 3A. It is to be noted that the light guide layer 31 will be described later in detail.

The surface emitting laser element 2A is a photonic crystal surface emitting laser (PCSEL). The surface emitting laser element 2A includes the semiconductor substrate 10, an active layer 12 as a light-emitting portion provided on the main surface 10a of the semiconductor substrate 10, a pair of cladding layers 11 and 13 sandwiching the active layer 12, a contact layer 14 provided on the cladding layer 13, and a photonic crystal layer 15A. A back surface 10b of the semiconductor substrate 10 is a first light output surface 2a in the present embodiment. A surface 14a of the contact layer 14 corresponds to a second light output surface 2b of the surface emitting laser element 2A, and is located on the opposite side of the first light output surface with respect to the active layer 12.

The semiconductor substrate 10, the cladding layers 11 and 13, the active layer 12, the contact layer 14, and the photonic crystal layer 15A are made of compound semiconductors such as GaAs-based semiconductors, InP-based semiconductors, and nitride-based semiconductors. Each energy band gap of the cladding layer 11 and the cladding layer 13 is larger than the energy band gap of the active layer 12. The thickness directions of the semiconductor substrate 10, the cladding layer 11, the cladding layer 13, the active layer 12, the contact layer 14, and the photonic crystal layer 15A coincide with the Z-axis direction.

If necessary, a light guide layer may be provided at least one of between the active layer 12 and the cladding layer (upper cladding layer) 13 and between the active layer 12 and the cladding layer (lower cladding layer) 11. When the light guide layer is provided between the active layer 12 and the upper cladding layer 13, the photonic crystal layer 15A is provided between the upper cladding layer 13 and the light guide layer. The light guide layer may include a carrier barrier layer for efficiently confining carriers into the active layer 12.

Figure 3:
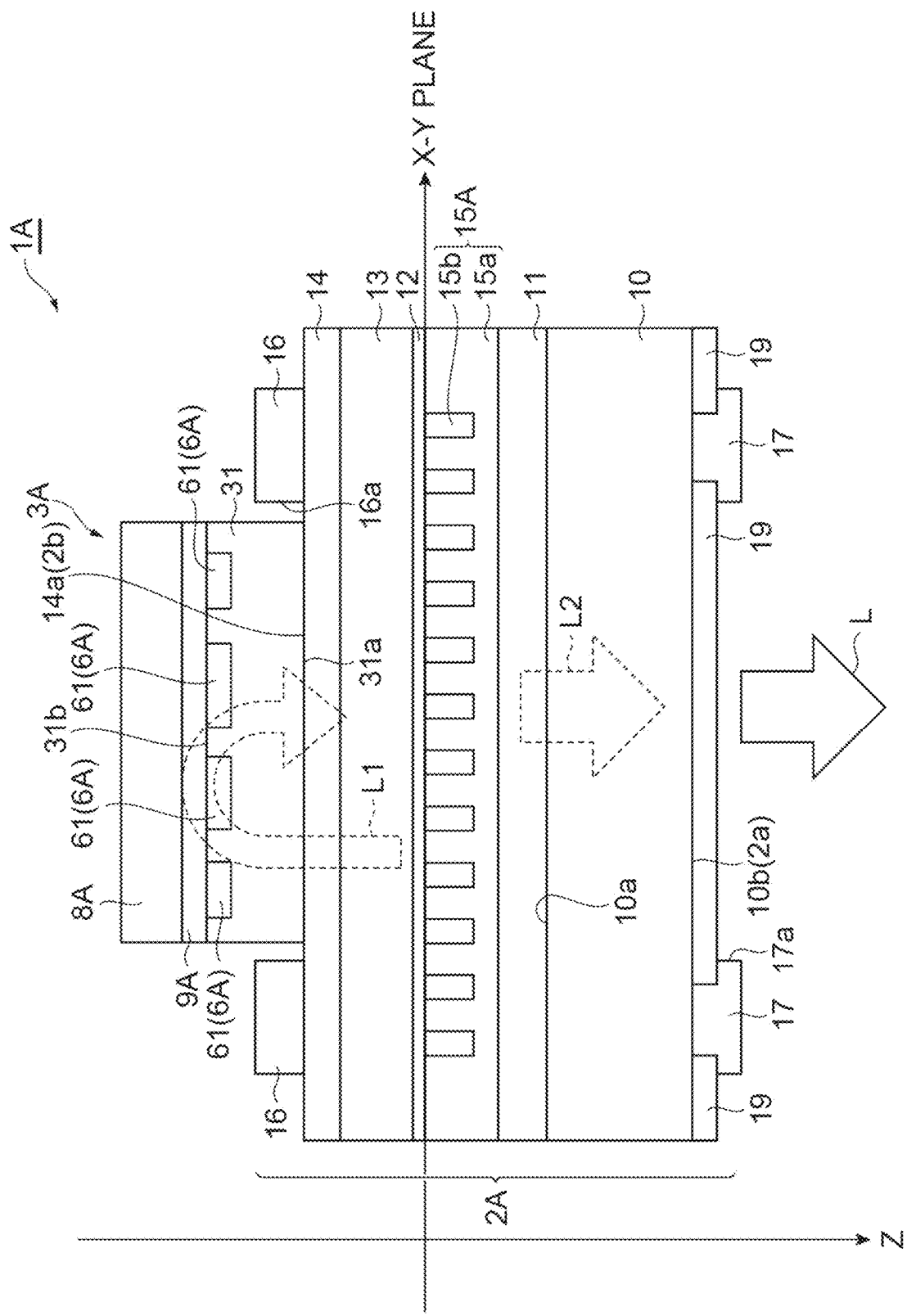
FIG. 3 is a view schematically showing a cross-sectional structure of the light-emitting device 1A.

In the present embodiment, the photonic crystal layer 15A is provided between the active layer 12 and the upper cladding layer 13, but as shown in FIG. 3, the photonic crystal layer 15A may be provided between the lower cladding layer 11 and the active layer 12. Furthermore, when the light guide layer is provided between the active layer 12 and the lower cladding layer 11, the photonic crystal layer 15A is provided between the lower cladding layer 11 and the light guide layer. The light guide layer may include a carrier barrier layer for efficiently confining carriers into the active layer 12.

The photonic crystal layer (diffraction lattice layer) 15A has a base layer 15a made of a first refractive index medium, and a plurality of modified refractive index regions 15b made of a second refractive index medium having a different refractive index from that of the first refractive index medium and existing in the base layer 15a. The plurality of modified refractive index regions 15b are periodically arrayed in a plane (in X-Y plane) perpendicular to the thickness direction of the photonic crystal layer 15A. When the effective refractive index of the photonic crystal layer 15A is n, a wavelength $\lambda_0$ (=a×n, a is the lattice spacing) selected by the photonic crystal layer 15A is included in the emission wavelength range of the active layer 12. The photonic crystal layer 15A can selectively output light having the wavelength $\lambda_0$ of the emission wavelengths of the active layer 12 to the outside. In the present embodiment, the wavelength $\lambda_0$ is within the range of, for example, 0.4 to 1.6 μm, and is 850 nm or 940 nm in one example.

Figure 4:
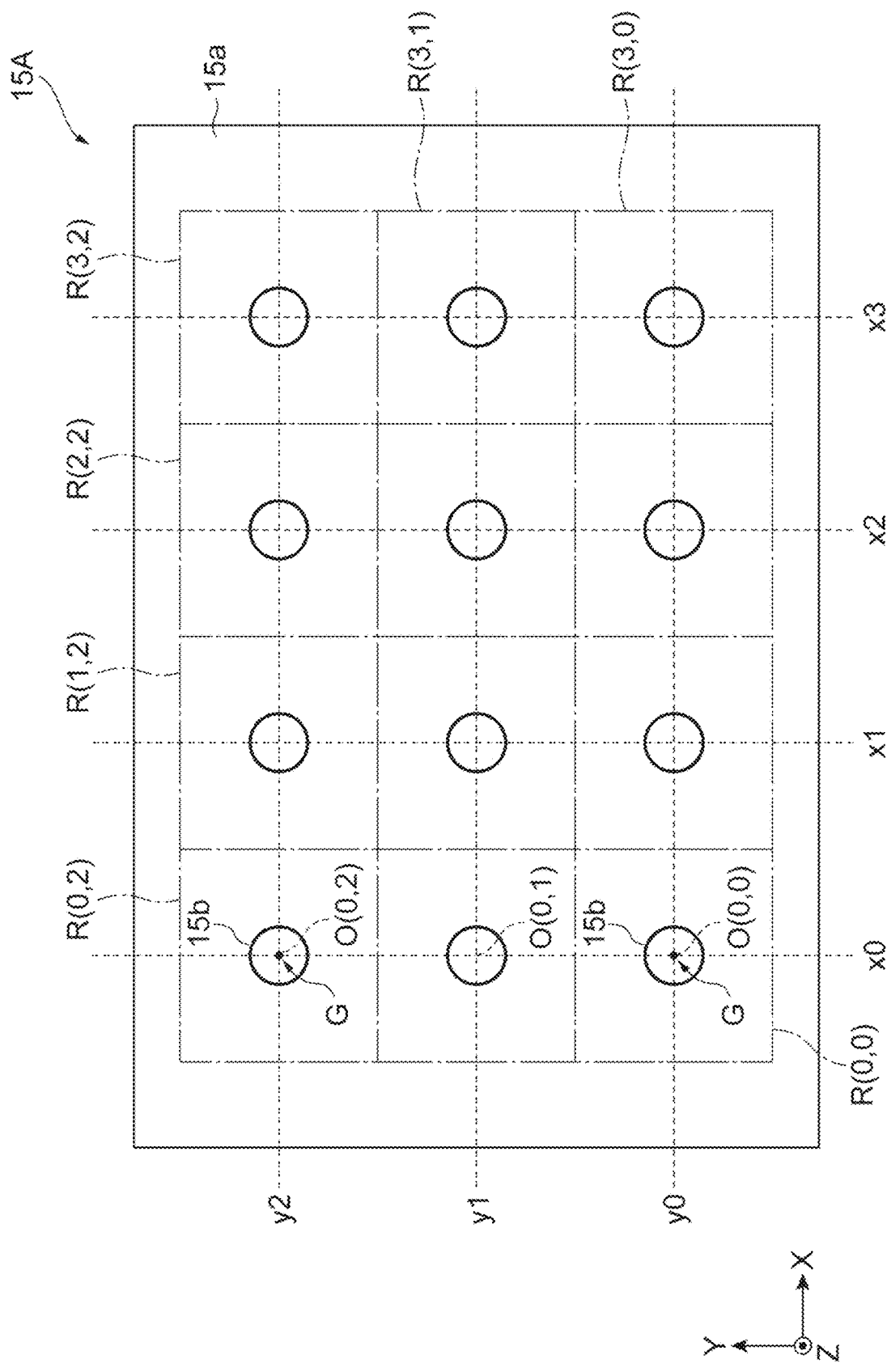
FIG. 4 is a plan view of a photonic crystal layer 15A.

FIG. 4 is a plan view of the photonic crystal layer 15A. As shown in FIG. 4, an imaginary square lattice is set on a design plane (reference plane) of the photonic crystal layer 15A coincident with the X-Y plane. It is assumed that one side of the square lattice is parallel with the X-axis and the other side is parallel with the Y-axis. At this time, a square-shaped unit constituent region R centered on a lattice point O of the square lattice can be two-dimensionally set over a plurality of columns along the X-axis and a plurality of rows along the Y-axis. Each of the plurality of modified refractive index regions 15b is provided in each unit constituent region R on a one-by-one basis. The planar shape of the modified refractive index region 15b is circular, for example. In each unit constituent region R, a center of gravity G of the modified refractive index region 15b overlaps (coincides with) each lattice point O. It is to be noted that the periodic structure of the plurality of modified refractive index regions 15b is not limited to this, and for example, a triangular lattice may be set in place of the square lattice.

Specifically, in FIG. 4, broken lines indicated by x0 to x3 indicate center positions in the unit constituent region R in the X-axis direction, and broken lines indicated by y0 to y2 indicate center positions in the unit constituent region R in the Y-axis direction. Therefore, the intersections of the broken lines x0 to x3 and the broken lines y0 to y2 indicate the respective centers O (0, 0) to O (3, 2) of the unit constituent regions R (0, 0) to R (3, 2), that is, the lattice points. The lattice constant of this imaginary square lattice is a. It is to be noted that the lattice constant a is adjusted according to the emission wavelength.

Figure 5:
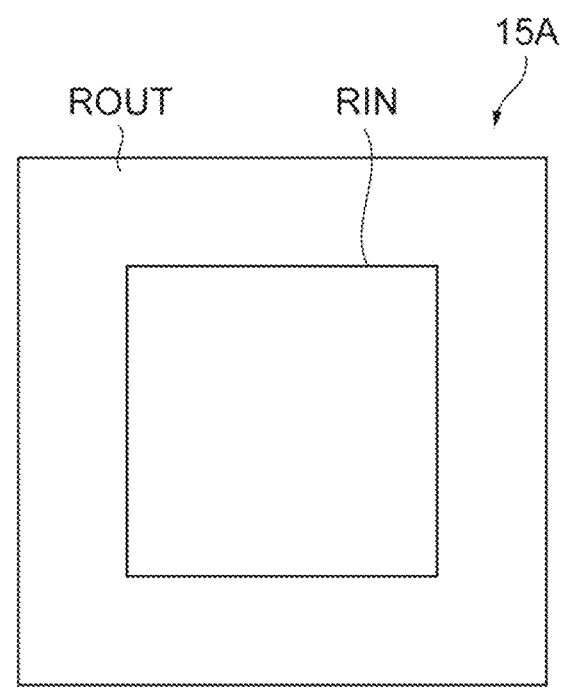
FIG. 5 is a plan view showing an example in which a modified refractive index region 15b is arranged only in a specific region of the photonic crystal layer.

FIG. 5 is a plan view showing an example in which the modified refractive index region 15b is arranged only in a specific region of the photonic crystal layer. In the example of FIG. 5, a periodic structure of the modified refractive index region 15b is formed in the square inner region RIN. On the other hand, the modified refractive index region 15b is not formed in an outer region ROUT surrounding the inner region RIN. In the case of this structure, light leakage in the in-plane direction can be suppressed, and a reduction in threshold current can be expected.

Figure 6:
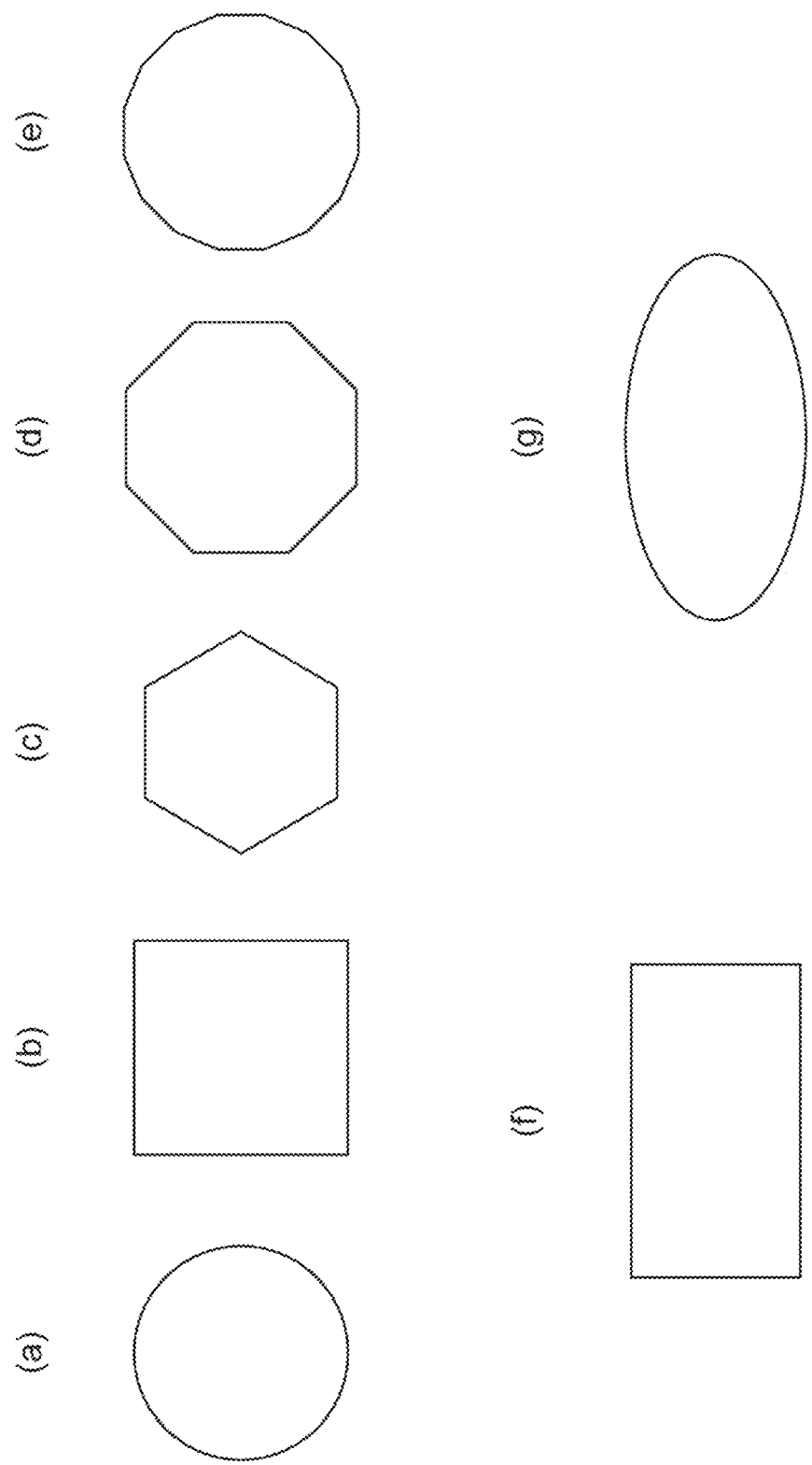
FIGS. 6A to 6G show examples of mirror image symmetrical shapes out of the shapes of the modified refractive index regions in an X-Y plane.
Figure 7:
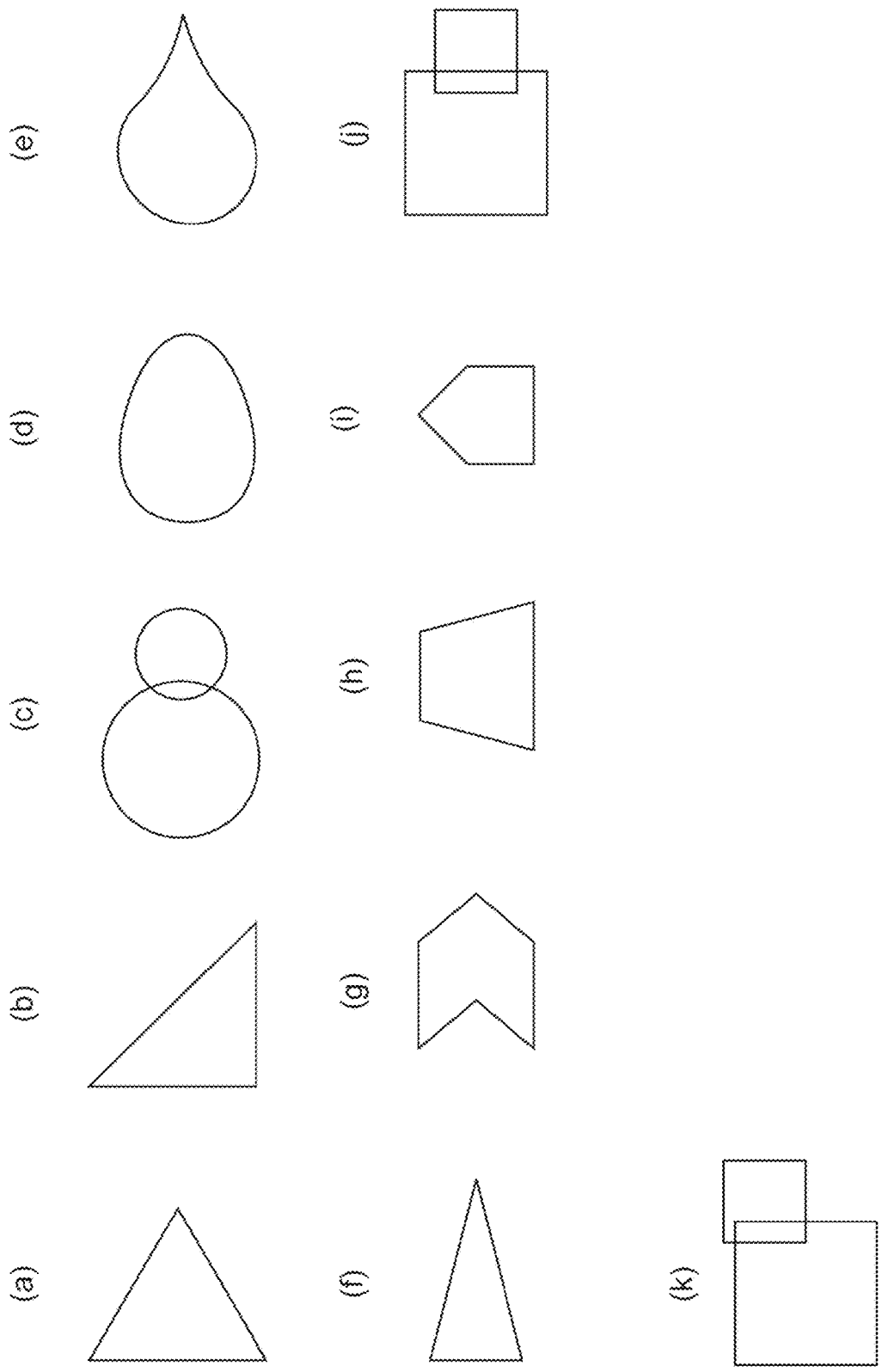
FIGS. 7A to 7K show examples of shapes not having a rotational symmetry of 180° out of the shapes of the modified refractive index regions in the X-Y plane.

Although FIG. 4 shows an example in which the shape of the modified refractive index region 15b defined on the X-Y plane is circular, the modified refractive index region 15b may have a shape other than a circular shape. For example, the shape of the modified refractive index region 15b may have mirror image symmetry (line symmetry). Here, mirror image symmetry (line symmetry) means that, across a certain straight line along the X-Y plane, the planar shape of the modified refractive index region 15b located on one side of the straight line and the planar shape of the modified refractive index region 15b located on the other side of the straight line can be mirror image symmetrical (line symmetrical) with each other. Examples of planar shapes having mirror image symmetry (line symmetry) include a perfect circle shown in FIG. 6A, a square shown in FIG. 6B, a regular hexagon shown in FIG. 6C, a regular octagon shown in FIG. 6D, a regular hexadecagon shown in FIG. 6E, a rectangle shown in FIG. 6F, and an ellipse shown in FIG. 6G The shape of the modified refractive index region 15b defined on the X-Y plane may be a shape having no rotational symmetry of 180°. Examples of such shapes include an equilateral triangle shown in FIG. 7A, an isosceles right triangle shown in FIG. 7B, a shape shown in FIG. 7C in which two circles or ellipses partially overlap, an oval shape shown in FIG. 7D, a teardrop shape shown in FIG. 7E, an isosceles triangle shown in FIG. 7F, an arrow head shape shown in FIG. 7G, a trapezoid shown in FIG. 7H, a pentagon shown in FIG. 7I, a shape shown in FIG. 7J in which two rectangles partially overlap each other, a shape shown in FIG. 7K in which two rectangles partially overlap each other and have no mirror image symmetry. It is to be noted that the oval shape is a shape deformed so that the dimension in the minor axis direction in the vicinity of one end along the major axis of an ellipse is smaller than the dimension in the minor axis direction in the vicinity of the other end. The teardrop shape is a shape in which one end along the major axis of an ellipse is deformed into a pointed end projecting along the major axis direction. The arrow head shape is a shape in which one side of a rectangle is recessed in a triangular shape and the opposite side is pointed in a triangular shape.

In the case of a photonic crystal laser, a standing wave state is formed in the in-plane direction (direction along the X-Y plane), and a part of light is diffracted in the plane perpendicular direction (direction perpendicular to the X-Y plane). At the time of diffraction in the plane perpendicular direction, interference reflecting the symmetry of the electromagnetic field distribution in the in-plane direction occurs. For example, when the planar shape of the modified refractive index region 15b is a perfect circle, since the electromagnetic field distribution in the in-plane direction is antisymmetric (equal in size and opposite in direction) with respect to the planar shape of the modified refractive index region 15b, vanishing interference occurs in the plane perpendicular direction. On the other hand, when the planar shape of the modified refractive index region 15b does not have the rotational symmetry of 180° as shown in FIGS. 7A to 7K, the in-plane electric field distribution becomes asymmetric. Therefore, since the planar shape of the modified refractive index region 15b does not have the rotational symmetry of 180°, it is possible to selectively strengthen the polarization in one certain direction. That is, the linear polarization property of the light outputted from the surface emitting laser element 2A is enhanced.

It is to be noted that a plurality of modified refractive index regions 15b may be provided for each unit constituent region R. In that case, the plurality of modified refractive index regions 15b included in one unit constituent region R may have figures of the same shape, and their centers of gravity may be separated from each other. The shape defined on the X-Y plane of the modified refractive index regions 15b may be identical between the unit constituent regions R, and may be able to be overlapped on each other between the unit constituent regions R by a translation operation or a translation operation and a rotation operation. In that case, fluctuation of the photonic band structure is reduced, and a spectrum having a narrow line width can be obtained. Alternatively, the shapes of the modified refractive index regions in the X-Y plane may not necessarily be identical between the unit constituent regions R (shapes may be different between adjacent unit constituent regions R).

In the structure described above, the modified refractive index region 15b is a hole, but the modified refractive index region 15b can also be obtained by embedding the hole with a semiconductor having a refractive index different from that of the base layer 15a. In that case, for example, a semiconductor may be embedded by a metal organic chemical vapor deposition method, a sputtering method or an epitaxial method in a hole formed by etching with respect to the base layer 15a. After the modified refractive index region 15b is formed by embedding the semiconductor into the hole of the base layer 15a, the identical semiconductor to that of the modified refractive index region 15b may be further deposited thereon. It is to be noted that when the modified refractive index region 15b is a hole, an inert gas such as argon and nitrogen, hydrogen, or air may be filled in the hole.

FIGS. 1 and 2 will be referred again. The surface emitting laser element 2A further includes an electrode 16 provided on the surface 14a of the contact layer 14 and an electrode 17 provided on the back surface 10b of the semiconductor substrate 10. The electrode 16 is an example of the second electrode in the present embodiment, and the electrode 17 is an example of the first electrode in the present embodiment. The electrode 16 is in ohmic contact with the contact layer 14, and the electrode 17 is in ohmic contact with the semiconductor substrate 10. The electrode 16 has a frame-shaped (annular) planar shape surrounding the metasurface 3A and has an opening 16a. The electrode 17 has a frame-shaped (annular) planar shape surrounding the output region of the laser light L1 and L2 on the first light output surface 2a and has an opening 17a. It is to be noted that various shapes such as a rectangular frame shape and an annular shape can be applied to the planar shapes of the electrodes 16 and 17. The surface 14*a* of the contact layer 14 is exposed from the opening 16*a*, and the back surface 10*b* of the semiconductor substrate 10 is exposed from the opening 17*a*. It is to be noted that the contact layer 14 not in contact with the electrode 16 may be removed. In that case, the upper cladding layer 13 is exposed from the opening 16*a*.

The back surface 10*b* of the semiconductor substrate 10 exposed from the opening 17*a* of the electrode 17 is covered with an antireflection film 19. The antireflection film 19 is made of, for example, a dielectric single layer film such as silicon nitride (e.g., SiN) or silicon oxide (e.g., $SiO_2$), or a dielectric multilayer film. As the dielectric multilayer film, for example, a film in which two or more types of dielectric layers selected from a group of dielectric layers such as titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$) are laminated can be applied.

In a certain example, the semiconductor substrate 10 is a GaAs substrate. The cladding layer 11, the active layer 12, the cladding layer 13, the contact layer 14, and the photonic crystal layer 15A are compound semiconductor layers each composed of a group III element and a group V element. In one example, the cladding layer 11 is an AlGaAs layer. The active layer 12 has a multiple quantum well structure (barrier layer: AlGaAs/well layer: InGaAs). The base layer 15*a* of the photonic crystal layer 15A is GaAs. The modified refractive index region 15*b* is a hole. The cladding layer 13 is an AlGaAs layer. The contact layer 14 is a GaAs layer.

In another example, the lower cladding layer 11 is an AlGaInP layer. The active layer 12 has a multiple quantum well structure (barrier layer: AlGaInP or GaInP/well layer: GaInP). The base layer 15*a* of the photonic crystal layer 15A is AlGaInP or GaInP. The modified refractive index region 15*b* is a hole. The upper cladding layer 13 is an AlGaInP layer. The contact layer 14 is a GaAs layer.

In yet another example, the semiconductor substrate 10 is an InP substrate. The lower cladding layer 11, the active layer 12, the photonic crystal layer 15A, the upper cladding layer 13, and the contact layer 14 may be layers made of an InP-based compound semiconductor. In one example, the lower cladding layer 11 is an InP layer. The active layer 12 has a multiple quantum well structure (barrier layer: GaInAsP/well layer: GaInAsP). The base layer 15*a* of the photonic crystal layer 15A is GaInAsP. The modified refractive index region 15*b* is a hole. The upper cladding layer 13 is an InP layer. The contact layer 14 is a GaInAsP layer.

In yet another example, the semiconductor substrate 10 is a GaN substrate. The lower cladding layer 11, the active layer 12, the photonic crystal layer 15A, the upper cladding layer 13, and the contact layer 14 may be layers made of a nitride-based compound semiconductor. In one example, the lower cladding layer 11 is an AlGaN layer. The active layer 12 has a multiple quantum well structure (barrier layer: InGaN/well layer: InGaN). The base layer 15*a* of the photonic crystal layer 15A is GaN. The modified refractive index region 15*b* is a hole. The upper cladding layer 13 is an AlGaN layer. The contact layer 14 is a GaN layer.

The lower cladding layer 11 has the same conductivity type as that of the semiconductor substrate 10. The upper cladding layer 13 and the contact layer 14 have a conductivity type opposite to that of the semiconductor substrate 10. In one example, the semiconductor substrate 10 and the lower cladding layer 11 are n-type. The upper cladding layer 13 and the contact layer 14 are p-type. When the photonic crystal layer 15A is provided between the active layer 12 and the lower cladding layer 11, the photonic crystal layer 15A has the same conductivity type as that of the semiconductor substrate 10. On the other hand, when the photonic crystal layer 15A is provided between the active layer 12 and the upper cladding layer 13, the photonic crystal layer 15A has a conductivity type opposite to that of the semiconductor substrate 10. The impurity concentration is, for example, $1 \times 10^{17}$ to $1 \times 10^{21}/cm^3$. The active layer 12 is intrinsic (i-type) to which no impurity is intentionally added, and the impurity concentration thereof is $1 \times 10^{15}/cm^3$ or less. It is to be noted that the photonic crystal layer 15A may be intrinsic (i-type) when it is necessary to suppress the effect of loss due to light absorption via the impurity level.

An example of the dimensions of the surface emitting laser element 2A of the present embodiment will be described. The inner diameter (length of one side if the shape of the opening 16*a* is square) of the opening 16*a* of the electrode 16 is within the range of 50 μm to 800 μm, and is, for example, 400 μm. The inner diameter (length of one side if the shape of the opening 17*a* is square) of the opening 17*a* of the electrode 17 is within the range of 50 μm to 800 μm, and is, for example, 400 μm. The thickness of the photonic crystal layer 15A is within the range of, for example, 100 nm to 400 nm, and is, for example, 200 nm. The thickness of the upper cladding layer 13 is within the range of 2 μm to 50 μm, for example. The thickness of the lower cladding layer 11 is within the range of 1 μm to 3 μm, for example.

When a drive current is supplied between the electrode 16 and the electrode 17, the drive current reaches the active layer 12. At this time, the current flowing through between the electrode 16 and the active layer 12 is diffused in the upper cladding layer 13, and the current flowing through between the electrode 17 and the active layer 12 is diffused in the lower cladding layer 11. Therefore, the drive current is dispersed and reaches near the center portion of the active layer 12. Then, recombination of electrons and holes occurs in the active layer 12, and light is generated in the active layer 12. Electrons, holes and generated light contributing to this light emission are efficiently confined between the lower cladding layer 11 and the upper cladding layer 13. The light emitted from the active layer 12 enters the photonic crystal layer 15A and forms a predetermined mode according to the lattice structure of the photonic crystal layer 15A.

A part of the laser light L1 outputted from the photonic crystal layer 15A is outputted from the surface 14*a* of the contact layer 14 to the outside of the surface emitting laser element 2A. Thereafter, the output laser light L1 propagates in the light guide layer 31 and reaches the reflective metasurface 3A. Then, the laser light L1 is reflected on the metasurface 3A, propagates in the light guide layer 31, and is inputted to the surface 14*a* of the contact layer 14 again. Then, the laser light L1 is outputted from the back surface 10*b* of the semiconductor substrate 10 to the outside of the surface emitting laser element 2A. The remaining laser light L2 outputted from the photonic crystal layer 15A directly reaches the back surface 10*b* of the semiconductor substrate 10, and is outputted from the back surface 10*b* of the semiconductor substrate 10 to the outside of the surface emitting laser element 2A together with the laser light L1. It is to be noted that the laser lights L1 and L2 are outputted in a direction (normal direction) perpendicular to the main surface 10*a*.

Figure 8:
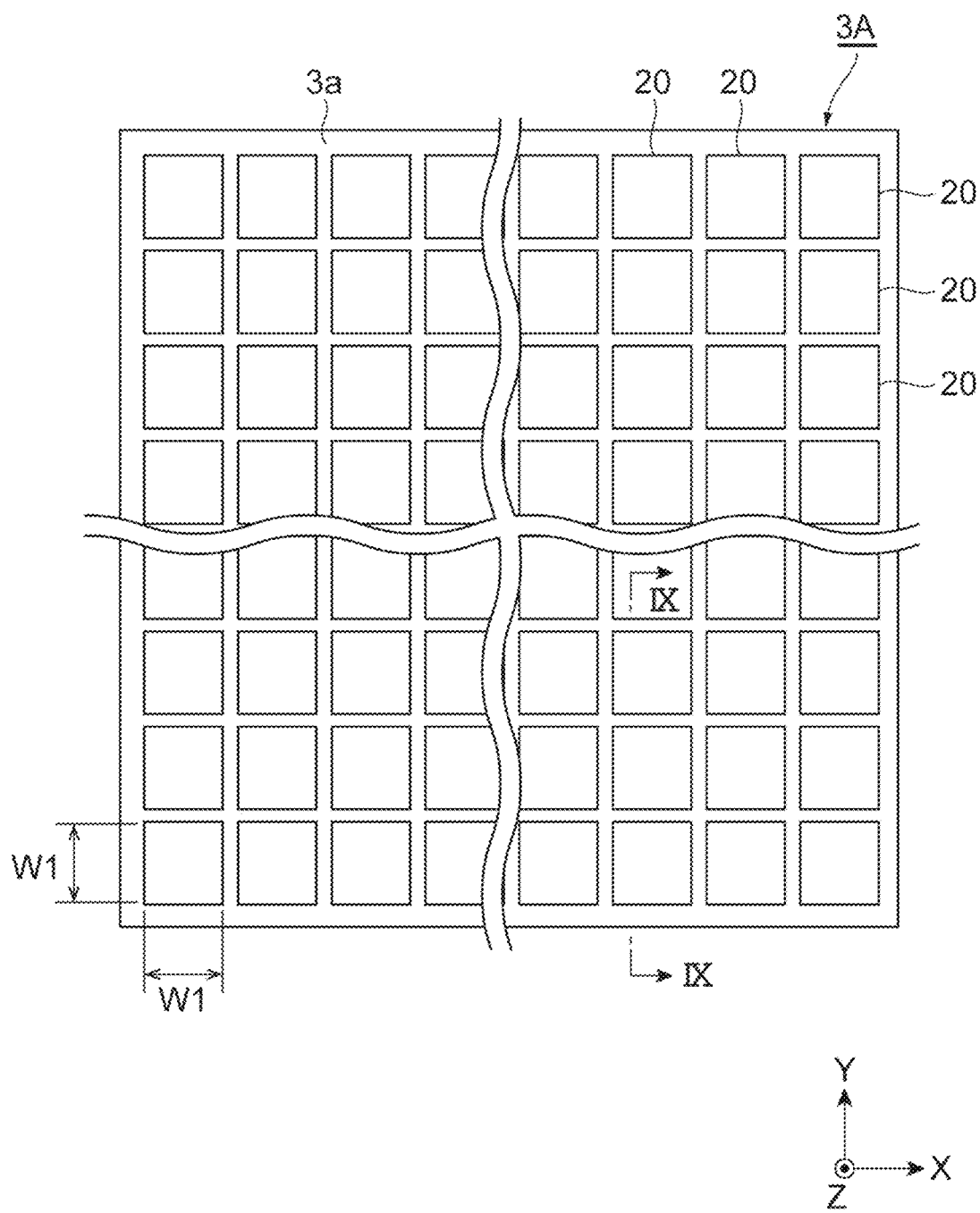
FIG. 8 is a plan view showing a metasurface 3A.

Next, the configuration of the metasurface 3A will be described in detail. FIG. 8 is a plan view showing the metasurface 3A. The metasurface 3A of the present embodiment is a reflective static metasurface. The "metasurface" is an optical element obtained by forming a plurality of unit structures each sufficiently smaller than the wavelength of light on a flat surface so as to constitute a one-dimensional array or a two-dimensional array, and the metasurface changes the phase, intensity, or polarization of the input light for each unit structure. There are various structures of metasurfaces, and the metasurface of the present embodiment has a structure called a gap plasmon type among the various structures. The metasurface 3A is a flat plate-shaped apparatus extending along two directions intersecting (e.g., orthogonal) with each other, for example, the X-axis direction and the Y-axis direction, and a direction intersecting (e.g., orthogonal) with both of the two directions, for example, the Z-axis direction, is a thickness direction. A plurality of unit regions 20 are provided on the main surface 3a of the metasurface 3A. The plurality of unit regions 20 are arrayed two-dimensionally in M rows and N columns (M and N are integers equal to or greater than 2) with the X-axis direction as the row direction and the Y-axis direction as the column direction. The planar shape of each unit region 20 is rectangular (e.g., a square shape). A length W1 of one side of each unit region 20 is within the range of 200 to 400 nm, for example. The metasurface 3A is used for various purposes such as lens application and hologram formation by individually modulating the phase of the laser light L1 inputted to the main surface 3a for each unit region 20.

Figure 9:
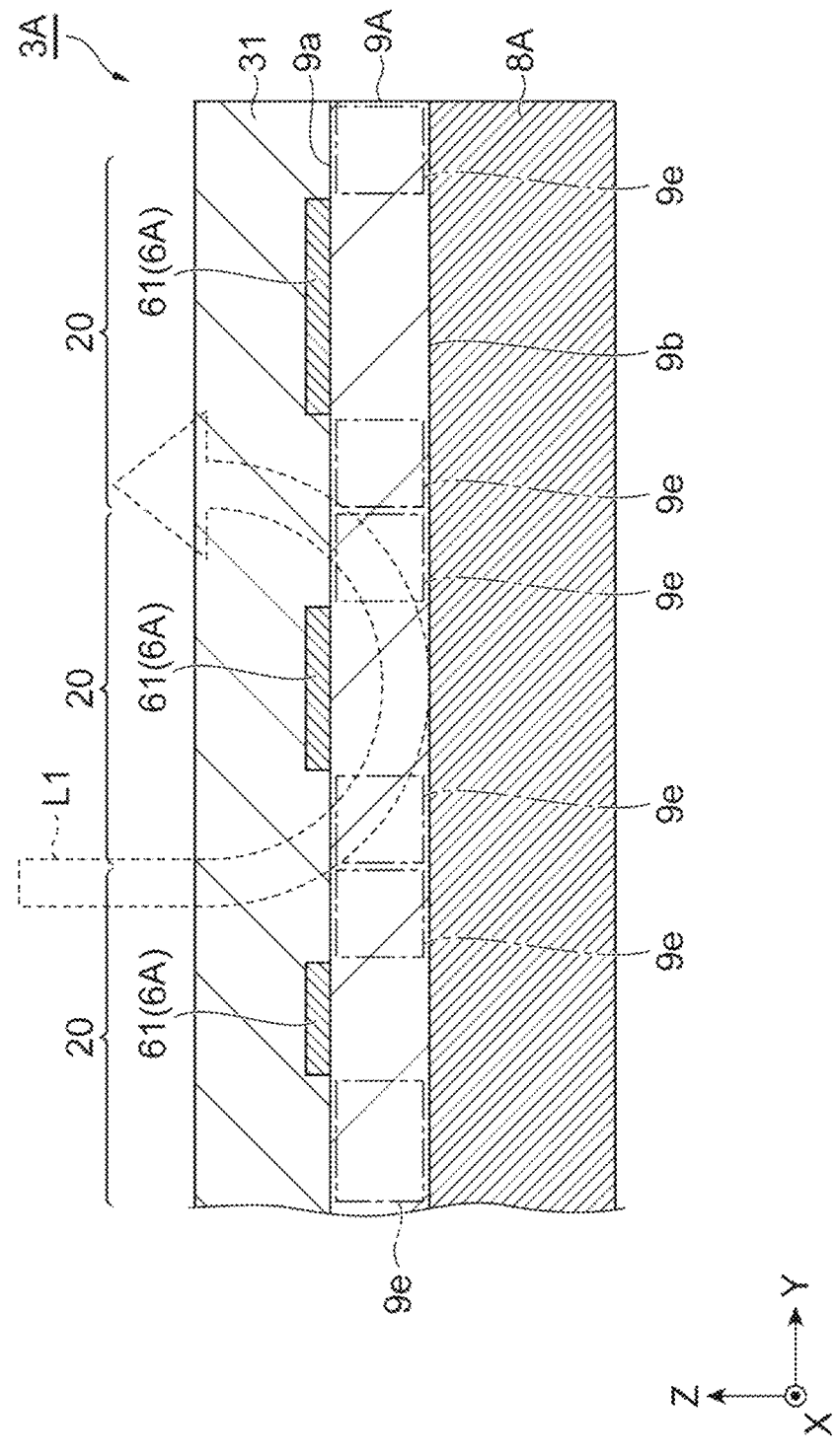
FIG. 9 is a cross-sectional view taken along a line IX-IX of FIG. 8, showing a cross-sectional structure of the metasurface 3A.

FIG. 9 is a cross-sectional view taken along the line IX-IX of FIG. 8, showing the cross-sectional structure of the metasurface 3A. As shown in FIG. 9, the metasurface 3A includes a light transmissive layer 9A. The light transmissive layer 9A has a main surface 9a (first surface) and a back surface 9b (second surface) located on the opposite side of the main surface 9a. Furthermore, the metasurface 3A includes a metal film 6A provided on the main surface 9a of the light transmissive layer 9A, and a metal film 8A provided on the back surface 9b of the light transmissive layer 9A. That is, the light transmissive layer 9A is provided between the metal film 6A and the metal film 8A. It is to be noted that FIG. 9 also shows the light guide layer 31 provided on the main surface 9a of the light transmissive layer 9A. The light guide layer 31 is in contact with the light transmissive layer 9A.

The light transmissive layer 9A is a flat film and extends along both the X-axis direction and the Y-axis direction over the plurality of unit regions 20. The main surface 9a of the light transmissive layer 9A faces the back surface 10b (i.e., the second light output surface 2b) of the semiconductor substrate 10 via the light guide layer 31. Therefore, the laser light L1 is inputted to the main surface 9a through the light guide layer 31. The distance between the main surface 9a and the back surface 9b (i.e., the thickness of the light transmissive layer 9A along the Z-axis direction) is set sufficiently smaller than the wavelength $\lambda_0$ of the laser light L1. The thickness of the light transmissive layer 9A falls within the range of 10 to 100 nm, for example.

The light transmissive layer 9A includes a dielectric layer. As an example, the light transmissive layer 9A of the present embodiment is composed of a single dielectric layer. It is to be noted that in addition to the dielectric layer, the light transmissive layer 9A may further include another layer (e.g., a transparent conductive layer similar to that of the second embodiment described later) different from the dielectric layer. The light transmissive layer 9A, which is a dielectric layer, is an inorganic film having light transmittivity and insulation property. The light transmittivity refers to a property in which absorption with respect to a wavelength inputted to the metasurface 3A is extremely low (e.g., light absorption is equal to or less than 20%). The insulation property refers to a property in which the electrical resistivity is extremely high (e.g., resistivity is equal to or greater than $10^6$ $\Omega \cdot$m). A dielectric layer 4 contains at least any one of aluminum oxide ($Al_2O_3$), silicon oxide ($SiO_2$), and magnesium fluoride ($MgF_2$), for example. The thickness of the dielectric layer 4 falls within the range of 1 to 20 nm, for example, and is 5 nm in one example.

The metal film 6A is the first metal film in the present embodiment and functions as a nano antenna in the metasurface structure. The metal film 6A is a film made of a metal such as gold (Au). The film thickness of the metal film 6A falls within the range of 30 to 100 nm, for example, and is 30 nm in one example. The metal film 6A includes a plurality of partial metal films 61. FIG. 10A is a view showing the planar shape of the metal film 6A. The existence range of the metal film 6A is indicated by hatching. As shown in FIG. 10A, the plurality of partial metal films 61 constitute a two-dimensional array along both the X-axis direction and the Y-axis direction and are separated from each other. Each partial metal film 61 is provided for each unit region 20 (each is included in the corresponding unit area 20). A width W2 of the partial metal film 61 along the X-axis direction and a width W3 of the partial metal film 61 along the Y-axis direction (first direction) are set smaller than the length W1 of one side of the unit region 20 and sufficiently smaller than the wavelength $\lambda_0$ of the laser light L1. Specifically, the width W2 of the partial metal film 61 falls within the range of 40 to 360 nm, and is 90 nm in one example. The width W3 of the partial metal film 61 falls within the range of 40 to 360 nm, preferably within the range of 40 to 180 nm, and is independently set for each unit region 20. Therefore, in the present embodiment, the widths W3 of the partial metal films 61 are different from one another between the two or more unit regions 20.

It is to be noted that as an example, the ratio ($W2/\lambda_0$) of the width W2 of the partial metal film 61 with respect to the wavelength $\lambda_0$ of the laser light L1 falls within the range of 0.02 to 0.9, and the ratio ($W3/\lambda_0$) of the width W3 of the partial metal film 61 with respect to the wavelength $\lambda_0$ of the laser light L1 falls within the range of 0.02 to 0.9. Furthermore, the ratio (W2/W1) of the width W2 of the partial metal film 61 with respect to the length W1 of one side of the unit region 20 falls within the range of 0.1 to 1, and the ratio (W3/W1) of the width W3 of the partial metal film 61 with respect to the length W1 of one side of the unit region 20 falls within the range of 0.1 to 0.9.

As described above, the widths W2 and W3 of the partial metal film 61 are smaller than the length W1 of one side of the unit region 20. Then, the partial metal film 61 is arranged at the substantially center portion of the unit region 20 with respect to each of the X-axis direction and the Y-axis direction. Therefore, as shown in FIGS. 9 and 10A, the light transmissive layer 9A includes a portion 9e exposed in each unit region 20 without being blocked by the metal film 6A when viewed from the Z-axis direction. The portion 9e has a shape surrounding the partial metal film 61 when the unit region 20 is viewed along the Z-axis direction, or is composed of a pair of portions sandwiching the partial metal film 61. The X-axis direction or the Y-axis direction coincides with the polarization direction of the laser light L1.

The metal film 8A is the second metal film in the present embodiment. The metal film 8A reflects, towards the main surface 9a, the laser light L1 inputted to the light transmissive layer 9A. The metal film 8A is made of a metal such as gold (Au). The film thickness of the metal film 8A falls within the range of 100 to 200 nm, for example, and is 130 nm in one example. FIG. 10B is a view showing the planar shape of the metal film 8A. The existence range of the metal film 8A is indicated by hatching. The metal film 8A of the present embodiment is provided over the entire surface of the back surface 9b of the light transmissive layer 9A without any gap.

Figure 11:
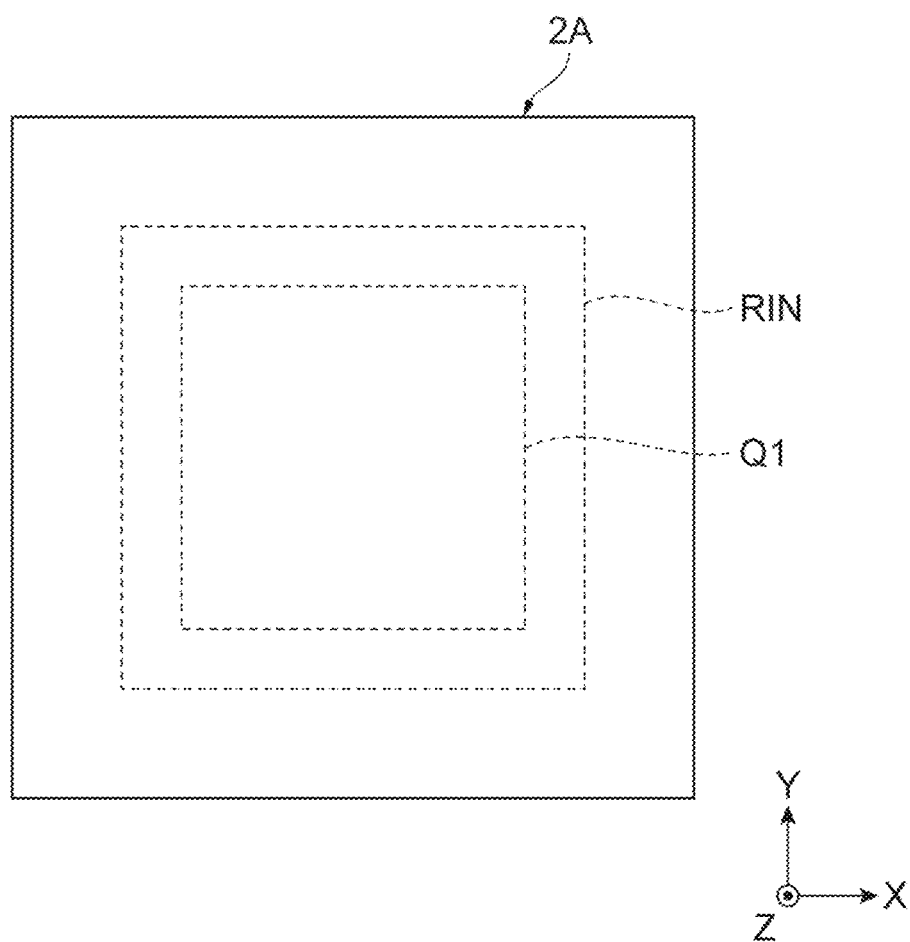
FIG. 11 is a plan view showing a relationship between an inner region RIN in which a plurality of the modified refractive index regions 15b are formed in the photonic crystal layer 15A and a region Q1 in which a plurality of partial metal films 61 are formed in the metasurface 3A.

FIG. 11 is a plan view showing the relationship between an inner region RIN (see FIG. 5) in which the plurality of the modified refractive index regions 15b are formed in the photonic crystal layer 15A and a region Q1 in which the plurality of partial metal films 61 are formed in the metasurface 3A. As shown in FIG. 11, the area of the region Q1 is smaller than the area of the inner region RIN, and the region Q1 may be included in the inner region RIN when the surface emitting laser element 2A is viewed along the Z-axis direction.

FIG. 9 will be referred again. The light guide layer 31 is provided between the second light output surface 2b of the surface emitting laser element 2A and the light transmissive layer 9A of the metasurface 3A in order to reduce optical loss between the metasurface 3A and the surface emitting laser element 2A. The light guide layer 31 is an inorganic film having light transmittivity and insulation property, and also serves as an antireflection film for the second light output surface 2b. The light guide layer 31 may be composed of a single layer or may have a laminated structure in which a plurality of layers are laminated. The light guide layer 31 has a surface 31a located on the surface emitting laser element 2A side and a surface 31b located on the metasurface 3A side (See FIGS. 2 and 3). The surfaces 31a and 31b are surfaces that are flat and parallel to each other and face each other along the Z-axis direction. The light guide layer 31 is in contact with the second light output surface 2b on the surface 31a, and is in contact with the main surface 9a of the light transmissive layer 9A on the surface 31b. The distance (i.e., the thickness of the light guide layer 31) between the surfaces 31a and 31b along the Z-axis direction falls within, for example, the range of 50 to 300 nm, and is 117 nm in one example.

The light guide layer 31 may include at least any one of $Al_2O_3$, $SiO_2$, $MgF_2$, and calcium fluoride ($CaF_2$), for example. In order to reduce reflection on the interface between the light guide layer 31 and the light transmissive layer 9A, the layer constituting the main surface 9a of the light transmissive layer 9A may have a refractive index equal to or higher than the refractive index of the light guide layer 31 at the wavelength of the laser light L1. In other words, the refractive index of the light guide layer 31 may be the same as or smaller than the refractive index of the layer constituting the main surface 9a of the light transmissive layer 9A. Therefore, when the light transmissive layer 9A is made of $Al_2O_3$, the light guide layer 31 may contain at least any one of $Al_2O_3$, $SiO_2$, $MgF_2$, and $CaF_2$. When the light transmissive layer 9A is made of $SiO_2$, the light guide layer 31 may include at least any one of $SiO_2$, $MgF_2$, and $CaF_2$. When the light transmissive layer 9A is made of $MgF_2$, the light guide layer 31 may include at least any one of $MgF_2$ and $CaF_2$. Due to this, the laser light L1 outputted from the second light output surface 2b is inputted from the light guide layer 31 to the light transmissive layer 9A in a state where the loss is kept low.

It is to be noted that the present embodiment has a configuration in which the plurality of partial metal films 61 of the metal film 6A are embedded in the light guide layer 31, but it may have a configuration in which the plurality of partial metal films 61 are embedded in the light transmissive layer 9A. In the configuration in which the plurality of partial metal films 61 of the metal film 6A are embedded in the light guide layer 31, the minimum thickness of the light guide layer 31 is larger than the film thickness of the metal film 6A.

FIGS. 12A to 12D and FIGS. 13A to 13C are cross-sectional views showing each step in one example of the fabrication method of the metasurface 3A. First, as shown in FIG. 12A, the surface emitting laser element 2A is prepared as the first step. Then, the light guide layer 31 is formed on the second light output surface 2b (the surface 14a of the contact layer 14 in the present embodiment) of the surface emitting laser element 2A. The film formation of the light guide layer 31 is performed by using, for example, an electron-beam deposition method or a sputtering method.

Next, as shown in FIG. 12B, a resist 41 is applied onto the light guide layer 31. The resist 41 is an electron beam exposure resist, for example. Subsequently, as shown in FIG. 12C, the resist 41 is exposed and developed, whereby an opening 41a is formed in the resist 41. The opening 41a corresponds to the plurality of partial metal films 61. Subsequently, as shown in FIG. 12D, the light guide layer 31 is etched through the opening 41a of the resist 41. Thus, a plurality of recess portions 31c are formed on the light guide layer 31. The depth of the recess portion 31c is equal to the thickness of the plurality of partial metal films 61. Examples of the etching method at this time include dry etching such as reactive ion etching (RIE). The depth of the recess portion 31c can be controlled by the etching time.

Subsequently, as shown in FIG. 13A, a metal material (e.g., Au) for the metal film 6A is vapor-deposited on the entire surface of the light guide layer 31. At this time, the metal material reaches the recess portion 31c of the light guide layer 31 through the opening 41a of the resist 41, and fills the recess portion 31c. Thus, the plurality of partial metal films 61 of the metal film 6A are formed. The thickness of the partial metal film 61 can be controlled by the vapor-deposition time. Preferably, the vapor-deposition time is controlled so that the thickness of the partial metal film 61 and the depth of the recess portion 31c are equal to each other. In this step, a surplus metal material M is deposited on the resist 41.

Subsequently, as shown in FIG. 13B, the resist 41 is removed from the light guide layer 31. At this time, the surplus metal material M is removed together with the resist 41. Thus, the surface 31b of the light guide layer 31 appears. By appropriately controlling the thickness of the partial metal film 61 and the depth of the recess portion 31c, the surface 31b and the exposed surfaces of the plurality of partial metal films 61 are flush with each other (become flat overall). Thereafter, as shown in FIG. 13C, the light transmissive layer 9A is formed on the surface 31b of the light guide layer 31 and the entire surface of the plurality of partial metal films 61, and the metal film 8A is further formed thereon. The film formation method and material of the light transmissive layer 9A are the same as the film formation method and material of the light guide layer 31. Since the surface 31b of the light guide layer 31 and the exposed surfaces of the plurality of partial metal films 61 are flat overall, the main surface 9a and the back surface 9b of the light transmissive layer 9A become also flat. The film formation method and material of the metal film 8A are the same as the film formation method and material of the metal film 6A. Through the above-described configuration, the metasurface 3A of the present embodiment is fabricated.

The operations and effects obtained by the light-emitting device 1A of the present embodiment described above will be described. In the light-emitting device 1A, the laser lights L1 and L2 generated in the surface emitting laser element 2A are outputted from the first light output surface 2a and the second light output surface 2b, respectively. Of these, the laser light L1 outputted from the second light output surface 2b propagates through the light guide layer 31 and is inputted to the main surface 9a of the light transmissive layer 9A.

The metasurface 3A of the present embodiment includes an MIM structure in which the metal film 8A as a light reflection film, the light transmissive layer 9A including the dielectric layer, and the metal film 6A composed of the plurality of partial metal films 61 having the finite width W3 are laminated in this order. In this case, as shown in FIGS. 2 and 3, the light transmissive layer 9A includes the portion 9e exposed from the metal film 6A. The laser light L1 inputted from the surface emitting laser element 2A to the portion 9e of the light transmissive layer 9A is reflected on the metal film 8A and then outputted to the outside of the metasurface 3A again. When the width W3 of the plurality of partial metal films 61 and the thickness of the light transmissive layer 9A are sufficiently smaller than the wavelength $\lambda_0$ of the laser light L1, strong magnetic resonance (plasmon resonance) due to surface plasmon coupling occurs in the light transmissive layer 9A. Due to this magnetic resonance, the phase of the laser light L1 passing through between the partial metal film 61 and the metal film 8A is modulated.

Here, the following Expression (1) expresses the relationship of a phase modulation amount $\varphi$ of the laser light L1 by magnetic resonance, a width w (=W3) of the partial metal film 61, the wavelength $\lambda_0$ of the laser light L1, and an effective refractive index $N_{gsp}$ of the light transmissive layer 9A. It is to be noted that m is an integer.

$$w \frac{2\pi}{\lambda} N_{gsp} = m\pi - \varphi \quad (1)$$

As is clear from Expression (1), the phase modulation amount $\varphi$ depends on the width w of the partial metal film 61. Therefore, the phase of the laser light L1 can be spatially controlled by independently setting the width w for each unit region 20. The laser light L1 whose phase has thus been modulated is again inputted from the second light output surface 2b into the surface emitting laser element 2A and is outputted from the first light output surface 2a.

As described above, when the metasurface is reflective, the light-emitting device including a light source and a metasurface requires an optical system for inputting light from the light source to the metasurface and an optical system for guiding light outputted from the metasurface. Therefore, the overall optical system is likely to become complicated, which becomes a factor that prevents miniaturization of the light-emitting device. On the other hand, in the light-emitting device 1A of the present embodiment, the light source (the surface emitting laser element 2A) and the metasurface 3A are integrated via the light guide layer 31. Therefore, an optical system between the reflective metasurface 3A and the light source (surface emitting laser element 2A) is unnecessary. Hence, simplification of the optical system is realized.

In addition, in the light-emitting device 1A, the layer constituting the main surface 9a of the light transmissive layer 9A has a refractive index equal to or greater than the refractive index of the light guide layer 31 at the wavelength of the laser light L1. Since such configuration reduces reflection on the interface between the light guide layer 31 and the light transmissive layer 9A, the laser light L1 can be efficiently inputted from the light guide layer 31 to the light transmissive layer 9A. Therefore, the metasurface 3A can function effectively.

As in the present embodiment, the widths W3 of the metal films 6A along the Y-axis direction in the two or more unit regions 20 may be different from each other. As described above, the phase modulation amount depends on the width W3 of the metal film 6A. Therefore, such configuration enables phase modulation in each of the plurality of unit regions 20 constituting a one-dimensional array or a two-dimensional array, and can preferably realize the light-emitting device 1A including a static metasurface having such configuration.

Figure 14:
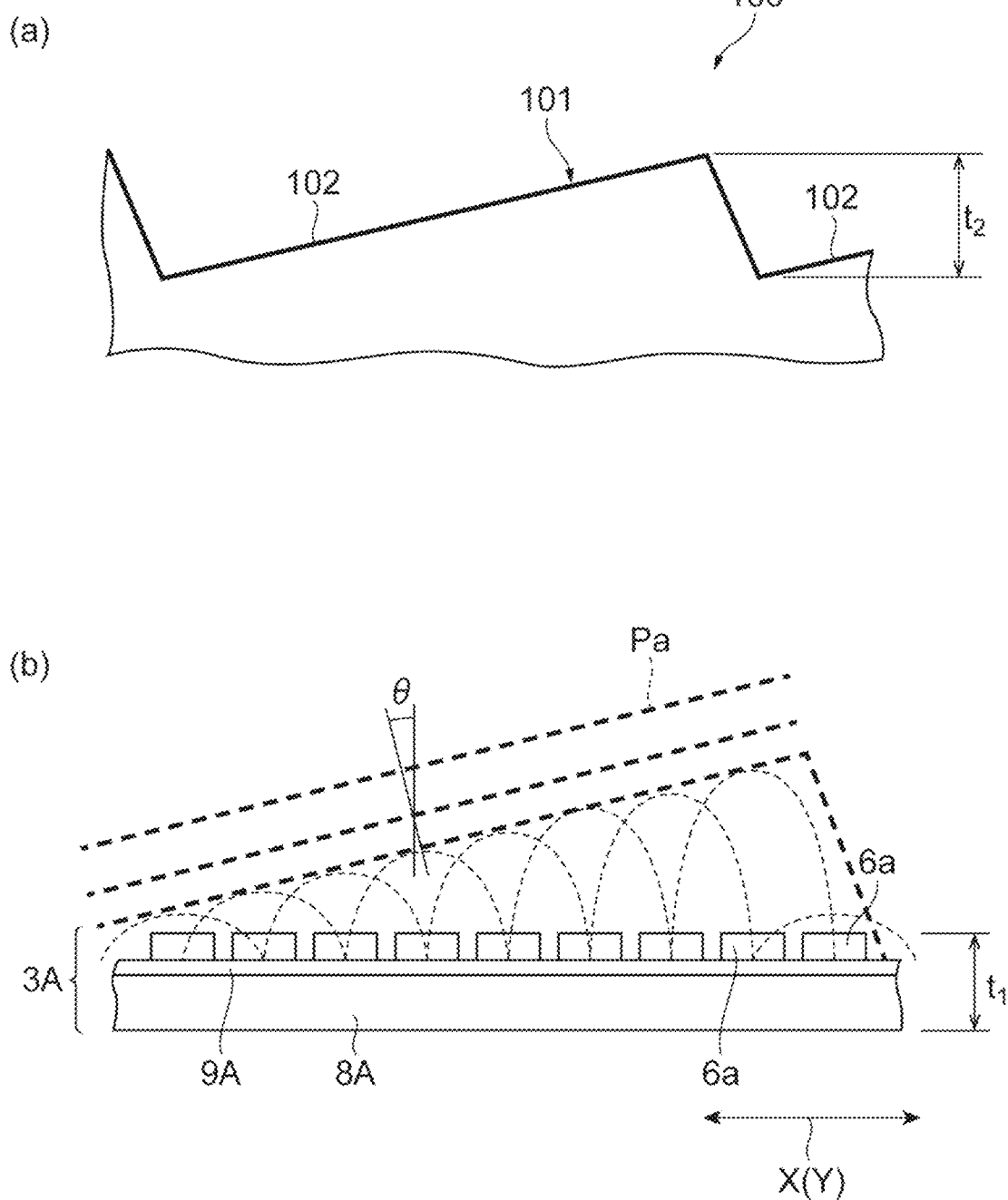
FIG. 14A is a view conceptually showing beam steering that can vary an exit angle of output light as an application example of the metasurface 3A.
FIG. 14B is a cross-sectional view showing the shape of a light reflection surface 101 of a diffractive optical element (DOE) 100 having a structure for beam steering.

FIGS. 14A and 14B are views conceptually showing beam steering that can vary an exit angle of output light as an application example of the metasurface 3A. In the example of FIG. 14B, by changing the phase modulation amount $\varphi$ by a constant amount for each unit region 20 along the X-axis direction (or Y-axis direction), a wavefront Pa of the output light is tilted with respect to the surface of the metasurface 3A. At this time, an angle $\theta$ (i.e., exit angle of the output light) formed by the normal line of the wavefront Pa and the normal line of the surface of the metasurface 3A is determined according to the change amount of the phase modulation amount $\varphi$ for each unit region 20. The larger the change amount is, the larger an exit angle $\theta$ of the output light becomes, and the smaller the change amount is, the smaller the exit angle $\theta$ of the output light becomes. Therefore, the exit angle $\theta$ of the output light can be set to an arbitrary angle by controlling the change amount of the phase modulation amount $\varphi$ for each unit region 20.

FIG. 14A is a cross-sectional view showing the shape of a light reflection surface 101 of a diffractive optical element (DOE) 100 having a structure for beam steering. In the diffractive optical element 100, the light reflection surface 101 is provided with periodic unevenness, and a tilted surface 102 is formed on a protrusion portion, thereby controlling the exit angle of the output light (reflected light). However, in such configuration, the uneven structure of the light reflection surface 101 has a thickness $t_2$ of 200 μm, for example. On the other hand, the metasurface 3A of the present embodiment has a thickness $t_1$ of 210 nm, for example, and can be configured to be extremely thin as compared with the diffractive optical element 100 (see FIG. 14B). Therefore, it is possible to contribute to miniaturization of the light-emitting device 1A.

As in the present embodiment, the surface emitting laser element 2A has a substrate having the main surface 10a and the back surface 10b opposing the main surface 10a, and the active layer 12 and the photonic crystal layer 15A provided on the main surface 10a. The photonic crystal layer 15A may include the base layer 15a and the plurality of modified refractive index regions 15b periodically arrayed on the design plane (reference plane) perpendicular to the thickness direction of the photonic crystal layer 15A having a refractive index different from the refractive index of the base layer 15a. Such configuration allows the surface emitting laser element 2A to function as a photonic crystal surface emitting laser (PCSEL). The PCSEL can control the optical mode distribution in the direction parallel with the main surface by the photonic crystal. Therefore, it is possible in principle to increase the light-emitting area of the PCSEL while maintaining the single mode as compared with, for example, the vertical cavity surface emitting laser (VCSEL), which is the same surface emitting laser element. That is, it is possible in principle to increase the light-emitting area of the PCSEL while keeping the wavefront in a good state. Therefore, a more complicated phase modulation pattern can be realized by increasing the number of the unit regions 20 of the metasurface 3A.

As in the present embodiment, the light transmissive layer 9A may include at least any one of $Al_2O_3$, $SiO_2$, and $MgF_2$. Such configuration enables the light transmissive layer 9A including the dielectric layer to be preferably realized.

As in the present embodiment, the light guide layer 31 may contain at least any one of $Al_2O_3$, $SiO_2$, $MgF_2$, and $CaF_2$. Such configuration allows the operation of the light guide layer 31 described above to be preferably achieved.

As in the present embodiment, the electrode 17 provided on the first light output surface 2a may have a shape surrounding the laser light output region on the first light output surface 2a. With such configuration, the laser light L1 phase-modulated on the metasurface 3A can be outputted from the first light output surface 2a while avoiding the electrode 17.

As in the present embodiment, the electrode 16 provided on the second light output surface 2b may have a shape surrounding the metasurface 3A. Such configuration allows the current from the electrode 16 to be sufficiently diffused near the center portion of the active layer 12 while providing the metasurface 3A on the second light output surface 2b together with the electrode 16.

First Modified Example

Figure 15:
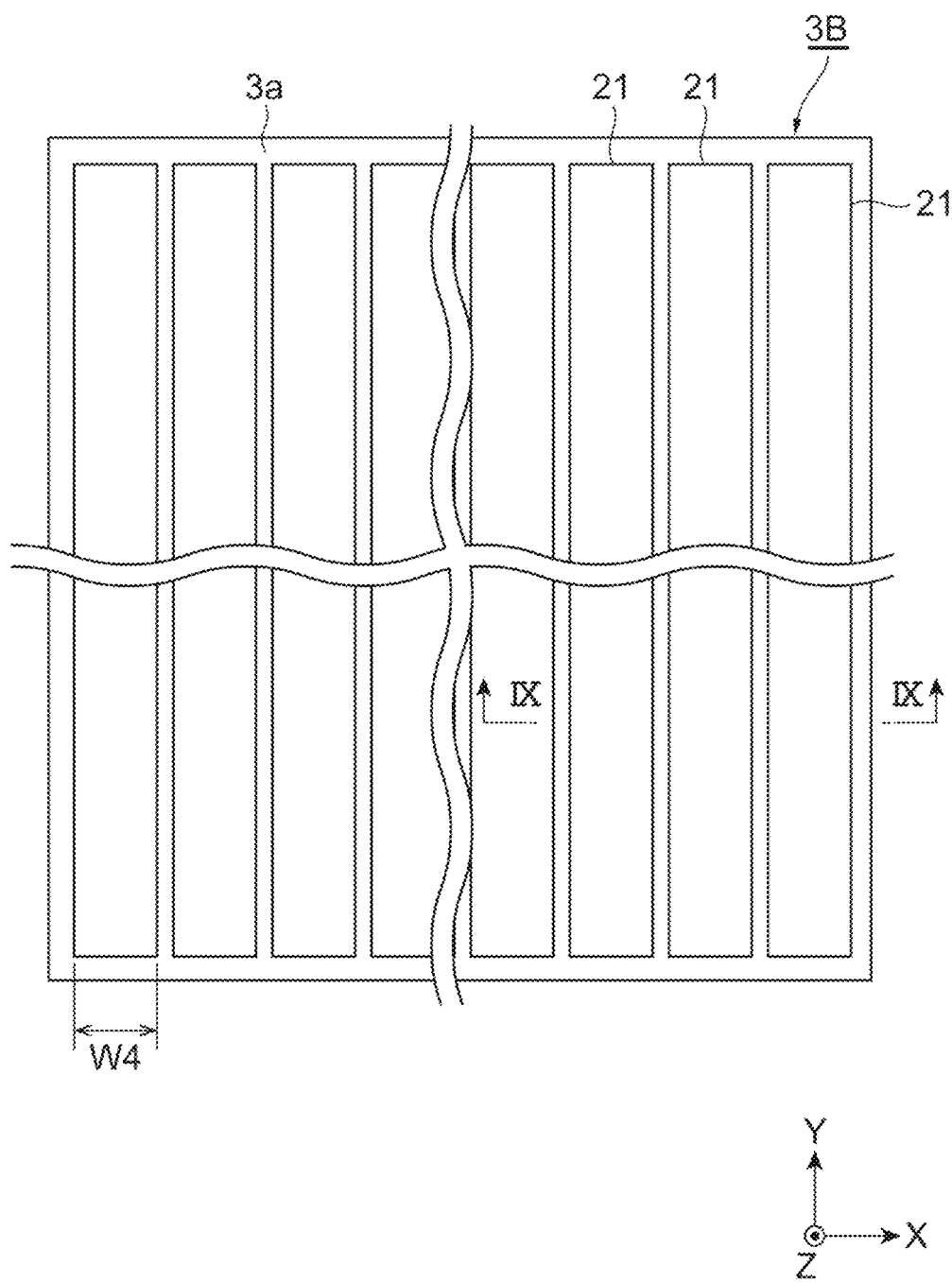
FIG. 15 is a plan view showing a metasurface 3B according to one modified example of the first embodiment.

FIG. 15 is a plan view showing a metasurface 3B according to one modified example of the first embodiment. In place of the plurality of unit regions 20 of the first embodiment, a plurality (N) of unit regions 21 are formed on the main surface 3a of the metasurface 3B. The plurality of unit regions 21 constitute a one-dimensional array along the X-axis direction. The planar shape of each unit region 21 is rectangular (e.g., a rectangular shape whose longitudinal direction is the Y-axis direction intersecting with the array direction). A width W4 of each unit region 21 along the X-axis direction is the same as the length W1 of one side of the unit region 20 of the first embodiment. It is to be noted that the structure of the IX-IX cross section of the metasurface 3B is the same as that of the first embodiment (see FIG. 9).

FIG. 16A is a view showing a planar shape of a metal film 6B. The metal film 6B is provided on the main surface 9a of the light transmissive layer 9A and, similarly to the first embodiment, includes a plurality of partial metal films 62. The plurality of partial metal films 62 are separated side by side from each other along the X-axis direction. The arrangement period (array pitch) of the plurality of partial metal films 62 along the X-axis direction is constant. The planar shape of each partial metal film 62 is rectangular (e.g., a rectangular shape). Each partial metal film 62 is provided for each unit region 21 and located in each unit region 21. The width W2 of the partial metal film 62 along the X-axis direction and the width W3 of the partial metal film 62 along the Y-axis direction are the same as those of the first embodiment. Also in the present modified example, the width W2 of the partial metal film 62 is smaller than the width W4 of the unit region 21. The width W3 of the partial metal film 62 is sufficiently smaller than the wavelength $\lambda_0$ of the laser light L1 and is independently set for each unit region 21. Therefore, also in the present embodiment, the widths W3 of the partial metal films 62 are different from one another between the two or more unit regions 21. Then, the partial metal film 62 is arranged at the substantially center portion of the unit region 21 with respect to each of the X-axis direction and the Y-axis direction. Therefore, the light transmissive layer 9A includes the portion 9e exposed from the partial metal film 62 in each unit region 21.

FIG. 16B is a view showing a planar shape of the metal film 8A. The aspect of the metal film 8A included in the metasurface 3B is the same as that of the first embodiment.

As in the present modified example, the plurality of unit regions may constitute a one-dimensional array. Even in such case, the same effects as those of the first embodiment can be achieved.

Second Embodiment

Figure 17:
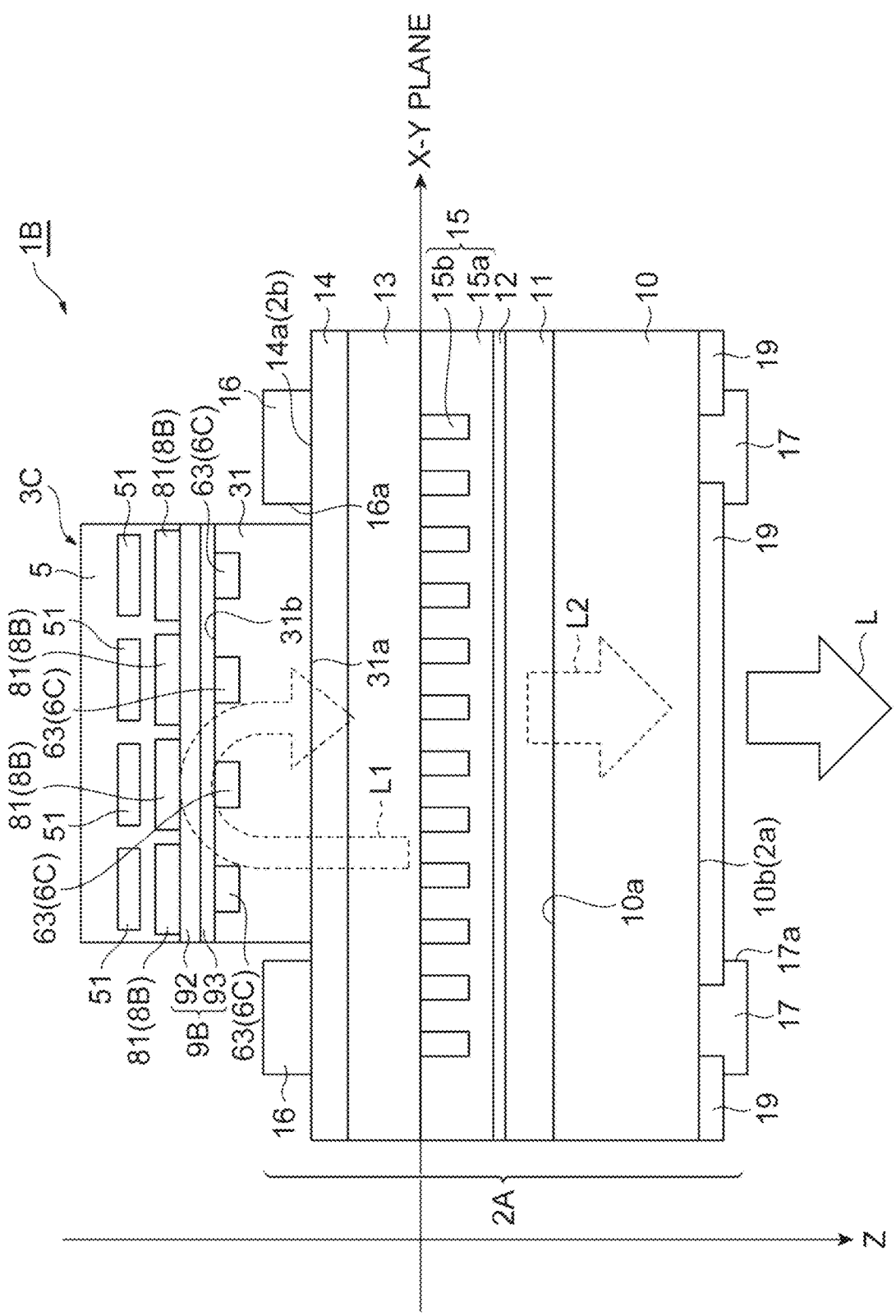
FIG. 17 is a view schematically showing a cross-sectional configuration of a light-emitting device 1B according to a second embodiment of the present invention.

FIG. 17 is a view schematically showing the cross-sectional configuration of the light-emitting device 1B according to the second embodiment of the present invention. As shown in FIG. 17, the light-emitting device 1B of the present embodiment includes the surface emitting laser element 2A, a metasurface 3C, and the light guide layer 31. Of these, the configurations of the surface emitting laser element 2A and the light guide layer 31 are the same as those in the first embodiment, and hence, description thereof is omitted in the present embodiment.

The metasurface 3C of the present embodiment is provided on the second light output surface 2b of the surface emitting laser element 2A through the light guide layer 31, in place of the metasurface 3A of the first embodiment. The metasurface 3C is a reflective dynamic metasurface configured integrally with the surface emitting laser element 2A, and has a gap plasmon type structure similarly to the metasurface 3A of the first embodiment. Similarly to the metasurface 3A of the first embodiment, the metasurface 3C has the plurality of unit regions (pixels) 20 shown in FIG. 8. The plurality of unit regions 20 constitute a two-dimensional array in M rows and N columns (M and N are integers equal to or greater than 2) with the X-axis direction as the row direction and the Y-axis direction as the column direction. The planar shape of each unit region 20 is rectangular (e.g., a square shape). The length W1 of one side of each unit region 20 falls within the range of 200 to 400 nm, for example. The metasurface 3C can be used for various purposes such as lens application and hologram formation by individually modulating the phase of the laser light L1 inputted to the main surface 3a for each unit region 20.

Figure 18:
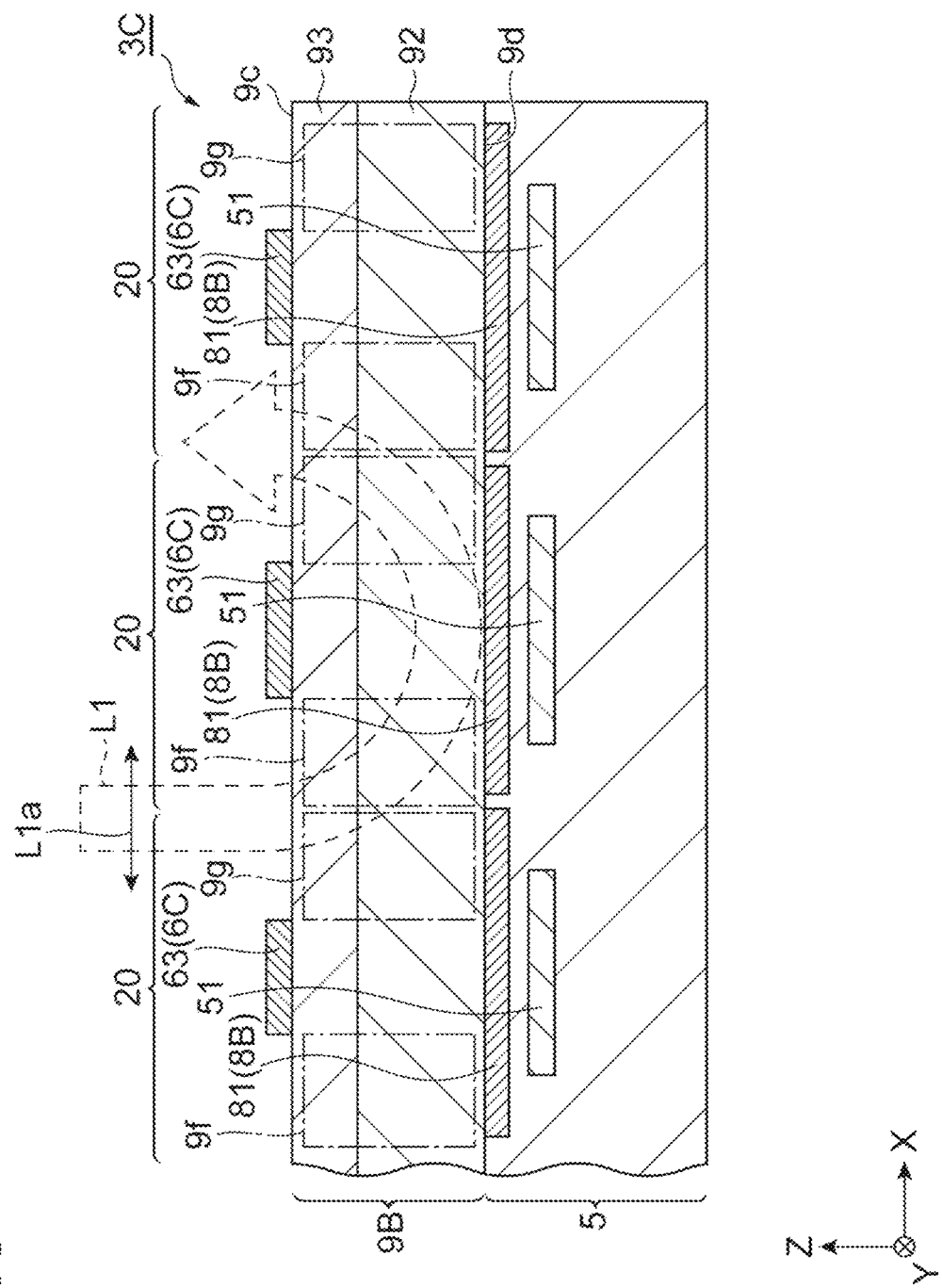
FIG. 18 is a view showing a cross-sectional structure of a metasurface 3C corresponding to a line IX-IX of FIG. 8.

FIG. 18 is a view showing the cross-sectional structure of the metasurface 3C corresponding to the line IX-IX of FIG. 8. As shown in FIG. 18, the metasurface 3C includes a drive circuit 5, a metal film 8B provided on the surface of the drive circuit 5, a light transmissive layer 9B laminated on the metal film 8B, and a metal film 6C provided on the light transmissive layer 9B. That is, the light transmissive layer 9B is provided between the metal film 8B and the metal film 6C.

The light transmissive layer 9B is a flat film and extends along both the X-axis direction and the Y-axis direction over the plurality of unit regions 20. The light transmissive layer 9B has a main surface 9c (first surface) and a back surface 9d (second surface). The main surface 9c and the back surface 9d face each other along the Z-axis direction. The laser light L1 is inputted to the main surface 9c from the second light output surface 2b of the surface emitting laser element 2A through the light guide layer 31. The distance between the main surface 9c and the back surface 9d (i.e., the thickness of the light transmissive layer 9B along the Z-axis direction) is set sufficiently smaller than the wavelength $\lambda_o$ of the laser light L1. The thickness of the light transmissive layer 9B falls within the range of 10 to 100 nm, for example. The light transmissive layer 9B has a transparent conductive layer 92 and a dielectric layer 93 laminated with the Z-axis direction as the lamination direction.

The transparent conductive layer 92 is an inorganic film having light transmittivity and conductivity. The transparent conductive layer 92 of the present embodiment contains at least any one of indium oxide ($In_2O_3$) and zinc oxide ($Zn_2O_3$) whose resistance is reduced by a dopant. The dopant for indium oxide is Sn, for example. Indium oxide doped with Sn is called ITO. The dopant for zinc oxide is Al or Ga, for example. Zinc oxide doped with Al is called AZO. Zinc oxide doped with Ga is called GZO. The thickness of the transparent conductive layer 92 falls within the range of 3 to 50 nm, for example, and is 20 nm in one example.

The dielectric layer 93 is an inorganic film having light transmittivity and insulation property. The insulation property refers to a property in which the electrical resistivity is extremely high (e.g., resistivity is equal to or greater than $10^6$ $\Omega \cdot m$). The dielectric layer 93 contains at least any one of aluminum oxide ($Al_2O_3$), silicon oxide ($SiO_2$), and magnesium fluoride ($MgF_2$), for example. The thickness of the dielectric layer 93 falls within the range of 3 to 20 nm, for example, and is 5 nm in one example. In the present embodiment, the dielectric layer 93 is located on the main surface 9c side with respect to the transparent conductive layer 92.

It is to be noted that while in the present embodiment, the transparent conductive layer 92 is provided on the back surface 9d side and the dielectric layer 93 is provided on the main surface 9c side, the transparent conductive layer 92 may be provided on the main surface 9c side and the dielectric layer 93 may be provided on the back surface 9d side. In the present embodiment, a part of the transparent conductive layer 92 constitutes the back surface 9d, and a part of the dielectric layer 93 constitutes the main surface 9c. However, another layer may be further provided between the structure including the transparent conductive layer 92 and the dielectric layer 93 and the main surface 9c and/or the back surface 9d. Another layer may be further provided between the transparent conductive layer 92 and the dielectric layer 93.

The metal film 6C is the first metal film in the present embodiment and can function as a nano antenna in the metasurface structure. The metal film 6C is provided on the main surface 9c of the light transmissive layer 9B. The metal film 6C is a film made of a metal such as gold (Au). The film thickness of the metal film 6C falls within the range of 30 to 100 nm, for example, and is 50 nm in one example. The metal film 6C includes a plurality of partial metal films 63. FIG. 19A is a view showing the planar shape of the metal film 6C. As shown in FIG. 19A, the plurality of partial metal films 63 are separated side by side from each other along the X-axis direction. Each partial metal film 63 is provided for each column of the unit regions 20 and extends over the two or more unit regions 20 (M unit regions 20 in the present embodiment) arranged side by side along the Y-axis direction. A width W5 of the partial metal film 63 along the X-axis direction is set smaller than the length W1 of the unit region 20 along the X-axis direction and is set sufficiently smaller than the wavelength $\lambda_o$ of the laser light L1. In one example, the width W5 of the partial metal film 63 falls within the range of 40 to 360 nm, and is 250 nm in one example. The distance between the adjacent partial metal films 63 falls within the range of 40 to 360 nm, and is 150 nm in one example. The ratio (W5/$\lambda_o$) of the width W5 of the partial metal film 63 with respect to the wavelength $\lambda_o$ of the laser light L1 falls within the range of 0.02 to 0.9. Furthermore, the ratio (W5/W1) of the width W5 of the partial metal film 63 with respect to the length W1 of one side of the unit region 20 falls within the range of 0.1 to 0.9.

As described above, the width W5 of the partial metal film 63 is smaller than the length W1 of the unit region 20. Then, the partial metal film 63 is arranged at the substantially center portion of the unit region 20 with respect to the X-axis direction. Therefore, as shown in FIGS. 18 and 19A, the light transmissive layer 9B includes a pair of portions 9f and 9g in each unit region 20. The pair of portions 9f and 9g are provided at positions sandwiching the partial metal film 63 when the unit region 20 is viewed along the Z-axis direction, and are exposed from the metal film 6C. As shown in FIG. 18, the array direction (i.e., the X-axis direction) of the pair of portions 9f and 9g coincides with a polarization direction L1a of the laser light L1.

The metal film 8B is the second metal film in the present embodiment. The metal film 8B is provided on the back surface 9d of the light transmissive layer 9B. In one example, the metal film 8B is in contact with the back surface 9d. The metal film 8B reflects, towards the main surface 9c, the laser light L1 inputted to the light transmissive layer 9B. The metal film 8B is made of a metal such as gold (Au). The film thickness of the metal film 8B falls within the range of 100 to 200 nm, for example, and is 150 nm in one example. The metal film 8B includes a plurality of partial metal films 81. FIG. 19B is a view showing the planar shape of the metal film 8B. The plurality of partial metal films 81 constitute a two-dimensional array of M rows and N columns in which the X-axis direction is the row direction and the Y-axis direction is the column direction, and are separated from one another. Each partial metal film 81 is provided for each unit region 20 and is located in each unit region 20. In one example, the planar shape of each partial metal film 81 is rectangular (e.g., a square shape). In one example, a length W6 of one side of the partial metal film 81 is within the range of 40 to 360 nm. Furthermore, the ratio (W6/W1) of the length W6 of one side of the partial metal film 81 with respect to the length W1 of one side of the unit region 20 is within the range of 0.1 to 0.9.

The drive circuit 5 is a plate-like member having a plurality of transistors 51. The drive circuit 5 controls a voltage applied between the metal film 8B and the metal film 6C from the outside of the metasurface 3C. More specifically, the drive circuit 5 sets the potentials of the plurality of partial metal films 63 to a common reference potential (GND potential), and individually controls the potentials of the plurality of partial metal films 81 by using the transistors 51. The drive circuit 5 is located on the back surface 9d side with respect to the light transmissive layer 9B. Each transistor 51 is provided corresponding to each unit region 20, and is located in each unit region 20 when the unit region 20 is viewed along the Z-axis direction. The transistor 51 is a thin film transistor provided on a substrate made of a dielectric, for example. The partial metal film 81 is provided on each transistor 51 via an insulation film.

Figure 20:
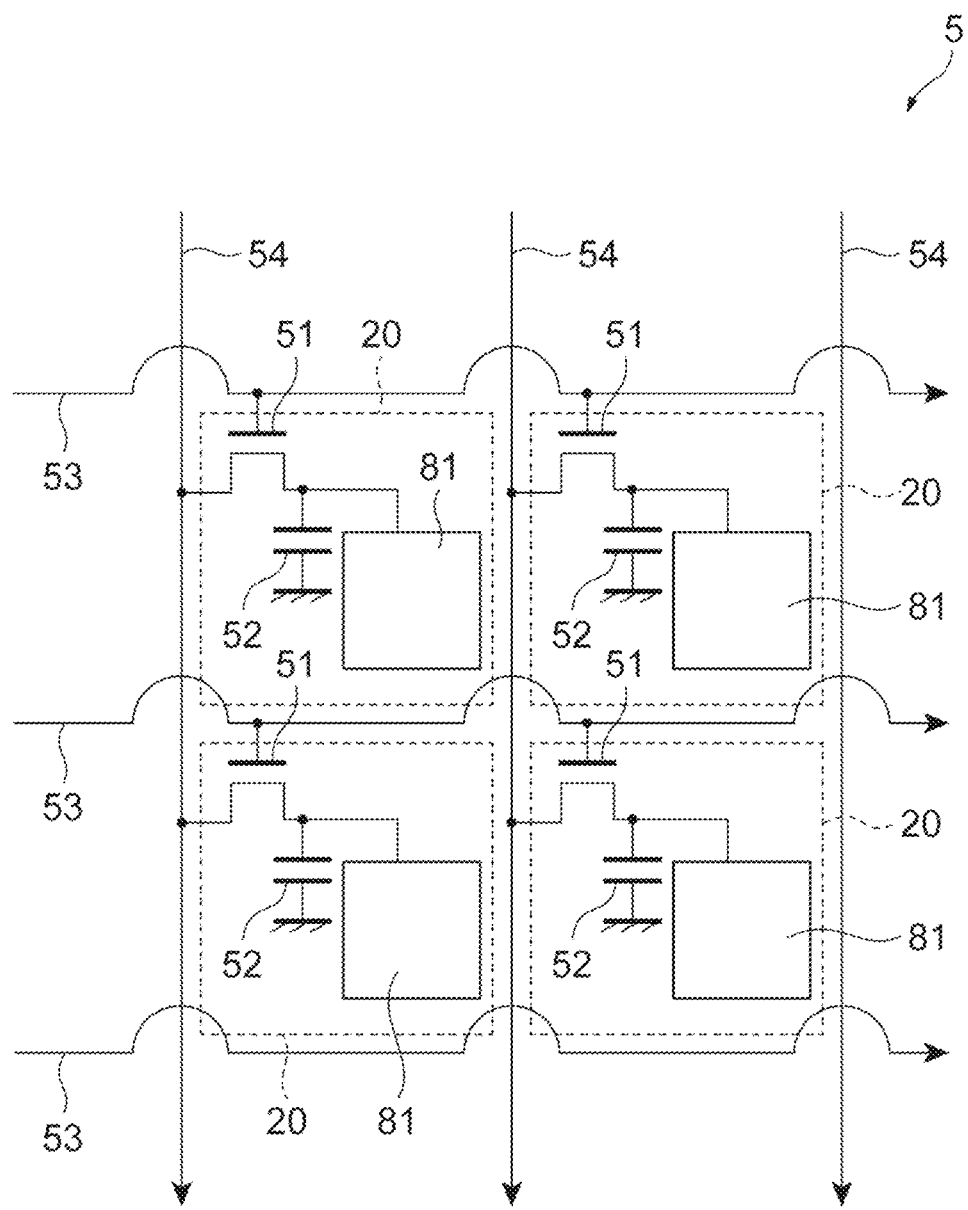
FIG. 20 is a view showing a circuit configuration in each unit region 20.

FIG. 20 is a view showing the circuit configuration in each unit region 20. As shown in FIG. 20, the drive circuit 5 further has M gate drive wirings 53 and N voltage supply wirings 54. The M gate drive wirings 53 each extend along the row direction (i.e., the X-axis direction) and are each arranged along the column direction (i.e., the Y-axis direction). The N voltage supply wirings 54 each extend along the column direction (i.e., the Y-axis direction) and are each arranged in the row direction (i.e., the X-axis direction). The gate drive wiring 53 of the m-th row (m=1, 2, . . . , M) is electrically connected with a control terminal (gate) of the transistor 51 provided for each unit region 20 located in the m-th row. The voltage supply wiring 54 of the n-th column (n=1, 2, . . . , N) is electrically connected with one current terminal (e.g., source) of the transistor 51 provided for each unit region 20 located in the n-th column. The other current terminal (e.g., drain) of the transistor 51 is electrically connected with the partial metal film 81 of the unit region 20 via the wiring in the unit region 20.

The drive circuit 5 of the present embodiment further has a plurality of capacitors 52 provided for each unit region 20. The capacitor 52 is an example of a voltage holding portion in the present embodiment, and holds, for each unit region 20, a voltage applied to the partial metal film 81 of the unit region 20. It is to be noted that as the voltage holding portion, various configurations capable of holding a voltage other than the capacitor can be applied. The capacitor 52 is a parallel plate capacitor formed inside the drive circuit 5, for example. One electrode of the capacitor 52 is connected to the partial metal film 81, and the other electrode is connected to a constant potential region (e.g., reference potential region). It is to be noted that as will be described later, the partial metal film 81 may also serve as one electrode of the capacitor 52.

FIGS. 21A to 21D are views for explaining the operation of the drive circuit 5 in the unit region 20 of an m-th row and an n-th column. In FIGS. 21A to 21D, portions having significant voltage values are indicated by broken lines. First, in the state shown in FIG. 21A, no voltage is applied to any of the gate drive wiring 53 in the m-th row and the voltage supply wiring 54 in the n-th column, and the transistor 51 is in a non-conductive state. Next, as shown in FIG. 21B, when a predetermined gate voltage Vg is applied to the gate drive wiring 53 of the m-th row, the transistor 51 is brought into a conductive state. At this time, the voltage supply wiring 54 of the n-th column and the partial metal film 81 are connected to each other via the transistor 51. Subsequently, as shown in FIG. 21C, a drive voltage Vd is applied to the voltage supply wiring 54 of the n-th column. The voltage value of the drive voltage Vd is independently set for each unit region 20 on the basis of a desired phase modulation pattern to be set on the metasurface 3C. Thus, the drive voltage Vd is applied to the partial metal film 81 via the transistor 51, and at the same time, the drive voltage Vd is held by the capacitor 52. Thereafter, as shown in FIG. 21D, the gate voltage Vg is not applied from the gate drive wiring 53 of the m-th row, and the supply of the drive voltage Vd from the voltage supply wiring 54 of the n-th column is stopped. At this time, the transistor 51 is brought into a non-conductive state again, but the voltage at the partial metal film 81 is held to the drive voltage Vd by the capacitor 52. Such operation is sequentially performed for all the unit regions 20, and the drive circuit 5 individually controls the drive voltages Vd of the plurality of partial metal films 81. Thus, a desired phase modulation pattern is set on the metasurface 3C, and the phase of the laser light L1 is modulated for each unit region 20.

Figure 22:
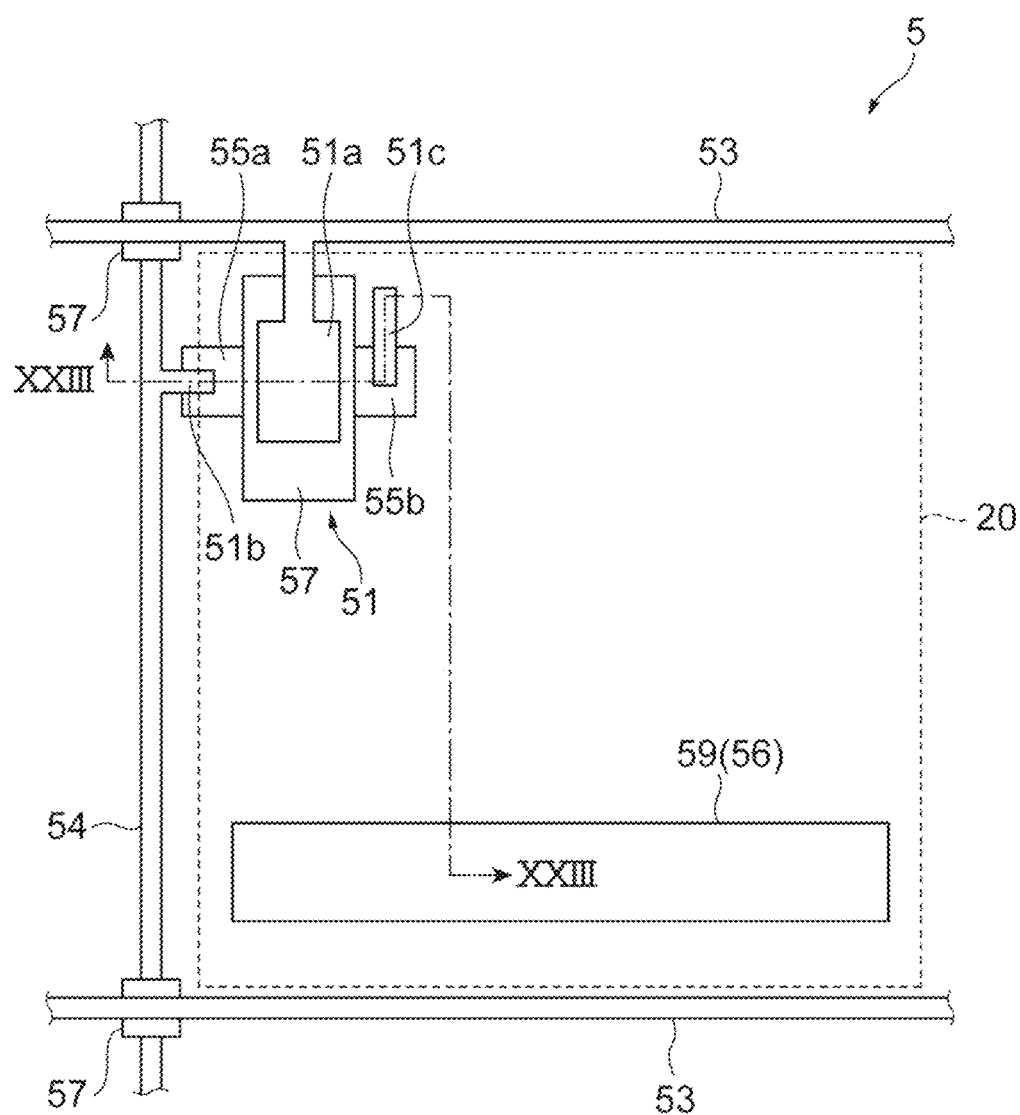
FIG. 22 is a plan view showing a structure of the drive circuit 5 in each unit region 20.
Figure 23:
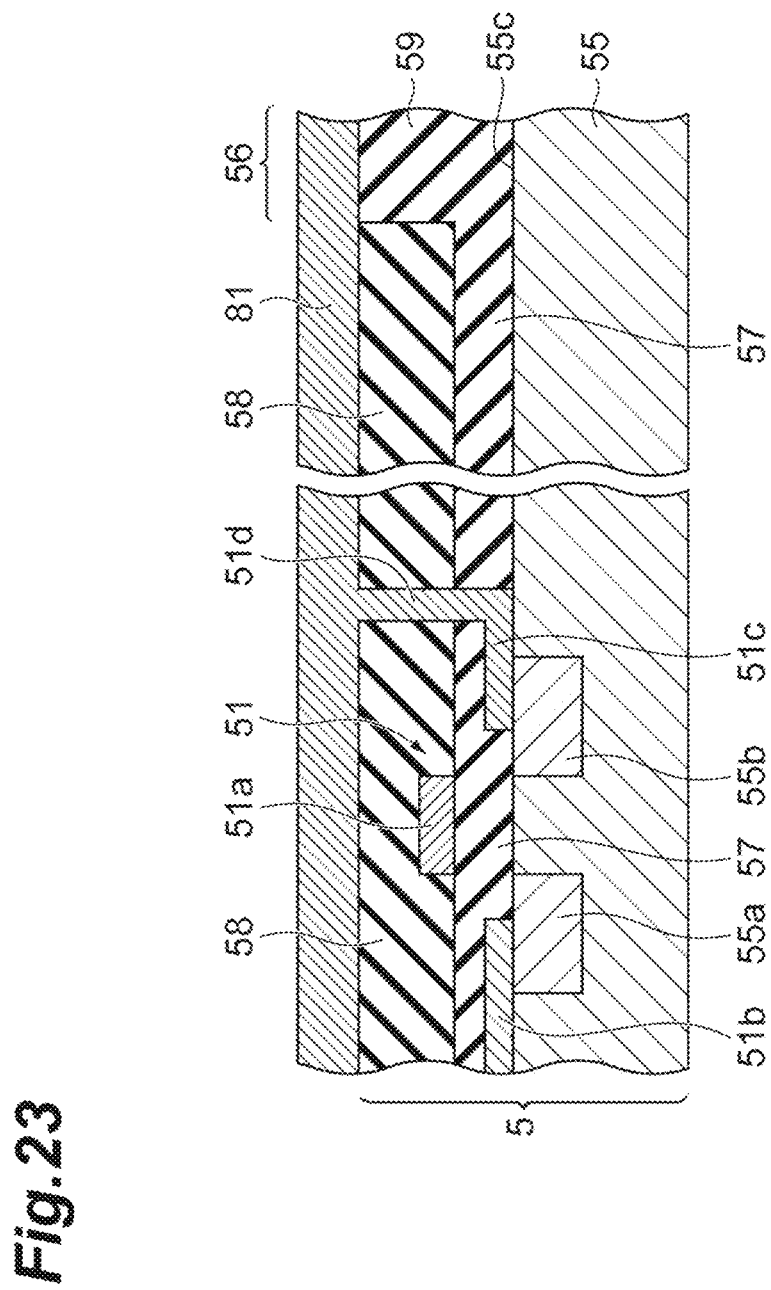
FIG. 23 is a cross-sectional view taken along a line XXIII-XXIII of FIG. 22, showing a cross-sectional structure of the drive circuit 5 in each unit region 20.

FIG. 22 is a plan view showing the structure of the drive circuit 5 in each unit region 20. FIG. 23 is a cross-sectional view taken along the line XXIII-XXIII of FIG. 22, showing the cross-sectional structure of the drive circuit 5 in each unit region 20. As shown in FIGS. 22 and 23, the drive circuit 5 has a semiconductor layer 55 of a first conductivity type (e.g., p type) and insulation layers 57 and 58 provided on the semiconductor layer 55. The semiconductor layer 55 may be a semiconductor substrate itself or may be a semiconductor film (a single crystal film, a polycrystalline film, or an amorphous film) formed on a dissimilar substrate. A surface 55c of the semiconductor layer 55 (i.e., the main surface of the semiconductor substrate or the main surface of the substrate-like member composed of a dissimilar substrate and a semiconductor film) is provided with the transistor 51. When the semiconductor layer 55 is a semiconductor film formed on a dissimilar substrate, the transistor 51 is called a thin film transistor. The semiconductor substrate constituting the semiconductor layer 55, or, the substrate-like member constituting the semiconductor layer 55 and composed of the dissimilar substrate and the semiconductor film are integrated with the light transmissive layer 9B while causing the surface 55c and the back surface 9d of the light transmissive layer 9B (see FIG. 2) to face each other.

As an example, the semiconductor layer 55 is mainly made of Si doped with an impurity of the first conductivity type (e.g., p type). In the semiconductor layer 55, semiconductor regions 55a and 55b of a second conductivity type (e.g., n type) are formed. The semiconductor regions 55a and 55b are mainly made of Si doped with an impurity of the second conductivity type. The semiconductor regions 55a and 55b are arranged with an interval from each other and exposed on the surface 55c of the semiconductor layer 55. The semiconductor region 55a is in ohmic contact with a source electrode 51b of the transistor 51 provided on the surface 55c. The semiconductor region 55b is in ohmic contact with a drain electrode 51c of the transistor 51 provided on the surface 55c. The source electrode 51b and the drain electrode 51c are arranged side by side with an interval on the surface 55c.

A region on the surface 55c except the source electrode 51b and the drain electrode 51c is covered with the insulation layer 57. It is to be noted that in FIG. 22, only necessary portions of the insulation layer 57 are shown for easy understanding. The insulation layer 57 mainly contains an insulating silicon compound such as $SiO_2$. A gate electrode 51a of the transistor 51 is provided on the insulation layer 57. The gate electrode 51a faces, across the insulation layer 57, a region of the semiconductor layer 55 located between the semiconductor region 55a and the semiconductor region 55b. The gate electrode 51a is covered with the insulation layer 58 provided on the insulation layer 57. As shown in FIG. 23, the insulation layer 58 is a protective film that protects the entire drive circuit 5. The insulation layer 58 mainly contains $SiO_2$, for example. The partial metal film 81 of the unit region 20 is provided on the insulation layer 58.

As shown in FIG. 22, the source electrode 51b is connected to the voltage supply wiring 54 provided on the surface 55c. The gate electrode 51a is connected to the gate drive wiring 53 via a wiring provided on the insulation layer 57. As shown in FIG. 23, the drain electrode 51c is connected to the partial metal film 81 via a wiring 51d penetrating the insulation layers 57 and 58.

The capacitor 52 is composed of a part of the partial metal film 81, the semiconductor layer 55 immediately below the partial metal film 81, and a dielectric layer 59 interposed therebetween. It is to be noted that the semiconductor layer 55 is set to a constant potential (e.g., reference potential). In this case, the partial metal film 81 serves also as one electrode of the capacitor 52, and the semiconductor layer 55 serves also as the other electrode of the capacitor 52. The dielectric layer 59 is provided so as to embed the openings formed in the insulation layers 57 and 58. The lower surface of the dielectric layer 59 is in contact with the semiconductor layer 55, and the upper surface of the dielectric layer 59 is in contact with the partial metal film 81. The dielectric layer 59 mainly contains $SiO_2$, for example.

FIGS. 24A to 24E are cross-sectional views showing each step in one example of the fabrication method of the metasurface 3C. It is to be noted that while FIGS. 24A to 24E show one unit region 20 as a representative, the other unit regions 20 are also fabricated by the same method in parallel with the unit region 20. First, as shown in FIG. 24A, the drive circuit 5 is prepared as the first step. The drive circuit 5 is fabricated by a known method of forming a wiring layer on a substrate having a transistor. At this time, the metal film 8B including the plurality of partial metal films 81 is formed on the wiring layer on the drive circuit 5. Next, as shown in FIG. 24B, the transparent conductive layer 92 is formed on the metal film 8B by a physical vapor deposition method such as a sputtering method. Specifically, in a state where a target made of a material of the transparent conductive layer 92 is installed in a vacuum chamber, an inert gas ionized by a high voltage is made to collide with the target. Thus, the transparent conductive layer 92 is formed by scattering the material of the transparent conductive layer 92. When the transparent conductive layer 92 is made of ITO, the material of the dielectric layer 93 is at least any one of $SiO_2$, $Al_2O_3$, and $HfO_2$, for example. Subsequently, as shown in FIG. 24C, the dielectric layer 93 is formed on the transparent conductive layer 92 using, for example, an atomic layer deposition (ALD) method. Specifically, for each element constituting the dielectric layer 93, source gas is fed into and purged from a film formation apparatus (i.e., formation of a film having a thickness of several angstroms, for example, is repeatedly performed). When the dielectric layer 93 is made of $SiO_2$, the raw material of ALD is, for example, TDMAS and oxygen plasma. Subsequently, as shown in FIG. 24D, the metal film 6C including the plurality of partial metal films 63 is formed on the dielectric layer 93 by using a lift-off method, for example. Specifically, first, a resist is applied onto the dielectric layer 93, and a plurality of openings corresponding to the plurality of partial metal films 63 are formed. Next, a metal film (e.g., an Au film) is vapor-deposited on the entire surface of the dielectric layer 93 including the plurality of openings of the resist. Then, by removing the resist, the metal film deposited on the resist is removed. Through the above steps, the metasurface 3C of the present embodiment is fabricated.

Subsequently, as shown in FIG. 24E, the dielectric layer 93 and the light guide layer 31 covering the metal film 6C are formed on the entire surface of the dielectric layer 93 by a chemical vapor deposition (CVD) method, for example. Specifically, after the temperature and pressure in the film formation apparatus are adjusted, the source gas is fed into the film formation apparatus for each element constituting the light guide layer 31. When the light guide layer 31 is made of $SiO_2$, the raw material of the CVD is $SiH_4$, for example.

In the end, the surface (surface 31a) of the light guide layer 31 is planarized by chemical mechanical polishing (CMP). After that, the surface 31a of the light guide layer 31 is bonded to the second light output surface 2b of the surface emitting laser element 2A separately prepared, thereby completing the light-emitting device 1B. Examples of the bonding method at this time include diffusion bonding and ambient temperature bonding.

The effects obtained by the light-emitting device 1B of the present embodiment described above will be described. In the light-emitting device 1B of the present embodiment, similarly to the first embodiment, the light source (the surface emitting laser element 2A) and the metasurface 3C are integrated via the light guide layer 31. Therefore, an optical system between the reflective metasurface 3C and the light source (surface emitting laser element 2A) is unnecessary. Hence, according to the present embodiment, the optical system can be simplified.

The metasurface 3C includes an MIM structure in which the metal film 8B as a light reflection film, the light transmissive layer 9B including the transparent conductive layer 92 and the dielectric layer 93, and the metal film 6C composed of the plurality of partial metal films 63 having the finite width W5 are laminated in this order. In this case, as shown in FIGS. 18, 19A, and 19B, the light transmissive layer 9B includes the pair of portions 9f and 9g. The pair of portions 9f and 9g are provided at positions sandwiching the partial metal film 63 when the unit region 20 is viewed along the lamination direction (Z-axis direction), and are exposed from the metal film 6C. The laser light L1 inputted from the outside of the metasurface 3C to one part 9f (or 9g) of the light transmissive layer 9B is reflected on the metal film 8B, and outputted from the other part 9g (or 9f) of the light transmissive layer 9B to the outside of the metasurface 3C. At this time, when the drive voltage Vd is applied between the partial metal film 63 and the metal film 8B, induced currents in opposite orientations to each other called a gap surface plasmon mode are generated in both the partial metal film 63 and the metal film 8B (strong magnetic resonance (plasmon resonance) is generated in the light transmissive layer 9B). Due to this magnetic resonance, the phase of the laser light L1 passing through between the partial metal film 63 and the metal film 8B is modulated. It is to be noted than the relationship of the phase modulation amount φ of the laser light L1 by magnetic resonance, the width w (=W5) of the partial metal film 63, the wavelength $\lambda_0$ of the laser light L1, and the effective refractive index $N_{gsp}$ of the light transmissive layer 9B is expressed by the above Expression (1).

Figure 25:
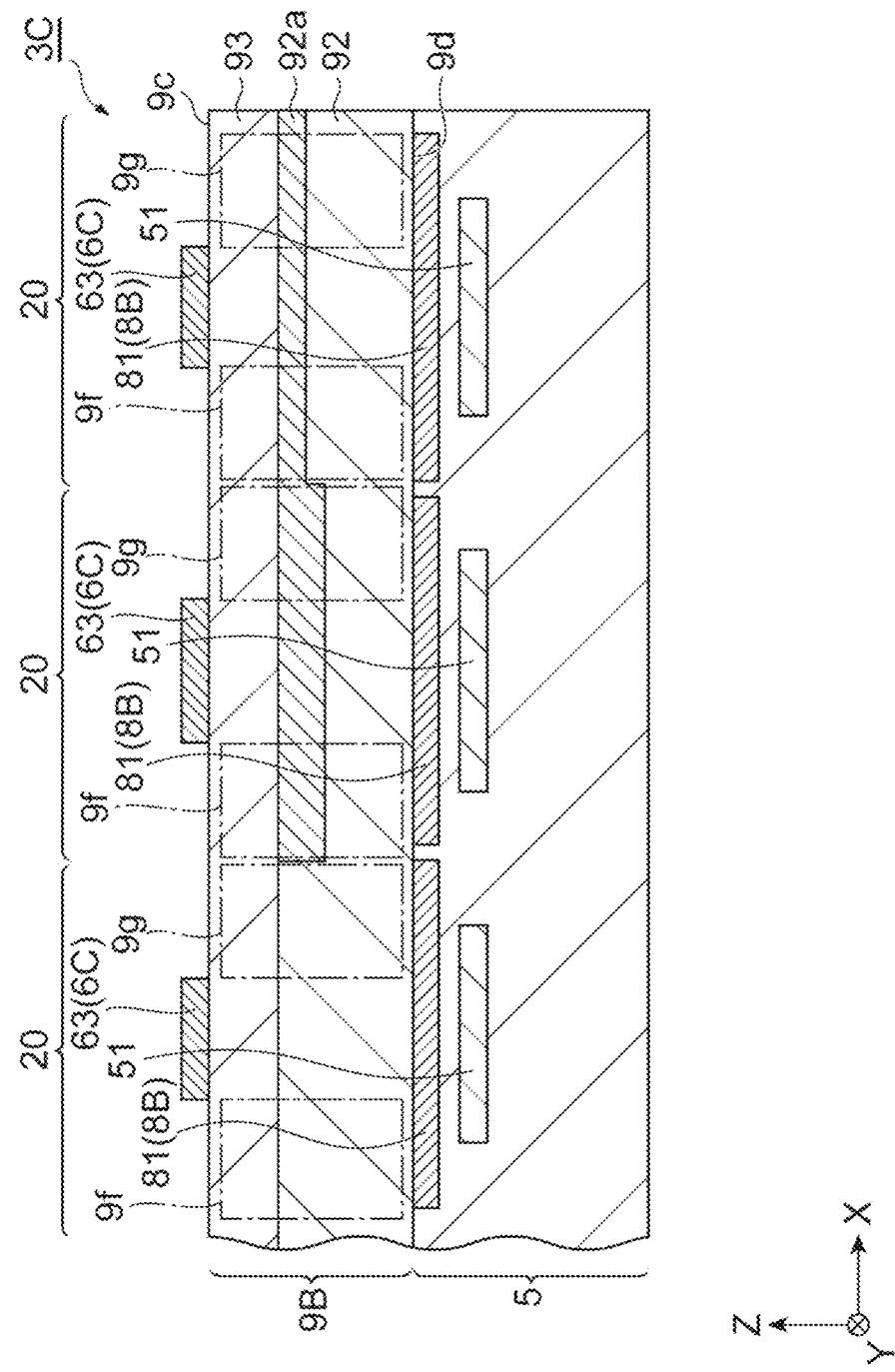
FIG. 25 is a view showing a state in which a metallized layer 92a is formed on a transparent conductive layer 92 by an electric field between a partial metal film 63 and the metal film 8B.

As is clear from Expression (1) described above, the phase modulation amount φ depends on the effective refractive index $N_{gsp}$ of the light transmissive layer 9B. Then, the effective refractive index $N_{gsp}$ can be controlled by changing the drive voltage Vd applied between the partial metal film 63 and the metal film 8B. The reason is as follows. When the drive voltage Vd is applied between the partial metal film 63 and the metal film 8B, as shown in FIG. 25, the electric field between the partial metal film 63 and the metal film 8B increases the electron density near the interface of the transparent conductive layer 92 with the dielectric layer 93. As a result, a portion of the transparent conductive layer 92 near the interface changes to a metallized layer 92a. Since this layer 92a reacts with the laser light L1, the effective refractive index $N_{gsp}$ of the light transmissive layer 9B changes.

Furthermore, in the metasurface 3C of the present embodiment, the metal film 8B includes the plurality of partial metal films 81 provided for each unit region 20 in a state of being separated from each other, and the drive circuit 5 individually controls the drive voltages Vd of the plurality of partial metal films 81. Due to this, as shown in FIG. 25, the thickness of the metallized layer 92a in the transparent conductive layer 92 can be controlled independently for each unit region 20 (phase modulation independent for each unit region 20 becomes possible). That is, according to the metasurface 3C of the present embodiment, dynamic phase modulation becomes possible for each unit region 20 constituting a two-dimensional array.

Also in the present embodiment, the metasurface 3C of the present embodiment can be configured to be extremely thin as compared with the diffractive optical element (see FIGS. 14A and 14B). Therefore, the present embodiment can contribute to miniaturization of the light-emitting device 1B including the metasurface 3C.

As in the present embodiment, the drive circuit 5 may have a plurality of voltage holding portions (capacitors 52) that hold voltage for each partial metal film 81. This allows the potential to be sequentially set for each partial metal film 81, and hence the configuration of the drive circuit 5 can be simplified. In this case, the plurality of voltage holding portions may be capacitors 52 having the metal film 8B as one electrode. This allows the voltage holding portion to be realized by a simple configuration.

As in the present embodiment, the dielectric layer 93 may be located on the main surface 9c side with respect to the transparent conductive layer 92. This causes an accumulated layer reflecting the shape of the metal structure provided on the upper side to be formed, and hence it is expected that the electron concentration increases.

As in the present embodiment, the drive circuit 5 includes the plurality of transistors 51 provided for each unit region 20. The metasurface 3C includes the substrate having the plurality of transistors 51 on its main surface, and the substrate may be integrated with the light transmissive layer 9B while the main surface and the back surface 9d thereof face each other. This makes it possible to provide a small-sized reflective dynamic metasurface with an incorporated drive circuit.

As in the present embodiment, the drive circuit 5 may set the metal film 6C to the reference potential, and the metal film 6C may extend over two or more unit regions 20 arranged side by side in a direction intersecting with the array direction of the pair of portions 9f and 9g. This makes it possible to easily set the metal film 6C to the reference potential while suppressing obstruction of the paths of the laser light L1 and the output light by the wiring for providing the metal film 6C with the reference potential. Therefore, it becomes possible for the simple structure to suppress reduction in output efficiency of the metasurface 3C.

As in the present embodiment, the dielectric layer 93 may include at least any one of $Al_2O_3$, $SiO_2$, and $MgF_2$. This enables the dielectric layer 93 described above to be preferably realized.

As in the present embodiment, the transparent conductive layer 92 may include at least one of $In_2O_3$ and $Zn_2O_3$ whose resistance is reduced by a dopant. This allows the operation of the transparent conductive layer 92 described above to be preferably achieved.

Second Modified Example

In place of the plurality of unit regions 20 shown in FIG. 8, a plurality (N) of unit regions (pixels) 21 shown in FIG. 15 may be formed on the main surface 3a of the metasurface 3C according to the second modified example. The plurality of unit regions 21 constitute a one-dimensional array along the X-axis direction. The planar shape of each unit region 21 is rectangular (e.g., a rectangular shape whose longitudinal direction is the Y-axis direction intersecting with the array direction). A width W4 of each unit region 21 along the X-axis direction is the same as the length W1 of one side of the unit region 20 of the second embodiment. The cross-sectional structure of the metasurface of the present modified example is the same as that of the second embodiment (see FIG. 18).

FIG. 26A is a view showing the planar shape of the metal film 6C of the present modified example. The metal film 6C is provided on the main surface 9c of the light transmissive layer 9B and, similarly to the second embodiment, includes the plurality of partial metal films 63. The plurality of partial metal films 63 are arrayed along the X-axis direction in a state of being separated from each other. The planar shape of each partial metal film 63 is rectangular (e.g., a rectangular shape whose longitudinal direction is the Y-axis direction). However, in the present embodiment, since the unit region 21 is also a rectangular shape whose longitudinal direction is the Y-axis direction, each partial metal film 63 is provided for each unit region 21 and is located in each unit region 21. The width W5 of the partial metal film 63 along the X-axis direction is the same as that of the second embodiment. Also in the present modified example, the width W5 of the partial metal film 63 is smaller than the width W4 of the unit region 21. Then, the partial metal film 63 is arranged at the substantially center portion of the unit region 21 with respect to the X-axis direction. Therefore, the light transmissive layer 9B includes the pair of portions 9f and 9g in each unit region 21.

FIG. 26B is a view showing the planar shape of the metal film 8C. The metasurface of the present modified example includes the metal film 8C in place of the metal film 8B of the second embodiment. The metal film 8C is the second metal film in the present modified example. The configuration of the metal film 8C is the same as that of the metal film 8B of the second embodiment except the following points. That is, the metal film 8C of the present modified example includes the plurality of partial metal films 82. The plurality of partial metal films 82 are arrayed along the X-axis direction in a state of being separated from each other. The planar shape of each partial metal film 82 is rectangular (e.g., a rectangular shape whose longitudinal direction is the Y-axis direction). Each partial metal film 82 is provided for each unit region 21 and is located in each unit region 21. It is to be noted that a width W7 of each partial metal film 82 along the X-axis direction (short direction) is the same as the length W6 of one side of the partial metal film 81 of the second embodiment.

Figure 27:
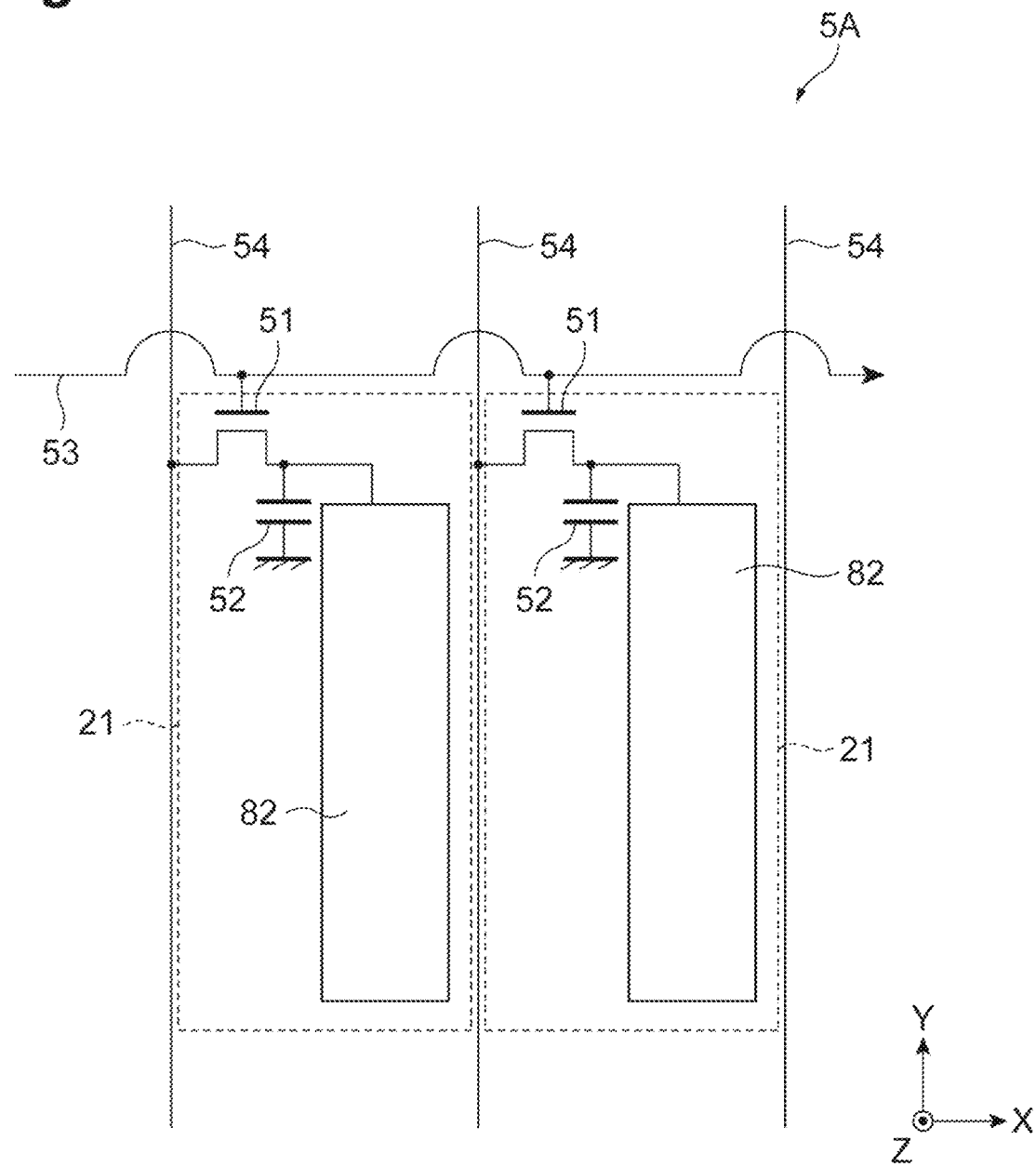
FIG. 27 is a view showing a configuration of a drive circuit 5A.

FIG. 27 is a view showing the configuration of the drive circuit 5A. The metasurface of the present modified example includes a drive circuit 5A in place of the drive circuit 5 of the second embodiment. The drive circuit 5A of the present modified example has one gate drive wiring 53 and N voltage supply wirings 54. The gate drive wiring 53 extends along the array direction (X-axis direction) of the unit region 21. The N voltage supply wirings 54 each extend along a direction (Y-axis direction) intersecting with the array direction of the unit regions 21, and are each arrayed along the X-axis direction. The gate drive wiring 53 is electrically connected with a control terminal (gate) of the transistor 51 provided for each unit region 21. The voltage supply wiring 54 of the n-th column (n=1, 2, . . . , N) is electrically connected with one current terminal (e.g., source) of the transistor 51 provided in the unit region 21 located in the n-th column. The other current terminal (e.g., drain) of the transistor 51 is electrically connected with the partial metal film 82 of the unit region 21 via the wiring in the unit region 21.

The drive circuit 5A further has the plurality of capacitors 52 provided for each unit region 21. The capacitor 52 is an example of a voltage holding portion in the present modified example, and holds, for each unit region 21, a voltage applied to the partial metal film 82 of the unit region 21. It is to be noted that the specific configuration of the capacitor 52 is the same as that of the above-described embodiment.

As in the present modified example, the plurality of unit regions may constitute a one-dimensional array. Even in such case, the same effects as those of the second embodiment can be achieved.

Third Modified Example

Figure 28:
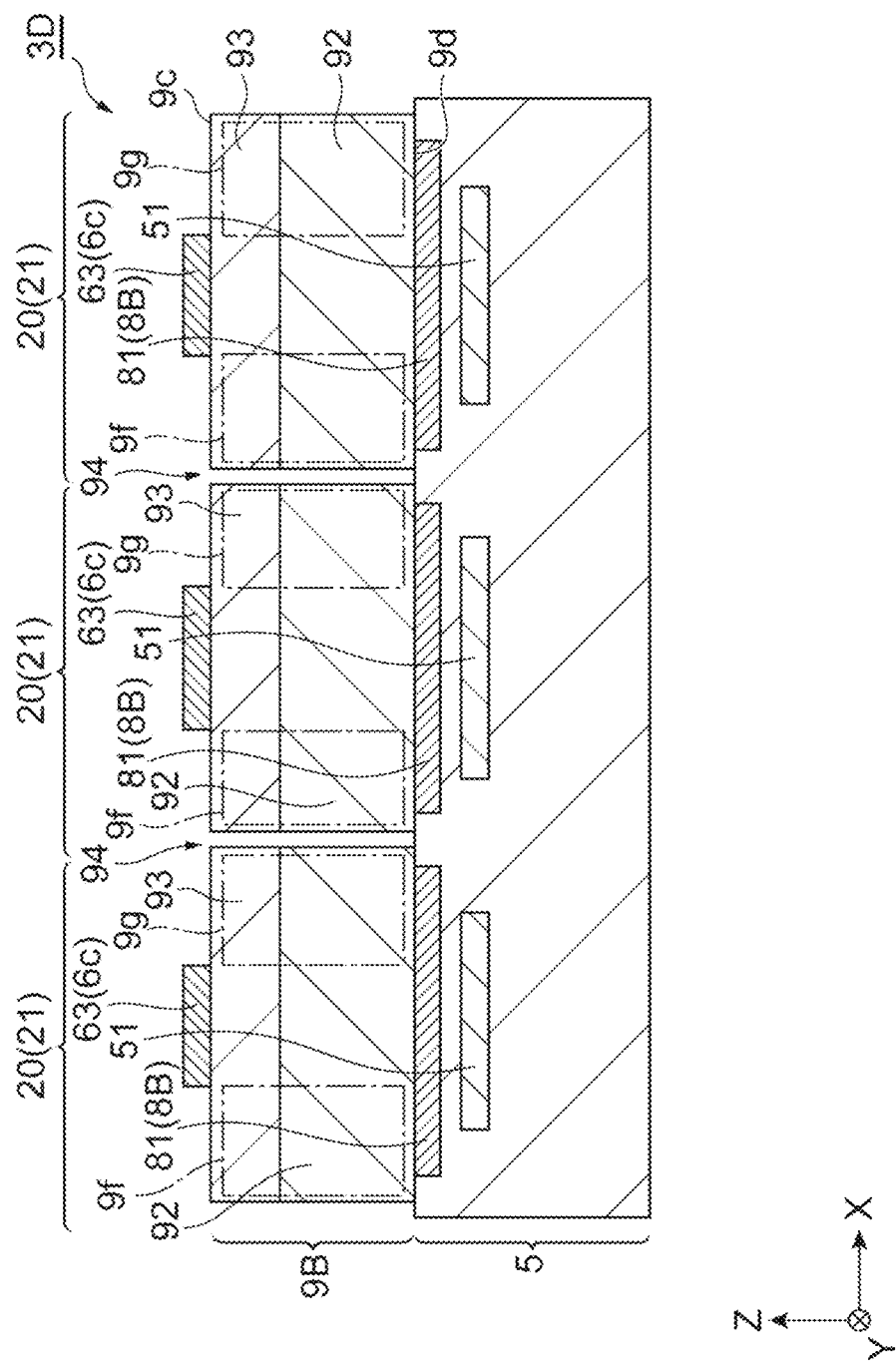
FIG. 28 is a view showing a cross-sectional structure of a metasurface 3D according to one modified example of the second embodiment.

FIG. 28 is a view showing the cross-sectional structure of the metasurface 3D according to a modified example of the second embodiment. In the present modified example, a void 94 is provided between the light transmissive layers 9B of the unit regions 20 (or 21) adjacent to each other, and the light transmissive layers 9B of the unit region 20 (or 21) are spatially separated from each other. The void 94 is provided for electrically separating the transparent conductive layers 92 in the unit regions 20 (or 21) adjacent to each other. Thus, when the drive voltage Vd is applied between the partial metal film 81 (82) and the metal film 6C in a certain unit region 20 (or 21), it is possible to prevent electrons from leaking to the transparent conductive layer 92 in the adjacent unit region 20 (or 21). Therefore, it is possible to reduce crosstalk between the unit regions 20 (or 21) adjacent to each other. It is to be noted that when the void 94 is formed, it is preferable that a mask having an opening corresponding to the void 94 is formed on the light transmissive layer 9B, and the light transmissive layer 9B is etched through the mask.

Figure 29:
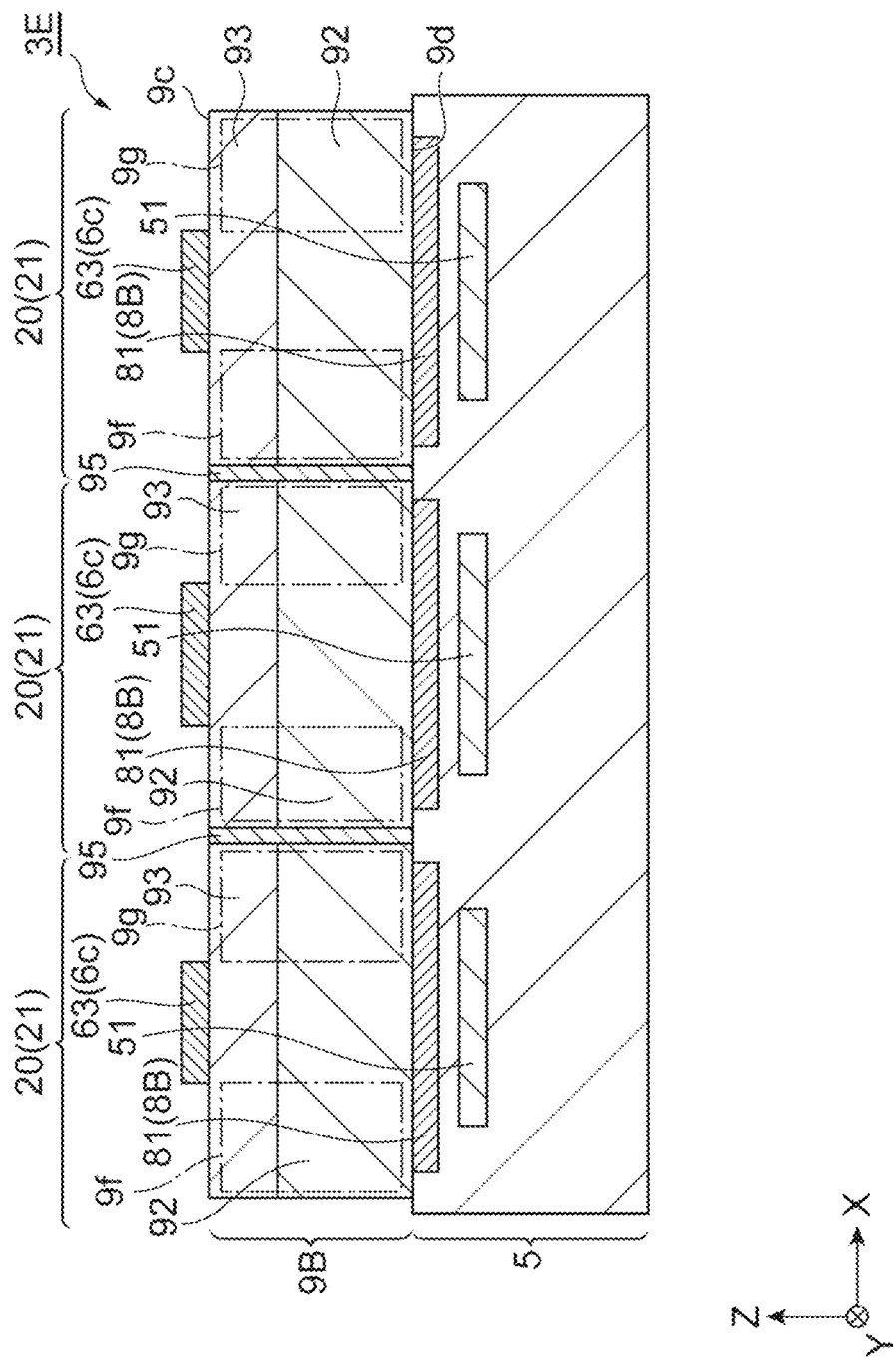
FIG. 29 is a view showing a cross-sectional structure of a metasurface 3E according to a modified example.

FIG. 29 is a view showing the cross-sectional structure of the metasurface 3E according to a modified example. In this example, in place of the above-described void 94, an insulation portion 95 is provided between the light transmissive layers 9B in the unit regions 20 (or 21) adjacent to each other. The insulation portion 95 mainly contains an insulating material such as $SiO_2$. Even with such configuration, it is possible to effectively reduce crosstalk between the unit regions 20 (or 21) adjacent to each other. It is to be noted that after the void 94 described above is formed on the light transmissive layer 9B, the insulation portion 95 is preferably formed by embedding the void 94 with an insulating material.

Third Embodiment

In the above-described first and second embodiments, the explanations have been made regarding the case where the light-emitting device 1A includes the surface emitting laser element 2A, which is a PCSEL. However, the light-emitting device can include various surface emitting laser elements other than the PCSEL. For example, a surface emitting laser element that outputs any optical image by controlling a phase spectrum and an intensity spectrum of light outputted from a plurality of light-emitting points constituting a two-dimensional array has been studied. Such surface emitting laser element is called static-integrable phase modulating (S-iPM) laser, and outputs a two-dimensional optical image of any shape including a normal direction of the main surface of the semiconductor substrate and a tilt direction intersecting with the normal direction.

Figure 30:
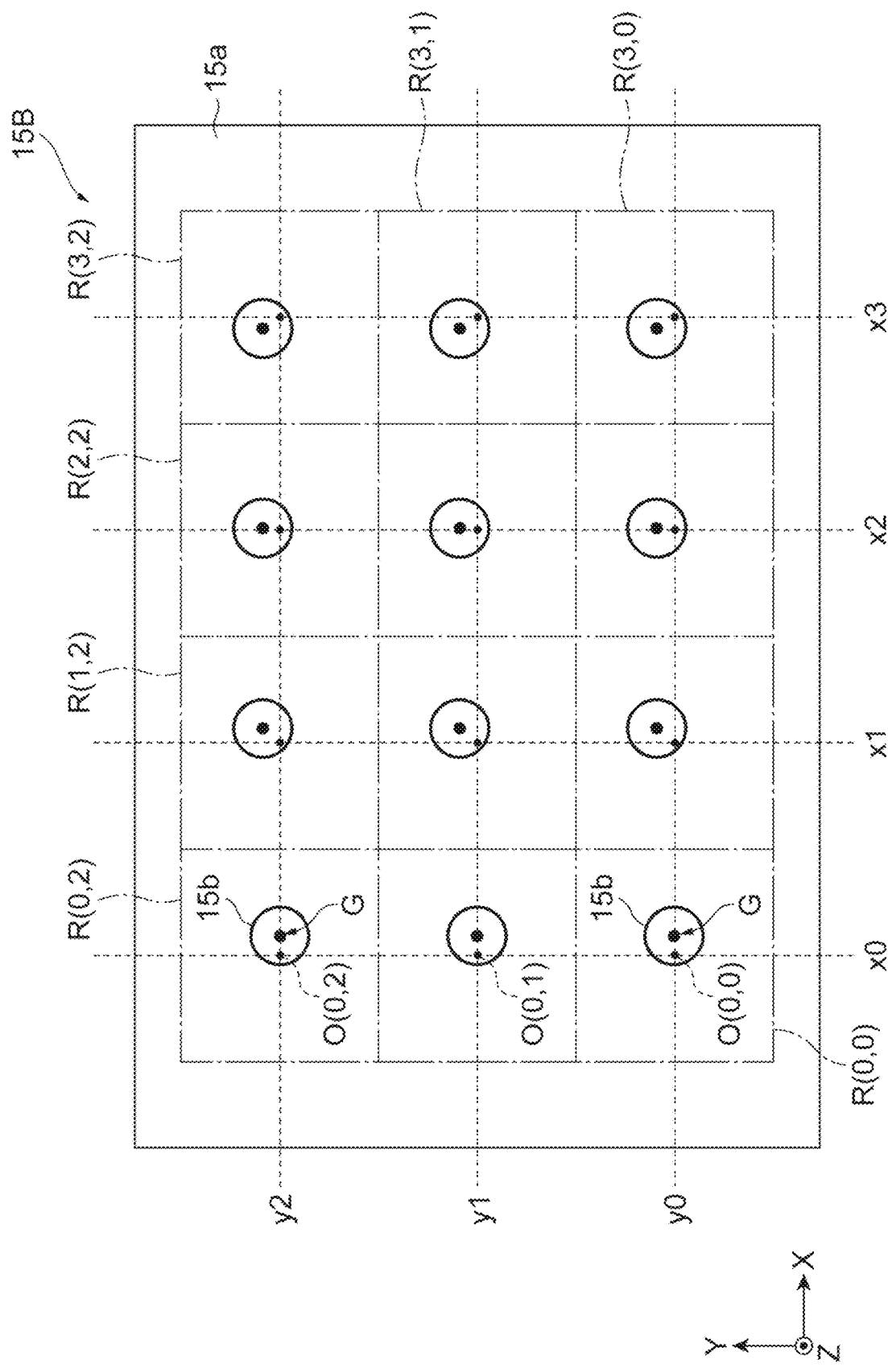
FIG. 30 is a plan view of a phase modulation layer 15B included in S-iPM laser.

FIG. 30 is a plan view of a phase modulation layer 15B included in S-iPM laser. The surface emitting laser element 2A of each embodiment described above may have the phase modulation layer 15B shown in FIG. 30 in place of the photonic crystal layer 15A (see FIG. 4). Thus, the surface emitting laser element 2A can be S-iPM laser. It is to be noted that the surface emitting laser element 2A has the same configuration as that of the first embodiment except the phase modulation layer 15B, and hence detailed description thereof will be omitted.

FIG. 30 is a plan view of the phase modulation layer 15B, and is view for explaining an example of an arrangement pattern (rotation method) of a modified refractive index region. The phase modulation layer 15B includes the base layer 15a made of the first refractive index medium, and the modified refractive index region 15b made of the second refractive index medium having a different refractive index from that of the first refractive index medium. Here, an imaginary square lattice is set on a design plane (reference plane) of the phase modulation layer 15B coincident with the X-Y plane. It is assumed that one side of the square lattice is parallel with the X-axis and the other side is parallel with the Y-axis. At this time, a square-shaped unit constituent region R centered on a lattice point O of the square lattice can be two-dimensionally set over a plurality of columns along the X-axis and a plurality of rows along the Y-axis. Each of the plurality of modified refractive index regions 15b is provided in each unit constituent region R on a one-by-one basis. The planar shape of the modified refractive index region 15b is circular, for example. In each unit constituent region R, the center of gravity G of the modified refractive index region 15b is arranged away from the lattice point (center of the unit constituent region R) O closest thereto.

Specifically, in FIG. 30, broken lines indicated by x0 to x3 indicate center positions in the unit constituent region R in the X-axis direction, and broken lines indicated by y0 to y2 indicate center positions in the unit constituent region R in the Y-axis direction. Therefore, the intersections of the broken lines x0 to x3 and the broken lines y0 to y2 indicate the respective centers O (0, 0) to O (3, 2) of the unit constituent regions R (0, 0) to R (3, 2), that is, the lattice points. The lattice constant of this imaginary square lattice is a. It is to be noted that the lattice constant a is adjusted according to the emission wavelength.

The arrangement pattern of the modified refractive index region 15b is determined according to a target beam projection region and a target output beam pattern. That is, on the design plane of the phase modulation layer 15B defined on the X-Y plane, the direction in which the center of gravity G of each modified refractive index region 15b is shifted from each lattice point (intersection of the broken lines x0 to x3 with the broken lines y0 to y2) in the imaginary square lattice on the base layer 15a is determined in accordance with the phase obtained by inverse Fourier transform of the original pattern corresponding to the target beam projection region and the target output beam pattern, whereby the arrangement pattern is determined. Although a distance r (see FIG. 31) shifted from each lattice point is usually made identical over all phase modulation regions and all modified refractive index regions, the distance r in some phase modulation regions may have a value different from the distance r in other phase modulation regions, or the distance r in some modified refractive index regions may have a value different from the distance r in other modified refractive index regions. It is to be noted that FIG. 31 is a view for explaining an example of the arrangement pattern (rotation method) determined by a rotation method, and FIG. 31 shows the configuration of the unit constituent region R (x, y), and the distance r from the lattice point to the modified refractive index region 15b is represented by r (x, y).

Figure 31:
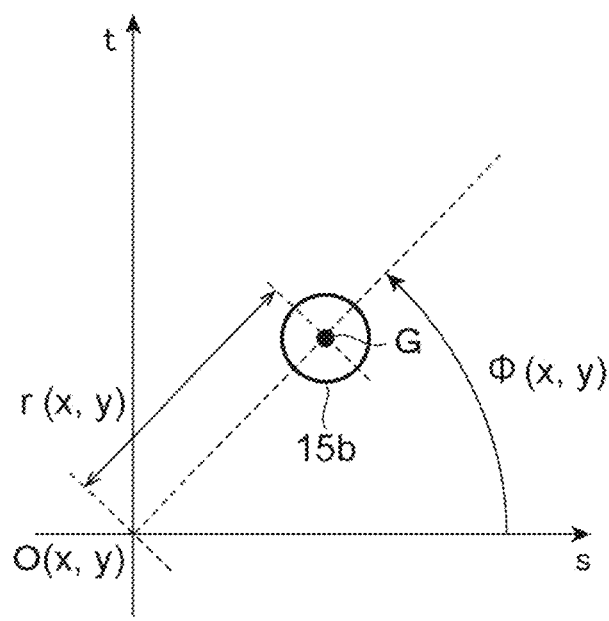
FIG. 31 is a view showing a positional relationship of a modified refractive index region in the phase modulation layer 15B.

As shown in FIG. 31, the unit constituent region R (x, y) constituting the square lattice are defined by an s-axis and a t-axis orthogonal to each other at the lattice point O (x, y).

It is to be noted that the s-axis is an axis parallel to the X-axis and corresponds to the broken lines x0 to x3 shown in FIG. 30. The t-axis is an axis parallel to the Y-axis and corresponds to broken lines y0 to y2 shown in FIG. 30. In an s-t plane defining the unit constituent region R (x, y) in this manner, the angle formed by the direction from the lattice point O (x, y) toward the center of gravity G and the s-axis is given by φ(x, y). When the rotation angle φ (x, y) is 0°, the direction of the vector from the lattice point O (x, y) to the center of gravity G coincides with the positive direction of the s-axis. The length (corresponds to the distance r) of the vector from the lattice point O (x, y) to the center of gravity G is given by r (x, y).

As shown in FIG. 30, in the phase modulation layer 15B, the rotation angle φ (x, y) about the lattice point O (x, y) of the center of gravity G of the modified refractive index region 15b is independently set for each unit constituent region R according to the target output beam pattern (optical image). The rotation angle φ (x, y) has a specific value in the unit constituent region R (x, y), but is not necessarily expressed by a specific function. That is, the rotation angle φ (x, y) is determined from the phase term of the complex amplitude obtained by converting the output beam pattern onto the wave number space, and performing a two-dimensional inverse discrete Fourier transform on a certain wave number range in the wave number space. It is to be noted that when the complex amplitude distribution (complex amplitude of each unit constituent region R) is obtained from the target output beam pattern, the reproducibility of the target output beam pattern is improved by applying a repetition algorithm such as the Gerchberg-Saxton (GS) method commonly used at the time of calculation of hologram generation.

In the present embodiment, the laser light outputted from the active layer 12 is inputted into the phase modulation layer 15B and forms a predetermined mode according to the lattice structure of the phase modulation layer 15B. The laser light L1 scattered and outputted in the phase modulation layer 15B is reflected on any of the metasurfaces 3A to 3E and outputted from the first light output surface 2a to the outside. At this time, the zero-order light is outputted to the normal direction of the main surface 10a. On the other hand, the +1 order light and −1 order light are outputted in any two-dimensional direction including the normal direction of the main surface 10a and a tilt direction intersecting with the normal direction.

Figure 32:
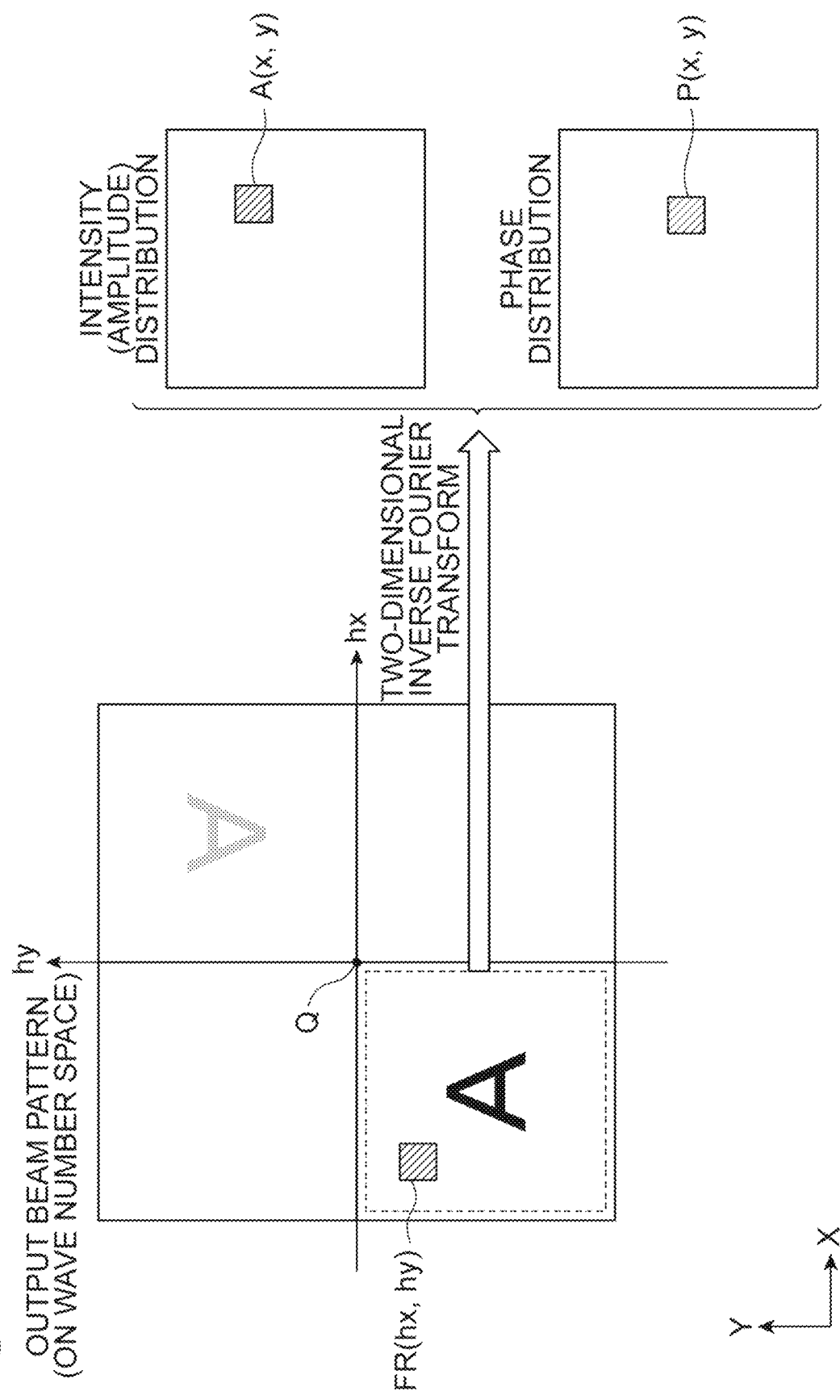
FIG. 32 is a view for explaining a relationship between an optical image obtained by forming an output beam pattern of a surface emitting laser element according to a third embodiment and a rotation angle distribution φ (x, y) on the phase modulation layer 15B.

FIG. 32 is a view for explaining the relationship between an output beam pattern (optical image) of the surface emitting laser element according to the present embodiment and the distribution of the rotation angle φ (x, y) on the phase modulation layer 15B. Specifically, a Kx-Ky plane obtained by converting the beam projection region (installation surface of a design optical image expressed by coordinates (x, y, z) in an XYZ orthogonal coordinate system), which is the projection range of the output beam pattern, onto the wave number space is considered. A Kx-axis and a Ky-axis defining the Kx-Ky plane are orthogonal to each other, and are each associated with an angle with respect to the normal direction of the light output surface when the output direction of the target output beam pattern is shifted from the normal direction (Z-axis direction) of the light output surface to the light output surface according to Expressions (2) to (6) described below in detail.

First, it is assumed that in the XYZ orthogonal coordinate system defined by the Z-axis coincident with the normal direction of the main surface of the semiconductor substrate and the X-Y plane coincident with one surface of the phase modulation layer including the plurality of modified refractive index regions and including the X-axis and the Y-axis orthogonal to each other, an imaginary square lattice composed of M1 (integer equal to or greater than 1)×N1 (integer equal to or greater than 1) unit constituent regions R each having a square shape is set on the X-Y plane. At this time, the arrangement pattern of the plurality of modified refractive index regions is defined so that in the unit constituent region R (x, y) on the X-Y plane specified by a coordinate component x (integer of from 0 to M1−1 inclusive) in the X-axis direction and a coordinate component y (integer of from 0 to N1−1) in the Y-axis direction, the center of gravity G of the modified refractive index region located in the unit constituent region R (x, y) is away by the distance r from the lattice point O (x, y) serving as the center of the unit constituent region R (x, y), and the vector from the lattice point O (x, y) towards the center of gravity G is directed in a specific direction.

Figure 37:
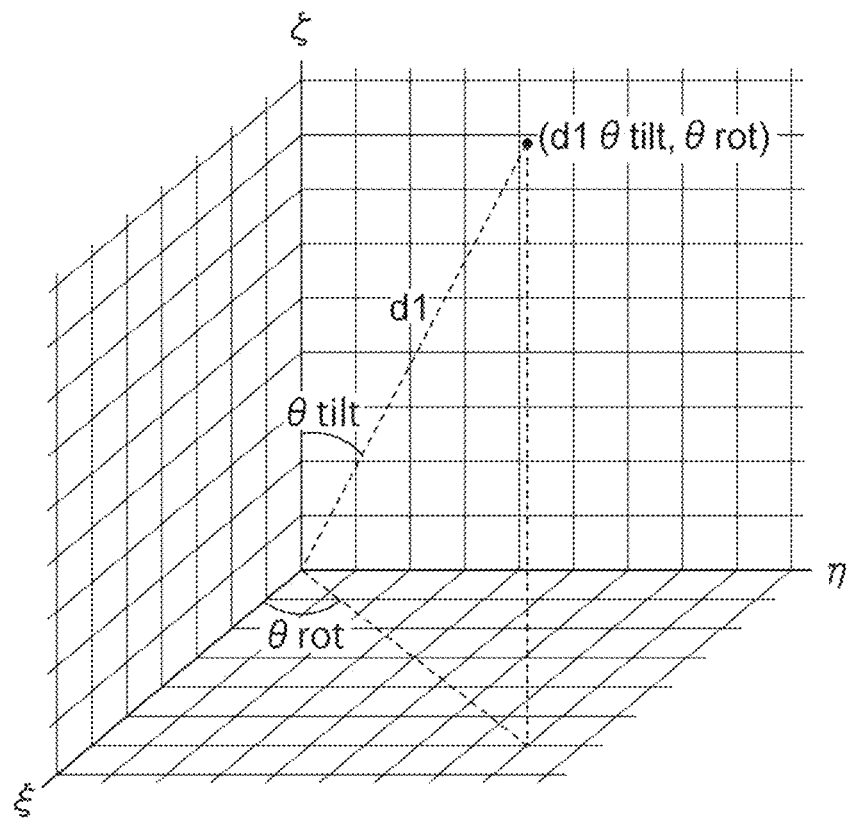
FIG. 37 is a view for explaining coordinate transformation from spherical coordinates to coordinates in an XYZ orthogonal coordinate system.

Furthermore, it is assumed that coordinates (ξ, η, ζ) in the XYZ orthogonal coordinate system satisfy the relationship shown by the following Expressions (2) to (4) with respect to spherical coordinates (d1, $\theta_{tilt}$, $\theta_{rot}$) defined by a length d1 of a moving radius, a tilt angle $\theta_{tilt}$ from the Z-axis, and a rotation angle $\theta_{rot}$ from the X-axis specified on the X-Y plane, as shown in FIG. 37. It is to be noted that FIG. 37 is a view for explaining coordinate transformation from the spherical coordinates (d1, $\theta_{tilt}$, $\theta_{rot}$) to the coordinates (ξ, η, ζ) in the XYZ orthogonal coordinate system, in which the coordinates (ξ, η, ζ) express a design optical image on a predetermined plane (target beam projection region) set in the XYZ orthogonal coordinate system that is a real space. When the output beam pattern corresponding to the optical image is a set of bright spots directed to the direction defined by the angles $\theta_{tilt}$ and $\theta_{rot}$, the angles $\theta_{tilt}$ and $\theta_{rot}$ are assumed to be converted into the coordinate value $k_x$ on the Kx-axis, which is a normalized wave number defined by the following Expression (5) and corresponds to the X-axis, and the coordinate value $k_y$ on the Ky-axis, which is a normalized wave number defined by the following Expression (6), corresponds to the Y-axis, and is orthogonal to the Kx-axis. The normalized wave number means a wave number normalized with the wave number corresponding to the lattice spacing of an imaginary square lattice being 1.0. At this time, in the wave number space defined by the Kx axis and the Ky axis, a specific wave number range including the output beam pattern corresponding to an optical image is constituted of M2 (integer equal to or greater than 1)×N2 (integer equal to or greater than 1) image regions FR each having a square shape. It is to be noted that the integer M2 does not necessarily coincide with the integer M1. Similarly, the integer N2 also does not necessarily coincide with the integer N1. Expressions (5) and (6) are disclosed in the above-mentioned Non Patent Literature 2, for example.

$$\xi = d1\sin\theta_{tilt}\cos\theta_{rot} \qquad (2)$$

$$\eta = d1\sin\theta_{tilt}\sin\theta_{rot} \qquad (3)$$

$$\zeta = d1\cos\theta_{tilt} \qquad (4)$$

$$k_x = \frac{a}{\lambda}\sin\theta_{tilt}\cos\theta_{rot} \qquad (5)$$

$$k_y = \frac{a}{\lambda}\sin\theta_{tilt}\sin\theta_{rot} \qquad (6)$$

a: lattice constant of imaginary square lattice
b: oscillation wavelength

On the Kx-Ky plane, a specific region including the target output beam pattern is assumed to be constituted of the M2 (integer equal to or greater than 1)×N2 (integer equal to or greater than 1) image regions FR each having a square shape. It is assumed that an imaginary square lattice set on the X-Y plane coincident with the design plane (reference plane) of the phase modulation layer is constituted by the M1 (integer equal to or greater than 1)×N1 (integer equal to or greater than 1) unit constituent regions R. It is to be noted that the integer M2 does not necessarily coincide with the integer M1. Similarly, the integer N2 also does not necessarily coincide with the integer N1. At this time, a complex amplitude F (x, y) in the unit constituent region R (x, y), where each image region FR ($k_x$, $k_y$) in the Kx-Ky plane specified by a coordinate component $k_x$ (integer of from 0 to M2−1) in the Kx-axis direction and a coordinate component $k_y$ (integer of from 0 to N2−1) in the Ky-axis direction is subjected to the two-dimensional inverse discrete Fourier transform into the unit constituent region R (x, y) specified by the by the coordinate component x (integer of from 0 to M1−1) in the X-axis direction and the coordinate component y (integer of from 0 to N1−1) in the Y-axis direction is given by the following Expression (7), with j being an imaginary unit.

$$F(x, y) = \sum_{k_x=0}^{M2-1}\sum_{k_y=0}^{N2-1} FR(k_x, k_y)\exp\left[j2\pi\left(\frac{k_x x}{M2} + \frac{k_y y}{N2}\right)\right] \quad (7)$$

When the amplitude term is A (x, y) and the phase term is P (x, y) in the unit constituent region R (x, y), the complex amplitude F (x, y) is defined by the following Expression (8).

$$F(x,y)=A(x,y)\times\exp[jP(x,y)] \quad (8)$$

As shown in FIG. 32, in the range of the coordinate components x=0 to M1−1 and y=0 to N1−1, the distribution of the amplitude term A (x, y) in the complex amplitude F (x, y) of the unit constituent region R (x, y) corresponds to the intensity distribution on the X-Y plane. In the range of x=0 to M1−1, y=0 to N1−1, the distribution of the phase term P (x, y) in the complex amplitude F (x, y) of the unit constituent region R (x, y) corresponds to the phase distribution on the X-Y plane. The rotation angle φ (x, y) in the unit constituent region R (x, y) is obtained from P (x, y) as described later, and the distribution of the rotation angle φ (x, y) of the unit constituent region R (x, y) corresponds to the rotation angle distribution on the X-Y plane in the range of the coordinate components x=0 to M1−1 and y=0 to N1−1.

It is to be noted that a center Q of the output beam pattern on the Kx-Ky plane is located on an axis perpendicular to a first surface 100a, and FIG. 32 shows four quadrants with center Q as the origin. FIG. 32 shows a case in which optical images are obtained in the first quadrant and the third quadrant, but images can be obtained in the second quadrant and the fourth quadrant or all the quadrants. In the present embodiment, as shown in FIG. 32, a pattern that is point symmetric with respect to the origin is obtained. FIG. 32 shows, as an example, a case where the character "A" is obtained in the third quadrant and a pattern with the character "A" rotated by 180° is obtained in the first quadrant. It is to be noted that in the case of a rotationally symmetric optical image (e.g., cross, circle, double circle, and so on), they are observed as one optical image where they overlap.

The output beam pattern (optical image) from the surface emitting laser element in the present embodiment is an optical image corresponding to a design optical image (original image) expressed by at least one of a spot, a group of three or more spots, a straight line, a cross, a line drawing, a lattice pattern, a photograph, a stripe pattern, computer graphics (CG), and a character. Here, in order to obtain the target output beam pattern, the rotation angle φ (x, y) of the modified refractive index region 15b in the unit constituent region R (x, y) is determined by the following procedure.

In the unit constituent region R (x, y), as described above, the center of gravity G of the modified refractive index region 15b is arranged in a state of being apart from the lattice point O (x, y) by the distance r (value of r (x, y)). At this time, in the unit constituent region R (x, y), the modified refractive index region 15b is arranged so that the rotation angle φ (x, y) satisfies the following relationship.

$$\varphi(x,y)=C\times P(x,y)+B$$

C: Proportional constant, e.g., 180°/r
B: Arbitrary constant, e.g., 0

It is to be noted that the proportional constant C and the arbitrary constant B have the identical values for all the unit constituent regions R.

That is, when it is desired to obtain an optical image as desired, it is preferable that the optical image is subjected to the inverse Fourier transform and the rotation angle distribution φ (x, y) corresponding to the phase of its complex amplitude is given to the plurality of modified refractive index regions 15b. It is to be noted that a far-field image of the laser beam after the Fourier transform can have various shapes such as a single or a plurality of spot shapes, an annular shape, a linear shape, a character shape, a double annular shape, or a Laguerre-Gaussian beam shape. It is to be noted that the beam pattern is represented by angle information in the far field, and hence, in the case of a bit map image or the like in which the target beam pattern is represented by two-dimensional position information, it is preferable to convert it to angle information once and then perform Fourier transform.

As a method of obtaining the intensity (amplitude) distribution and the phase distribution from the complex amplitude distribution obtained by Fourier transform, for example, an intensity distribution I (x, y) can be calculated by using the abs function of "MATLAB", numerical analysis software of MathWorks, Inc., and a phase distribution P (x, y) can be calculated by using the angle function of MATLAB.

Here, points of attention will be given regarding a case where a general discrete Fourier transform (or fast Fourier transform) is used for calculation when the rotation angle distribution φ (x, y) is obtained from the Fourier transform result of the optical image and the arrangement of each modified refractive index region 15b is determined. When the optical image before Fourier transform is divided into four quadrants of A1, A2, A3, and A4 as shown in FIG. 33A, the resulting beam pattern becomes as shown in FIG. 33B. That is, in FIG. 33B, in the first quadrant of the beam pattern, a pattern in which the pattern obtained by rotating the pattern in the first quadrant in FIG. 33A by 180 degrees and the pattern in the third quadrant in FIG. 33A are superimposed appears. In the second quadrant of the beam pattern, a pattern in which the pattern obtained by rotating the pattern in the second quadrant in FIG. 33A by 180 degrees and the pattern in the fourth quadrant in FIG. 33A are superimposed appears. In the third quadrant of the beam pattern, a pattern in which the pattern obtained by rotating the pattern in the third quadrant in FIG. 33A by 180 degrees and the pattern in the first quadrant in FIG. 33A are superimposed appears. In the fourth quadrant of the beam pattern, a pattern in which the pattern obtained by rotating the pattern in the fourth quadrant in FIG. 33A by 180 degrees and the pattern in the second quadrant in FIG. 33A are superimposed appears.

Therefore, when an optical image having a value only in the first quadrant is used as an optical image (original optical image) before the inverse Fourier transform, the first quadrant of the original optical image appears in the third quadrant of the resulting beam pattern, and a pattern in which the first quadrant of the original optical image is rotated by 180 degrees appears in the first quadrant of the resulting beam pattern.

Figure 34:
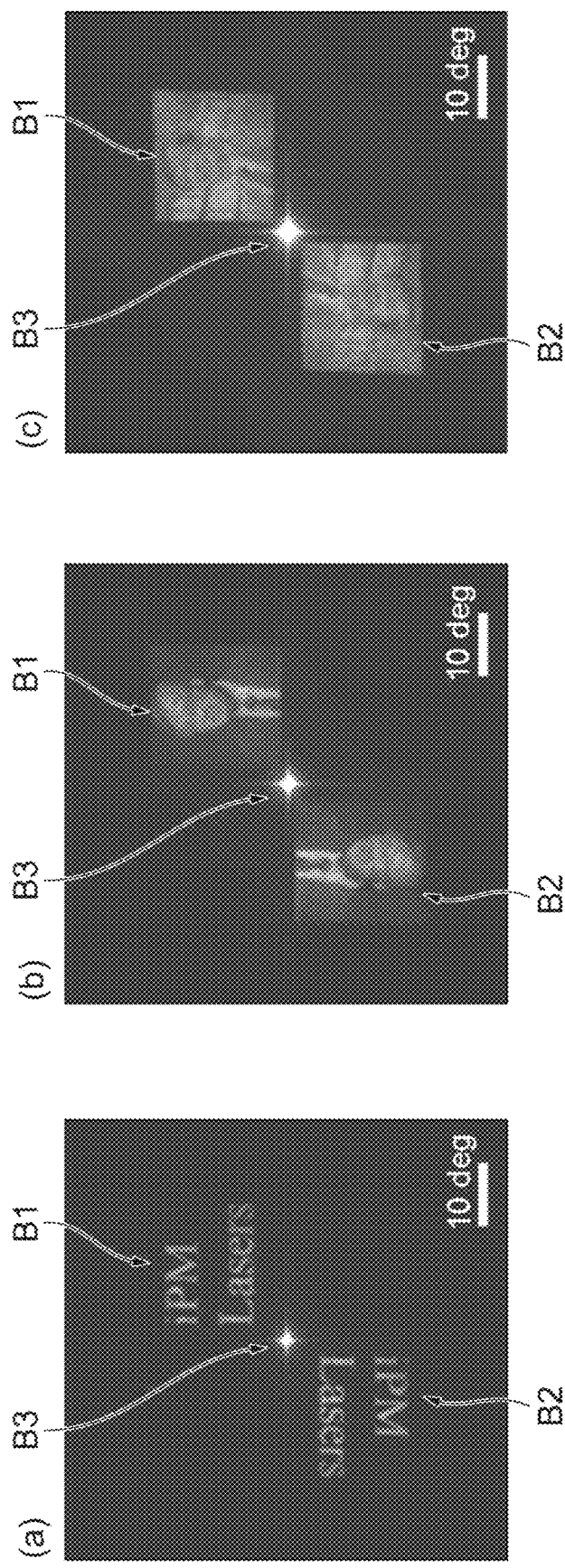
FIGS. 34A to 34C show examples of beam patterns (optical image) outputted from the surface emitting laser element according to the third embodiment.

FIGS. 34A to 34C show examples of beam patterns (optical image) outputted from the surface emitting laser element according to the present embodiment. Each center of FIGS. 34A to 34C corresponds to an axis (Z-axis) perpendicular to the first light output surface 2a of the surface emitting laser element that intersects with the first light output surface 2a. As shown in FIGS. 34A to 34C, the surface emitting laser element outputs the first-order light including a first optical image portion B1 outputted to the first direction tilted with respect to the axis, the −1 order light including a second optical image portion B2 outputted to the second direction symmetric with the first direction with respect to the axis and rotationally symmetric with first optical image portion B1 with respect to the axis, and a zero-order light B3 traveling on the axis.

According to the present embodiment, as the surface emitting laser element 2A shown in FIGS. 2, 3, and 17, the S-iPM laser that outputs a two-dimensional, arbitrary-shaped optical image can be applied. Here, when light is input perpendicularly to the surface of the metasurface, if the period of the metasurface is large, the diffraction angle becomes small. Therefore, there arises a problem that it becomes difficult to extract light from an output window. On the other hand, when the surface emitting laser element 2A is an S-iPM laser, light can be inputted to the surface of the metasurface from an oblique direction. As a result, the diffraction angle from the metasurface is increased, and extraction of light from the output window becomes easy. When light is input perpendicularly to the surface of the metasurface, the laser light L1 reflected on the metasurface overlaps the laser light L2 directed to the first light output surface 2a directly without passing through the metasurface. In such situation, when the surface emitting laser element 2A is an S-iPM laser, light can be inputted to the surface of the metasurface from an oblique direction, and thus it becomes easy to selectively extract only the laser light L1 reflected on the metasurface.

Fourth Modified Example

Next, an explanation will be given regarding the case where the arrangement pattern of the modified refractive index region 15b on a phase modulation layer 15C according to one modified example of the third embodiment is determined by an on-axis shift method. It is to be noted that even when the on-axis shift method is applied in place of the above-described rotation method as an arrangement pattern determination method of the modified refractive index region 15b on the phase modulation layer 15C, the obtained phase modulation layer is applied to the surface emitting laser element of the various embodiments described above. When the on-axis shift method is adopted, it becomes possible to align the polarization direction of the light inputted from the light source, and hence it becomes possible to align the polarization direction of the light inputted to the reflective metasurface, which has an effect of being capable of improving the light utilization efficiency and suppressing the unnecessary light.

Figure 35:
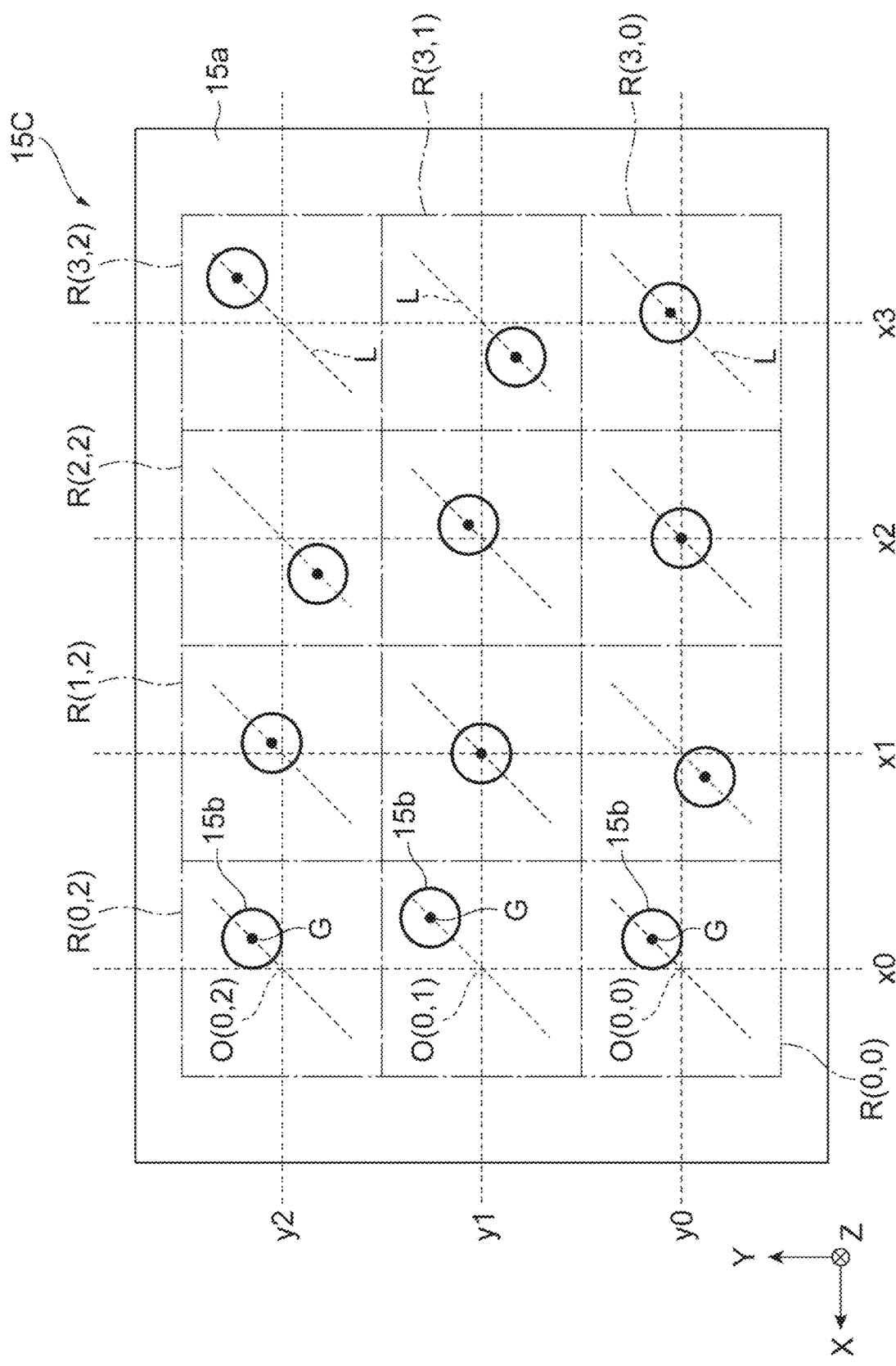
FIG. 35 is a plan view of a phase modulation layer 15C according to one modified example of the third embodiment.

FIG. 35 is a plan view of the phase modulation layer 15C according to one modified example of the third embodiment, and is a schematic view for explaining the arrangement pattern (on-axis shift method) of the modified refractive index region 15b on the phase modulation layer 15C. The phase modulation layer 15C includes the base layer 15a and the modified refractive index region 15b having a refractive index different from the refractive index of the base layer 15a. Here, an imaginary square lattice defined on the X-Y plane is set on the phase modulation layer 15C as in the example of FIG. 30. One side of the square lattice is parallel with the X-axis and the other side is parallel with the Y-axis. At this time, the square-shaped unit constituent region R centered on the lattice point O of the square lattice can be two-dimensionally set over a plurality of columns (x0 to x3) along the X-axis and a plurality of rows (y0 to y2) along the Y-axis. Provided that the coordinates of each unit constituent region R are given by the barycentric position of each unit constituent region R, this barycentric position coincides with the lattice point O of the imaginary square lattice. Each of the plurality of modified refractive index regions 15b is provided in each unit constituent region R on a one-by-one basis. The planar shape of the modified refractive index region 15b is circular, for example. The lattice point O may be located outside the modified refractive index region 15b, or may be included inside the modified refractive index region 15b.

Figure 36:
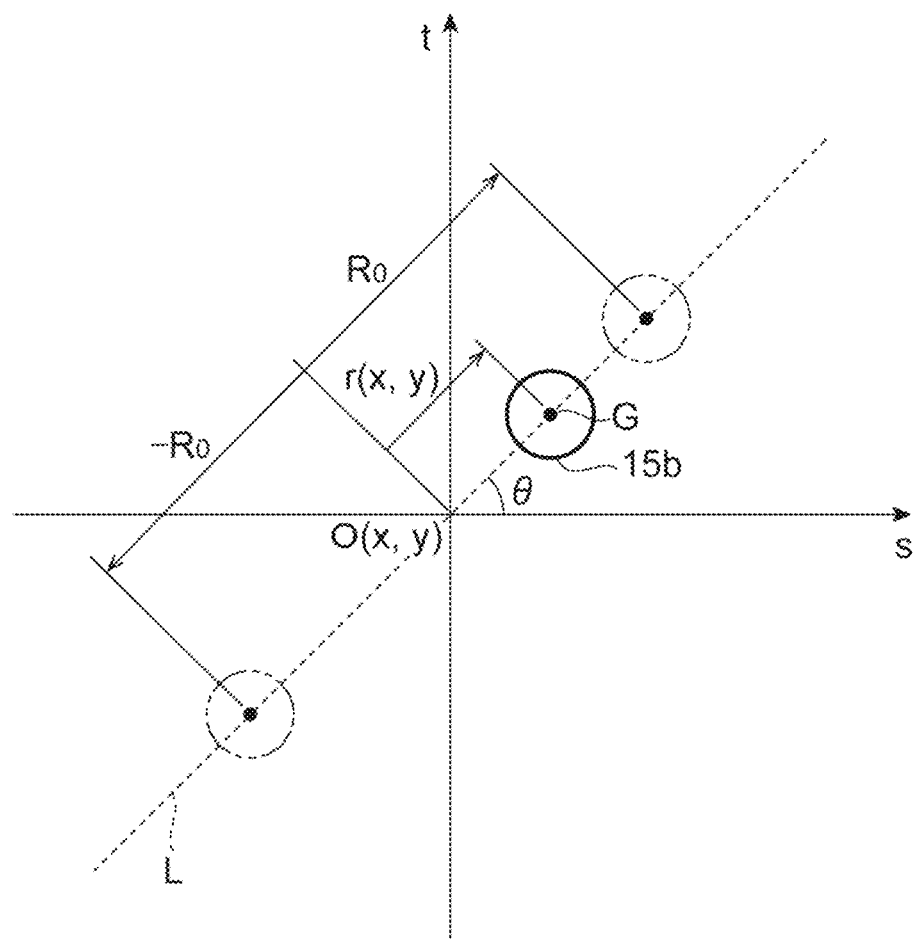
FIG. 36 is a view showing a positional relationship of the modified refractive index region 15b in the phase modulation layer 15C.

FIG. 36 is a view for explaining the positional relationship between the center of gravity G of the modified refractive index region 15b and the lattice point O (x, y) in the imaginary square lattice, as an example of the arrangement pattern determined by the on-axis shift method. As shown in FIG. 36, the center of gravity G of each modified refractive index region 15b is arranged on a straight line L. The straight line L is a straight line passing through the corresponding lattice point O (x, y) of the unit constituent region R (x, y) and tilted with respect to each side of the square lattice. In other words, the straight line L is a straight line tilted with respect to both the s-axis and the t-axis defining the unit constituent region R (x, y). The tilt angle of the straight line L with respect to the s-axis is θ. The tilt angle θ is constant in the phase modulation layer 15C. The tilt angle θ satisfies $0°<θ<90°$, and $θ=45°$ in one example. Alternatively, the tilt angle θ satisfies $180°<θ<270°$, and $θ=225°$ in one example. When the tilt angle θ satisfies $0°<θ<90°$ or $180°<θ<270°$, the straight line L extends from the first quadrant to the third quadrant of the coordinate plane defined by the s-axis and the t-axis. Alternatively, the tilt angle θ satisfies $90°<θ<180°$, and $θ=135°$ in one example. Alternatively, the tilt angle θ satisfies $270°<θ<360°$, and $θ=315°$ in one example. When the tilt angle θ satisfies $90°<θ<180°$ or $270°<θ<360°$, the line L extends from the second quadrant to the fourth quadrant of the coordinate plane defined by the s-axis and the t-axis. Thus, the tilt angle θ is an angle excluding 0°, 90°, 180°, and 270°. Here, let the distance between the lattice point O (x, y) and the center of gravity G be r (x, y). x denotes the position of the x-th lattice point on the X-axis and y denotes the position of the y-th lattice point on the Y-axis. When the distance r (x, y) is a positive value, the center of gravity G is located in the first quadrant (or the second quadrant). When the distance r (x, y) is a negative value, the center of gravity G is located in the third quadrant (or the fourth quadrant). When the distance r (x, y) is θ, the lattice point O and the center of gravity G coincide with each other.

The distance r (x, y) shown in FIG. 35 between the center of gravity G of each modified refractive index region 15*b* and the corresponding lattice point O (x, y) of the unit constituent region R (x, y) is set individually for each modified refractive index region 15*b* according to the target output beam pattern (optical image). The distribution of the distance r (x, y) has a specific value for each position determined by the values of x (x0 to x3 in the example in FIG. 35) and y (y0 to y2 in the example in FIG. 35), but is not necessarily represented by a specific function. The distribution of the distance r (x, y) is determined from a complex amplitude distribution obtained by inverse Fourier transform of the target output beam pattern, from which the phase distribution is extracted. That is, as shown in FIG. 36, the distance r (x, y) is set to 0 when the phase P (x, y) in the unit constituent region R (x, y) is $P_0$, the distance r (x, y) is set to the maximum value $R_0$ when the phase P (x, y) is $\pi+P_0$, and the distance r (x, y) is set to the minimum value $-R_0$ when the phase P (x, y) is $-\pi+P_0$. Then, for an intermediate phase P (x, y), the distance r (x, y) is set so that r (x, y)={P (x, y)–$P_0$}×$R_0$/π is true. Here, the initial phase $P_0$ can be set arbitrarily. Assuming that the lattice spacing of the square lattice is a, the maximum value $R_0$ of r (x, y) is within the range of the following Expression (9), for example.

$$0 \le R_0 \le \frac{a}{\sqrt{2}} \quad (9)$$

It is to be noted that when the complex amplitude distribution is obtained from the target output beam pattern, the reproducibility of the beam pattern is improved by applying a repetition algorithm such as the Gerchberg-Saxton (GS) method commonly used at the time of calculation of hologram generation.

The relationship between the optical image obtained as an output beam pattern and the phase distribution P (x, y) in the phase modulation layer 15C is the same as that in the case of the rotation system described above (FIG. 31). Therefore, the phase modulation layer 15C is configured to satisfy the following conditions under the preconditions defined by the above Expressions (2) to (8) in addition to the preconditions that define the square lattice. That is, the corresponding modified refractive index region 15*b* is arranged in the unit constituent regions R (x, y) so that the distance r (x, y) from the lattice point O (x, y) to the center of gravity G of the corresponding modified refractive index region 15*b* satisfies the following relationship.

$r(x,y)=C\times(P(x,y)-P_0)$

C: Proportional constant, e.g., $R_0/\pi$ $P_0$: Arbitrary constant, e.g., 0 That is, the distance r (x, y) is set to 0 when the phase P (x, y) in the unit constituent region R (x, y) is $P_0$, is set to the maximum value $R_0$ when the phase P (x, y) is $\pi+P_0$, and is set to the minimum value $-R_0$ when the phase P (x, y) is $-\pi+P_0$. When it is desired to obtain the target output beam pattern, it is preferable that the output beam pattern is subjected to inverse Fourier transform and the distribution of the distance r (x, y) corresponding to the phase P (x, y) of its complex amplitude is given to the plurality of modified refractive index regions 15*b*. The phase P (x, y) and the distance r (x, y) may be proportional to each other.

It is to be noted that a far-field image of the laser beam after the Fourier transform can have various shapes such as a single or a plurality of spot shapes, an annular shape, a linear shape, a character shape, a double annular shape, or a Laguerre-Gaussian beam shape. The output beam pattern is represented by angle information in the far field, and hence, in the case of a bit map image or the like in which the target output beam pattern is represented by two-dimensional position information, it is preferable to convert it to angle information once, then convert it to the wave number space, and after that, perform inverse Fourier transform.

As a method of obtaining the intensity distribution and the phase distribution from the complex amplitude distribution obtained by inverse Fourier transform, for example, an intensity distribution (A (x, y)) can be calculated by using the abs function of "MATLAB", numerical analysis software of MathWorks, Inc., and a phase distribution P (x, y) can be calculated by using the angle function of MATLAB. It is to be noted that points of attention regarding a case where a general discrete Fourier transform (or fast Fourier transform) is used for calculation when the phase distribution P (x, y) is obtained from the inverse Fourier transform result of the optical image and the distance r (x, y) of each modified refractive index region 15*b* is determined are the same as those of the third embodiment described above.

Also in the present modified example, as the surface emitting laser element 2A shown in FIGS. 2, 3, and 17, the S-iPM laser that outputs a two-dimensional, arbitrary-shaped optical image can be applied. Therefore, light can be inputted to the surface of the metasurface from an oblique direction, and thus the diffraction angle from the metasurface can be increased, and extraction of light from the output window becomes easy. Light can be inputted to the surface of the metasurface from an oblique direction, and thus it becomes easy to selectively extract only the laser light L1 reflected on the metasurface.

Fifth Modified Example

Figure 38:
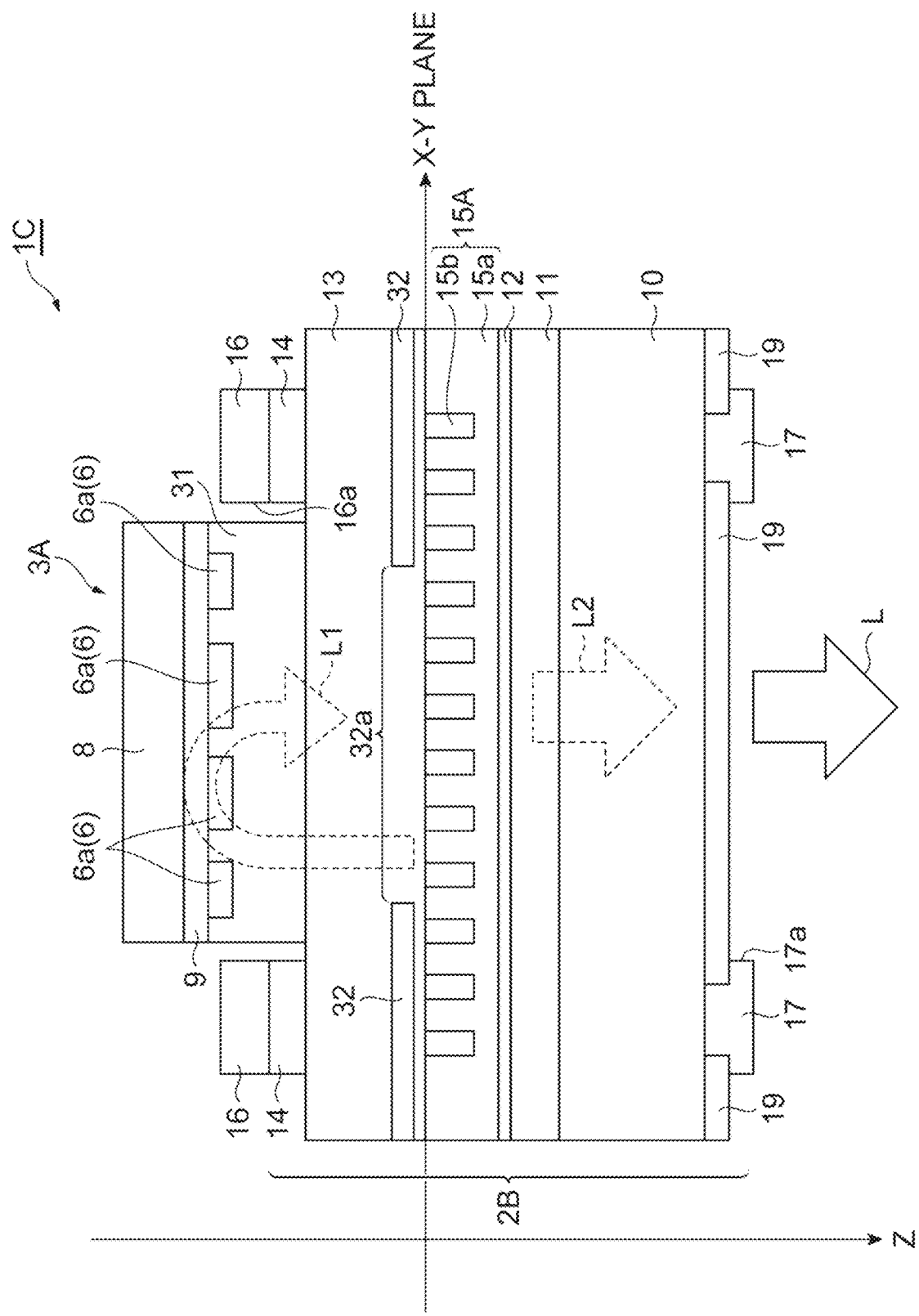
FIG. 38 is a view schematically showing a cross-sectional configuration of a light-emitting device 1C according to a fifth modified example.

FIG. 38 is a view schematically showing the cross-sectional configuration of the light-emitting device 1C according to the fifth modified example. As shown in FIG. 38, the light-emitting device 1C includes a surface emitting laser element 2B, the metasurface 3A, and the light guide layer 31. Of these, the configurations of the metasurface 3A and the light guide layer 31 are the same as those of the first embodiment. The surface emitting laser element 2B further has a current constriction layer 32 in addition to the configuration of the surface emitting laser element 2A of the first embodiment.

The current constriction layer 32 has a structure that makes it difficult for current to pass therethrough (or does not let current through), and has an opening 32*a* in the center portion. The planar shape of the opening 32*a* is similar to the shape of the opening 16*a* of the electrode 16, and is, for example, square or circular. The current constriction layer 32 is, for example, an Al oxide layer in which a layer containing a high concentration of Al is oxidized. Alternatively, the current constriction layer 32 may be a layer formed by injecting protons ($H^+$) into the cladding layer 13. Alternatively, the current constriction layer 32 may have an inverse pn junction structure in which a semiconductor layer of an opposite conductivity type to that of the semiconductor substrate 10 and a semiconductor layer of the same conductivity type as that of the semiconductor substrate 10 are laminated in this order.

When a drive current is supplied between the electrode 16 and the electrode 17, the drive current reaches the active layer 12. At this time, the current flowing through between the electrode 16 and the active layer 12 is sufficiently diffused in the cladding layer 13 and passes through the opening 32a of the current constriction layer 32. This allows the current to be uniformly diffused near the center portion of the active layer 12. Therefore, even when the metasurface 3A is provided at the center portion of the second light output surface 2b, it is possible to suppress the bias of the light-emitting region in the active layer 12. It is to be noted that the present modified example is an example in which the current constriction layer 32 is added to the surface emitting laser element 2A of the first embodiment, but the current constriction layer 32 may be added to the surface emitting laser element of another embodiment or modified example. Also in that case, the same effects can be obtained.

Sixth Modified Example

Figure 39:
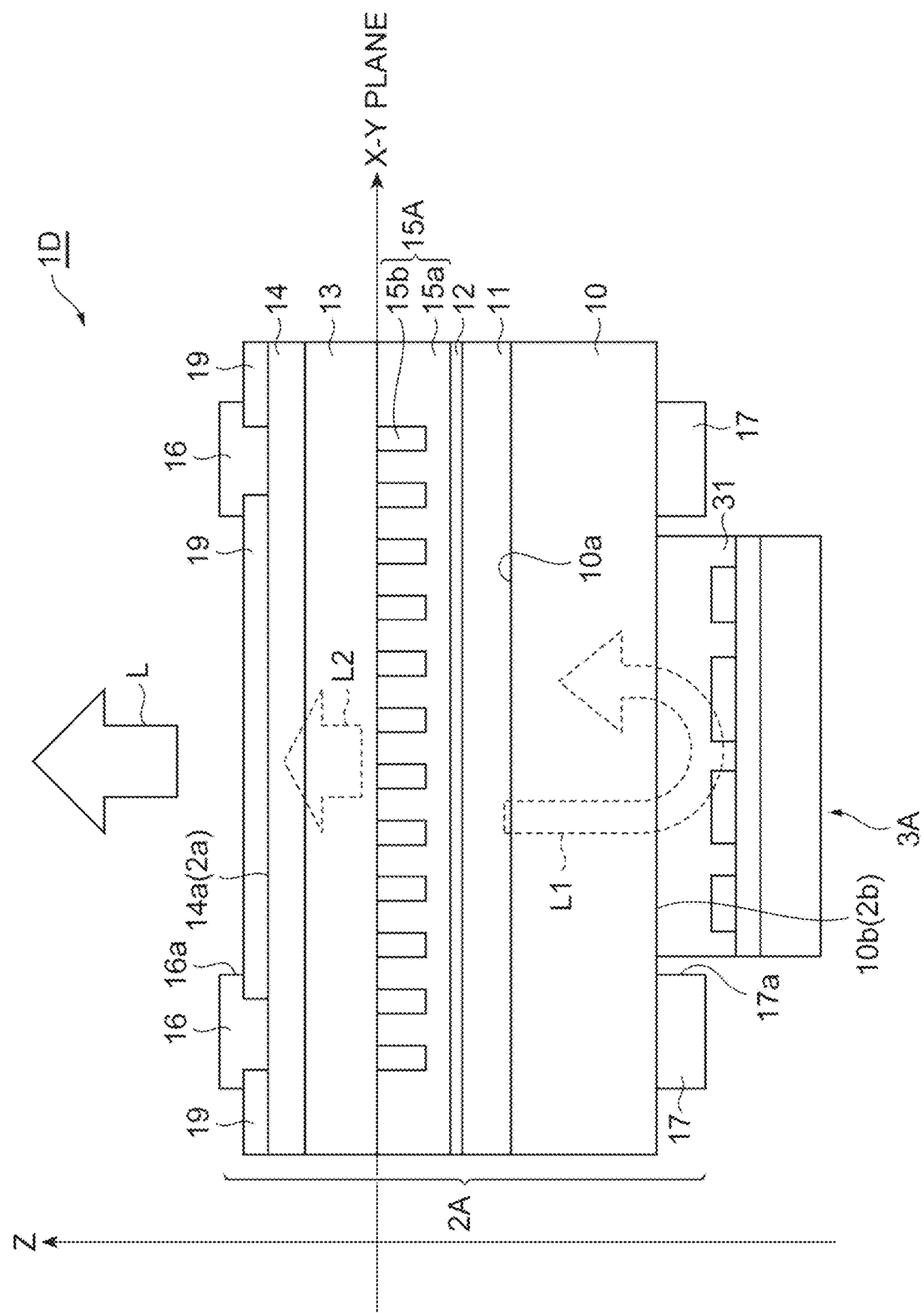
FIG. 39 is a view schematically showing a cross-sectional configuration of a light-emitting device 1D according to a sixth modified example.

FIG. 39 is a view schematically showing the cross-sectional configuration of the light-emitting device 1D according to the sixth modified example. As shown in FIG. 39, the light-emitting device 1D includes the surface emitting laser element 2A, the metasurface 3A, and the light guide layer 31. These configurations are the same as those of the first embodiment except the following points. That is, in the surface emitting laser element 2A of the present modified example, the first light output surface 2a is provided on the main surface 10a side of the semiconductor substrate 10, and the second light output surface 2b is provided on the back surface 10b side thereof. Specifically, the front surface (or the surface of the upper cladding layer 13 when an opening is formed on the contact layer 14) of the contact layer 14 serves as the first light output surface 2a, and the back surface 10b of the semiconductor substrate 10 serves as the second light output surface 2b. Then, the metasurface 3A is provided on the back surface 10b of the semiconductor substrate 10 via the light guide layer 31.

Figure 40:
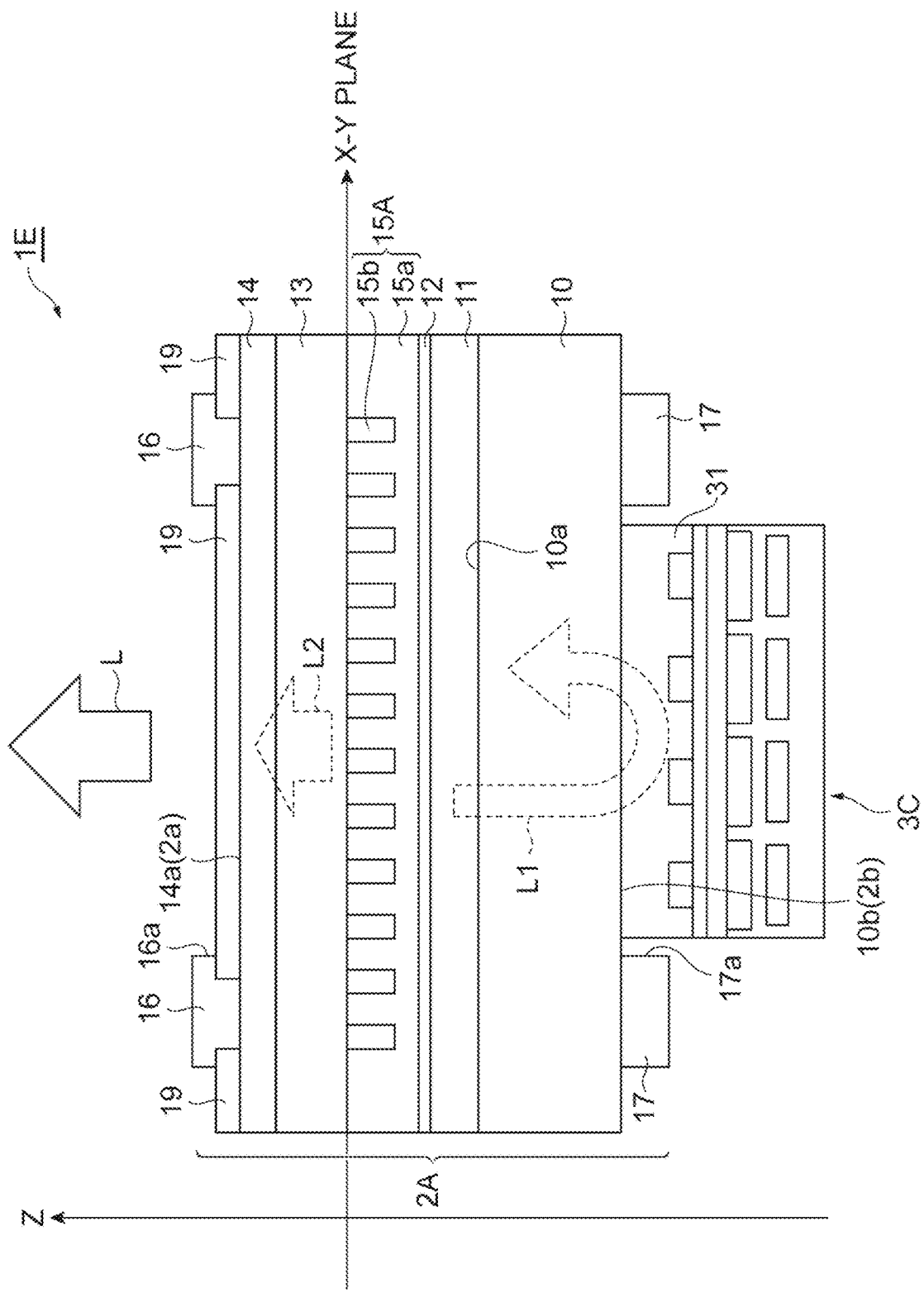
FIG. 40 is a view schematically showing a cross-sectional configuration of a light-emitting device 1E according to another modified example.

FIG. 40 is a view schematically showing the cross-sectional configuration of a light-emitting device 1E according to another modified example. As shown in FIG. 40, the light-emitting device 1E includes the surface emitting laser element 2A, the metasurface 3C (see FIGS. 17 and 18) of the second embodiment, and the light guide layer 31. Then, the front surface (or the surface of the upper cladding layer 13 when an opening is formed on the contact layer 14) of the contact layer 14 serves as the first light output surface 2a, and the back surface 10b of the semiconductor substrate 10 serves as the second light output surface 2b. The metasurface 3C is provided on the back surface 10b of the semiconductor substrate 10 via the light guide layer 31.

As in the present modified example, the first light output surface 2a may be provided on the main surface 10a side of the semiconductor substrate 10, and the metasurface 3A (3C) may be provided on the back surface 10b. Even in such case, the same effects as those of each embodiment described above can be achieved. According to the present modified example, it is possible to sufficiently diffuse the current in the semiconductor substrate 10, and hence the opening 17a of the electrode 17 can be secured to be larger than the opening 16a of the electrode 16. Therefore, it is possible to increase the area of the metasurface 3A (3C). In addition, the light diffracted from the photonic crystal layer 15A passes through the substrate 10 and reaches the metasurface 3A (3C), whereby the input light to the metasurface 3A (3C) can be brought close to an excellent plane wave. It is to be noted that in the present modified example, a surface emitting laser element of another embodiment or modified example may be applied in place of the surface emitting laser element 2A. Also in that case, the same effects can be obtained.

Seventh Modified Example

Figure 41:
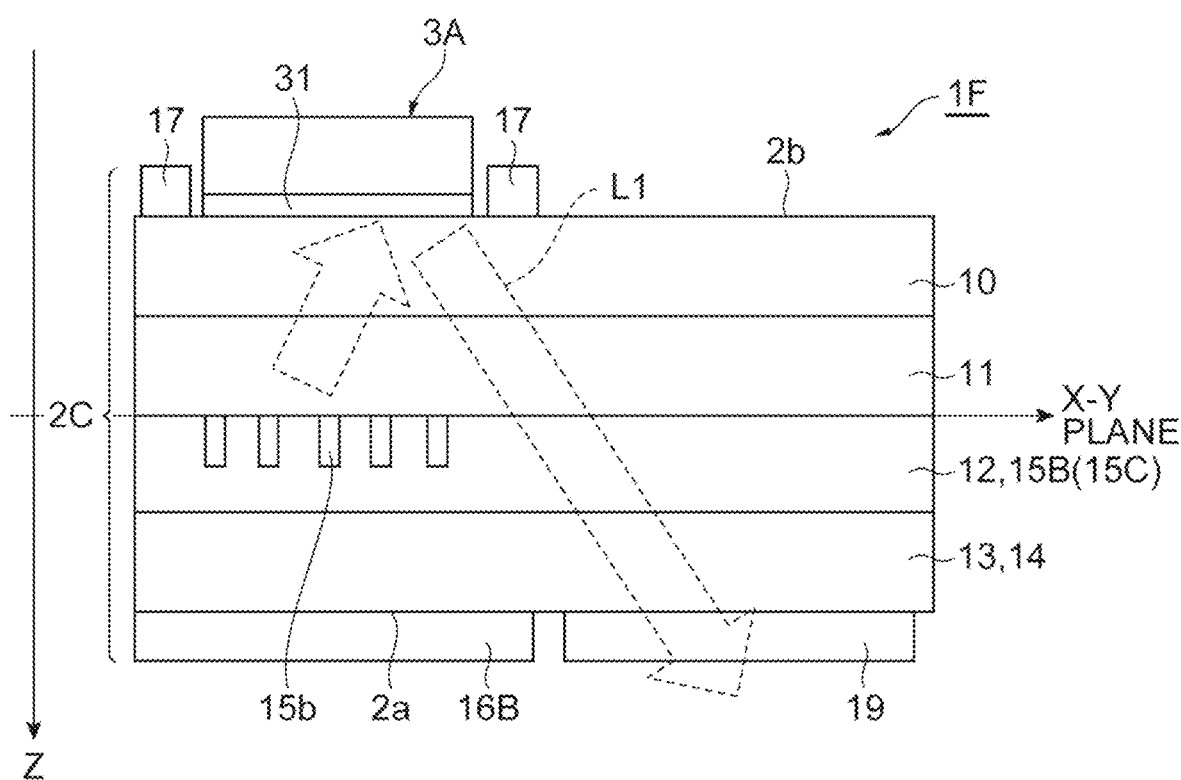
FIG. 41 is a view schematically showing a cross-sectional configuration of a light-emitting device 1F according to a seventh modified example.

FIG. 41 is a view schematically showing the cross-sectional configuration of a light-emitting device 1F according to the seventh modified example. As shown in FIG. 41, the light-emitting device 1F includes a surface emitting laser element 2C, the metasurface 3A, and the light guide layer 31. Of these, the configurations of the metasurface 3A and the light guide layer 31 are the same as those of the sixth modified example. Similarly to the surface emitting laser element 2A of the first embodiment, the surface emitting laser element 2C has the first light output surface 2a and the second light output surface 2b. However, on the first light output surface 2a, a laser light output region is provided side by side with an electrode 16B. The surface emitting laser element 2C is an S-iPM laser having the phase modulation layer 15B shown in FIG. 30 or a phase modulation layer 15C shown in FIG. 35.

FIG. 42A is a plan view showing the second light output surface 2b. FIG. 42B is a plan view showing the first light output surface 2a. As shown in FIG. 42B, a laser light output region 2c and the electrode 16B (first electrode) are arranged side by side on the first light output surface 2a. The antireflection film 19 is provided on the laser light output region 2c. Unlike in another embodiment, the electrode 16B has a not-framed but filled (solid) pattern. It is to be noted that as shown in FIG. 42A, the planar shapes, arrangements, and the like of both the electrode 17 and the metasurface 3A on the second light output surface 2b are the same as those in the first embodiment.

From the surface emitting laser element 2C, which is an S-iPM laser, the laser light L1 is outputted in a direction tilted with respect to a direction perpendicular to the second light output surface 2b. The laser light L1 is reflected while being phase-modulated on the metasurface 3A, and is outputted from the laser light output region 2c to the outside of the light-emitting device 1F. With such configuration, it is not necessary to provide an opening in the electrode on the first light output surface 2a, and hence it is possible to more effectively diffuse the current near the center portion of the active layer 12.

Figure 43:
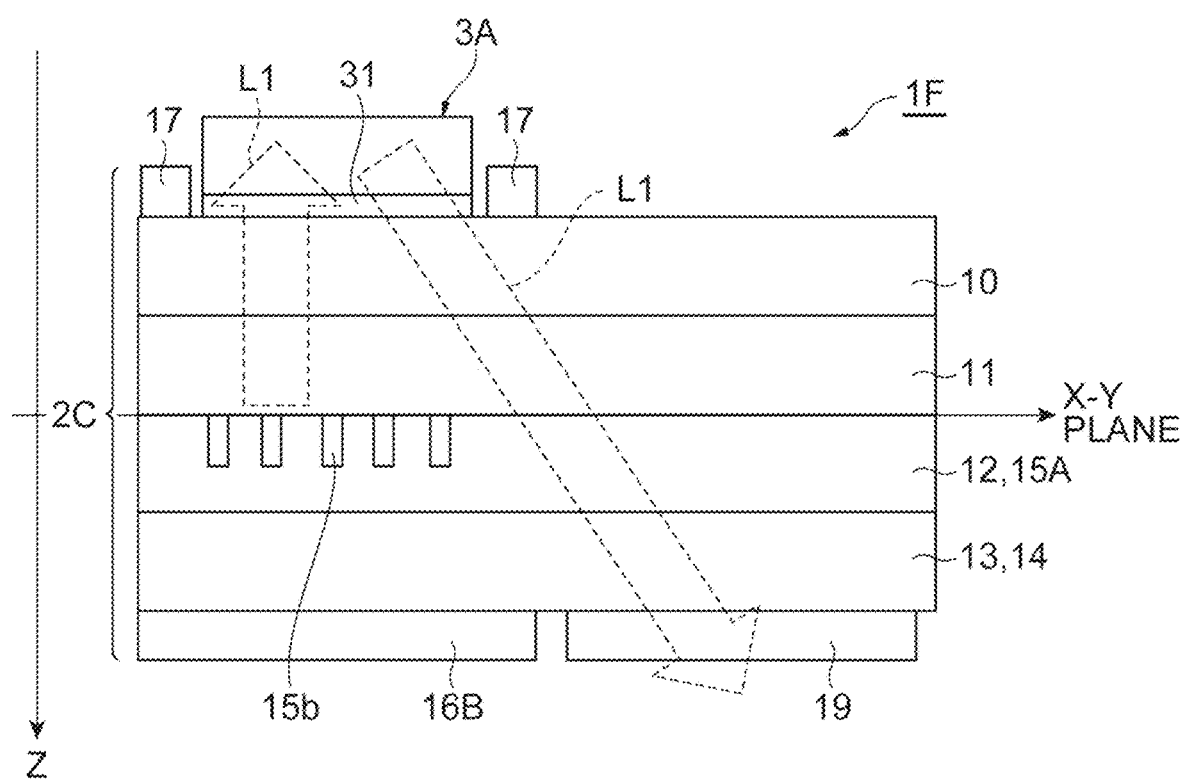
FIG. 43 is a view showing an example in which the configuration of FIG. 41 is applied to a surface emitting laser element 2A of the first embodiment, which is a PCSEL.

It is to be noted that as shown in FIG. 43, the configuration of FIG. 41 may be applied to the surface emitting laser element 2A, which is a PCSEL. Also in this case, the same effects as those described above can be achieved by extracting the laser light L1 from the laser light output region 2c arranged side by side with the electrode 16B.

Eighth Modified Example

Figure 44:
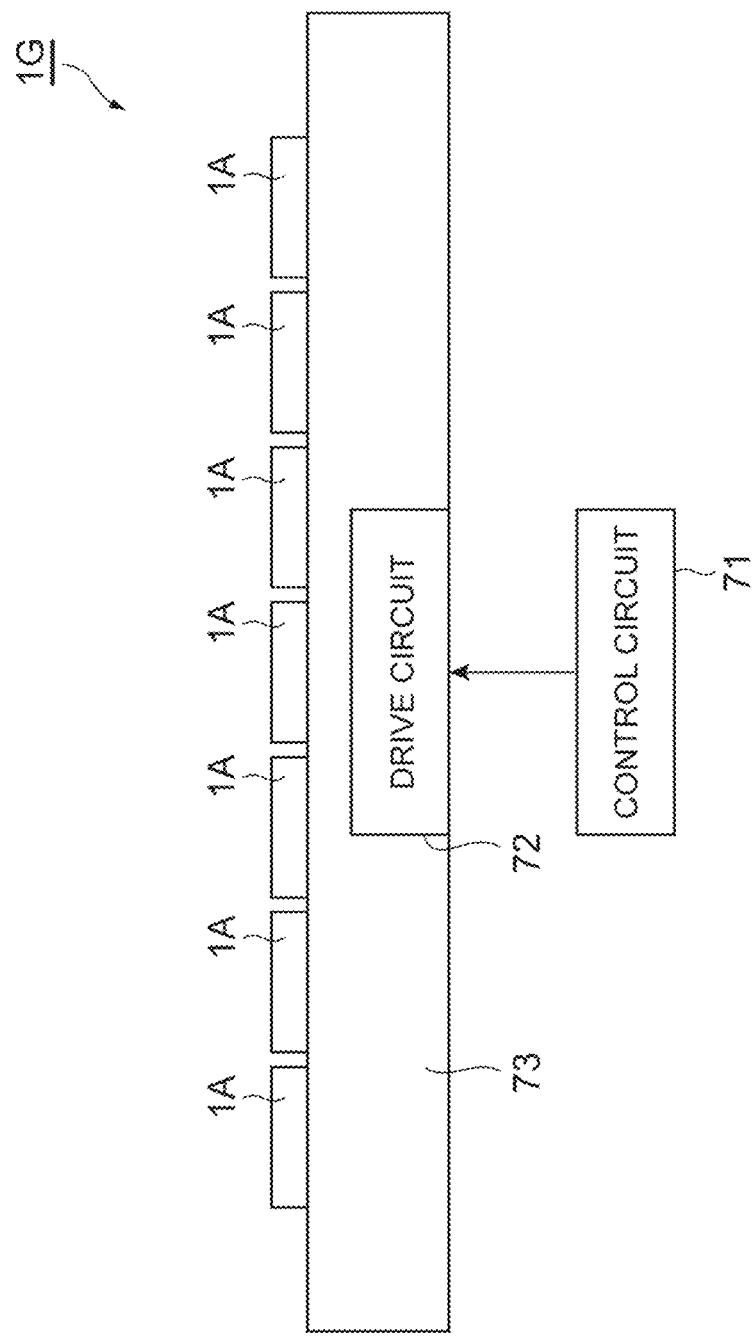
FIG. 44 is a view showing a configuration of a light-emitting apparatus 1G according to an eighth modified example.

FIG. 44 is a view showing the configuration of a light-emitting apparatus 1G according to an eighth modified example. The light-emitting apparatus 1G includes a support substrate 73, the plurality of light-emitting devices 1A constituting a one-dimensional array or a two-dimensional array on the support substrate 73, and a drive circuit 72 that individually drives the plurality of light-emitting devices 1A. The configuration of each light-emitting device 1A is the same as that of the first embodiment. However, the plurality of light-emitting devices 1A may include a laser element that outputs an optical image in a red wavelength region, a laser element that outputs an optical image in a blue wavelength region, and a laser element that outputs an optical image in a green wavelength region. The laser element that outputs an optical image in the red wavelength region is composed of a GaAs-based semiconductor, for example. The laser element that outputs an optical image in the blue wavelength region and the laser element that outputs an optical image in the green wavelength region are composed of a nitride-based semiconductor, for example. The drive circuit 72 is provided on the back surface or inside of the support substrate 73, and individually drives the light-emitting devices 1A. The drive circuit 72 supplies a drive current to the individual light-emitting devices 1A in accordance with an instruction from the control circuit 71.

It is possible to preferably realize a head-up display or the like by providing the plurality of individually driven light-emitting devices 1A as in the present modified example. The plurality of light-emitting devices 1A include the laser element that outputs an optical image in the red wavelength region, the laser element that outputs an optical image in the blue wavelength region, and the laser element that outputs an optical image in the green wavelength region. This allows a color head-up display or the like to be preferably realized. It is to be noted that in the present modified example, a light-emitting device of another embodiment or modified example may be applied in place of the light-emitting device 1A. Also in that case, the same effects can be obtained.

Ninth Modified Example

Figure 45:
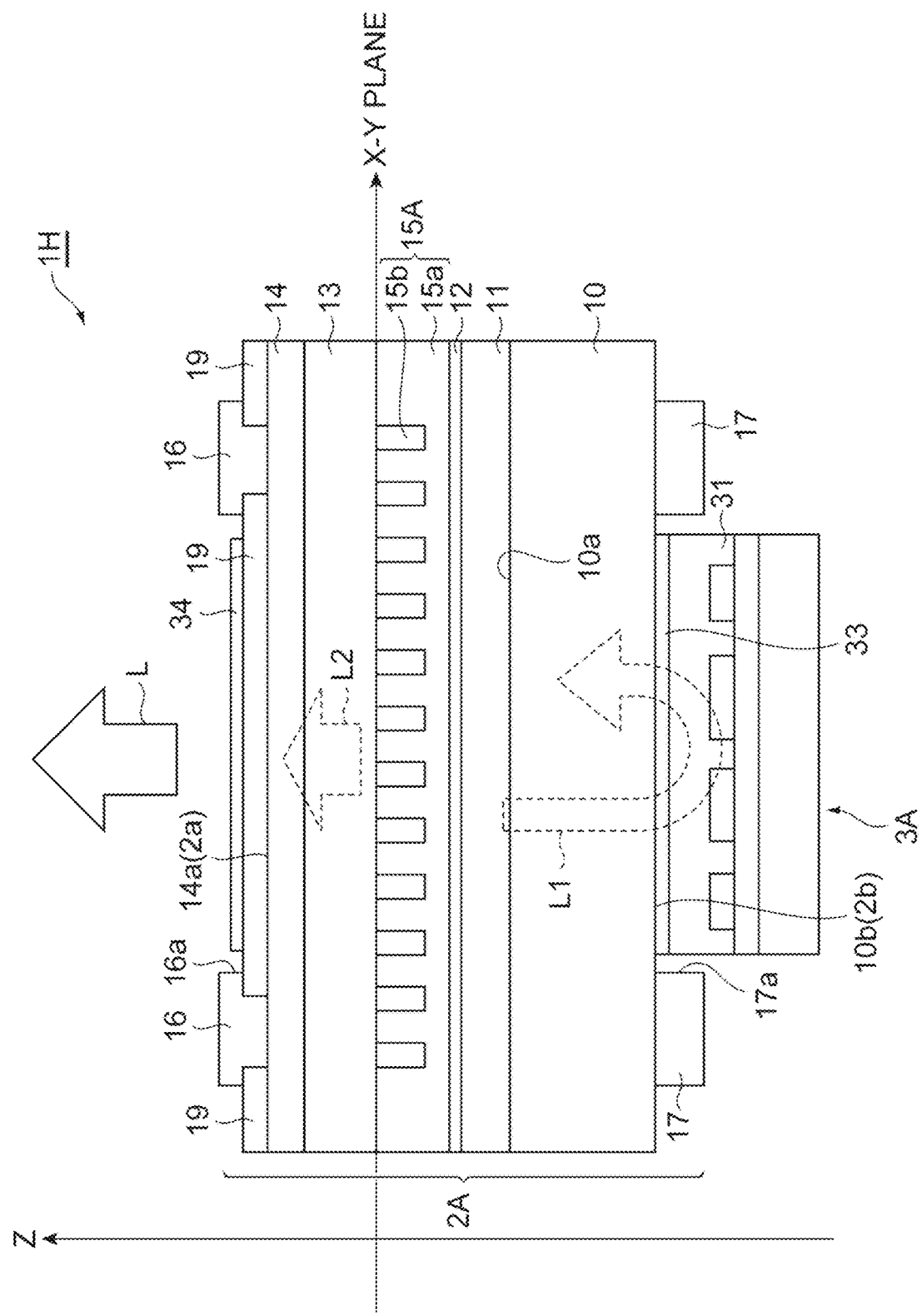
FIG. 45 is a view schematically showing a cross-sectional configuration of a light-emitting device 1H according to a ninth modified example.
Figure 46:
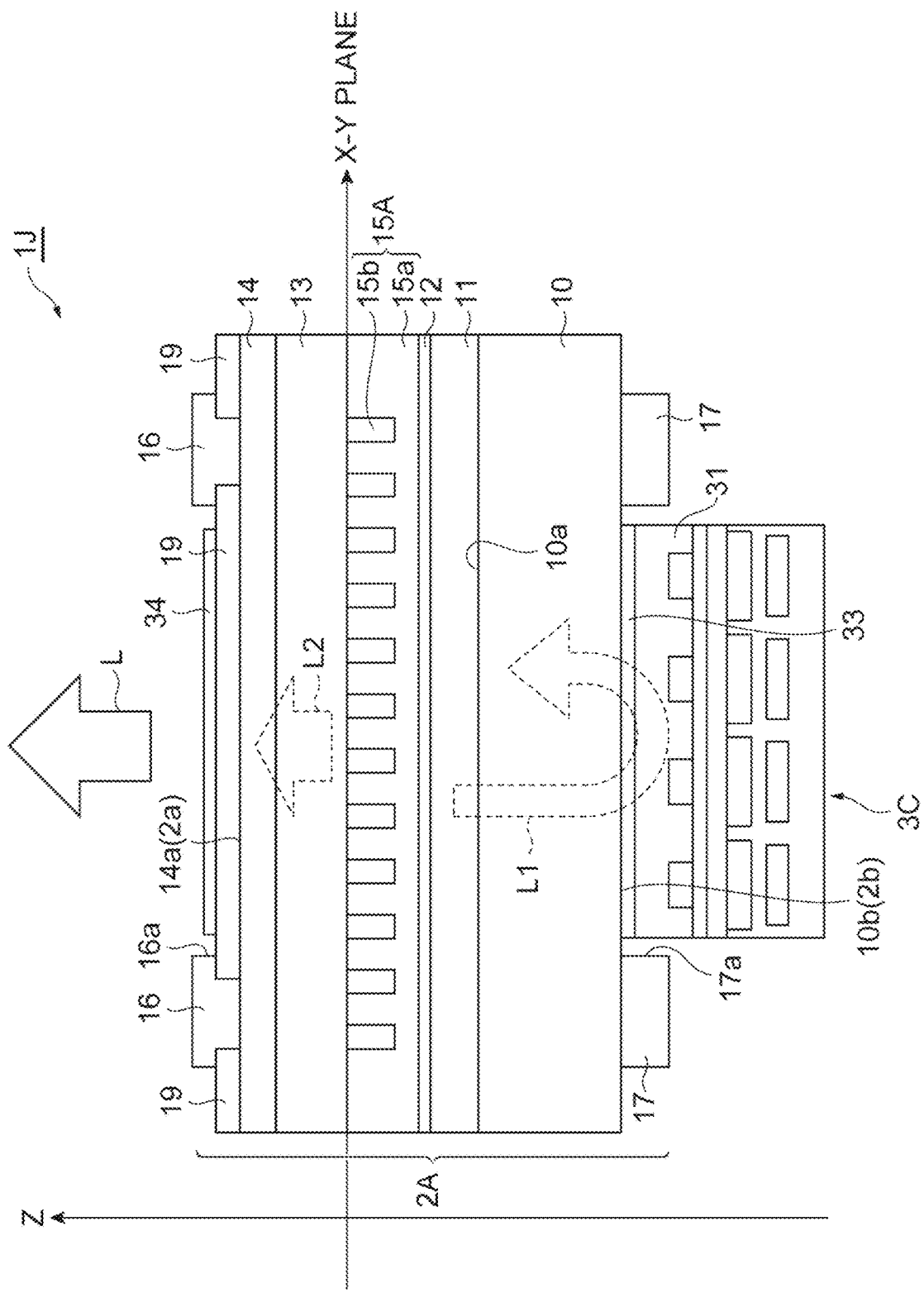
FIG. 46 is a view schematically showing a cross-sectional configuration of a light-emitting device 1J according to another modified example.

FIG. 45 is a view schematically showing the cross-sectional configuration of a light-emitting device 1H according to the ninth modified example. As shown in FIG. 45, the light-emitting device 1H further includes, in addition to the surface emitting laser element 2A, the metasurface 3A, and the light guide layer 31, a ¼ wavelength plate 33 provided between the second light output surface 2b and the metasurface 3A, and a polarizing plate 34 provided on the first light output surface 2a. FIG. 46 is a view schematically showing the cross-sectional configuration of a light-emitting device 1J according to another modified example. As shown in FIG. 46, the light-emitting device 1J further includes, in addition to the surface emitting laser element 2A, the metasurface 3C (see FIGS. 17 and 18), and the light guide layer 31, the ¼ wavelength plate 33 provided between the second light output surface 2b and the metasurface 3C, and the polarizing plate 34 provided on the first light output surface 2a. In these cases, one laser light L1 outputted from the photonic crystal layer 15A is inputted to the metasurface 3A (or 3C) after the polarization plane is rotated by 45° in the ¼ wavelength plate 33. Then, the laser light L1 reflected on the metasurface 3A (or 3C) reaches the first light output surface 2a after the polarization plane is rotated again by 45° in the ¼ wavelength plate 33. Therefore, the polarization planes of the laser light L1 and the laser light L2 directly reaching the first light output surface 2a from the photonic crystal layer 15A are orthogonal to each other. Therefore, for example, when the polarizing plate 34 passes the laser light L1 and shields the laser light L2, the laser light L1 having passed through the metasurface 3A (or 3C) can be selectively outputted to the outside. That is, it is possible to block the laser light L2 directly reaching the first light output surface 2a from the surface emitting laser element 2A, and to extract only the light reaching the first light output surface 2a via the second light output surface 2b and the metasurface 3A (or 3C). It is to be noted that in the present modified example, a surface emitting laser element of another embodiment or modified example may be used in place of the surface emitting laser element 2A. Also in that case, the same effects can be obtained.

The light-emitting device according to the present invention is not limited to the above-described embodiments and modified examples, and various other modified examples can be made. For example, in the above-described embodiments and each modified example, an example in which the present invention is applied to PCSEL and S-iPM lasers has been described, but the present invention is applicable to various other surface emitting laser elements.

REFERENCE SIGNS LIST 1A to 1F, 1H, 1J . . . Light-emitting device; 1G . . . Light-emitting apparatus; 2A to 2C . . . Surface emitting laser element; 2a . . . First light output surface; 2b . . . Second light output surface; 2c . . . Laser light output region; 3A to 3E . . . (Reflective) metasurface; 3a . . . Main surface; 4 . . . Dielectric layer; 5, 5A . . . Drive circuit; 6A to 6C . . . Metal film; 8A to 8C . . . Metal film; 9A, 9B . . . Light transmissive layer; 9a, 9c . . . Main surface; 9b, 9d . . . Back surface; 9f, 9g . . . Portion; 10 . . . Semiconductor substrate; 10a . . . Main surface; 10b . . . Back surface; 11 . . . Lower cladding layer; 12 . . . Active layer; 13 . . . Upper cladding layer; 14 . . . Contact layer; 14a . . . Surface; 15A . . . Photonic crystal layer; 15B, 15C . . . Phase modulation layer; 15a . . . Base layer; 15b . . . Modified refractive index region; 16, 16B, 17 . . . Electrode; 16a, 17a . . . Opening; 19 . . . Antireflection film; 20, 21 . . . Unit region; 31 . . . Light guide layer; 31c . . . Recess portion; 32 . . . Current constriction layer; 32a . . . Opening; 33 . . . ¼ wavelength plate; 34 . . . Polarizing plate; 41 . . . Resist; 41a . . . Opening; 51 . . . Transistor; 51a . . . Gate electrode; 51b . . . Source electrode; 51c . . . Drain electrode; 51d . . . Wiring; 52 . . . Capacitor; 53 . . . Gate drive wiring; 54 . . . Voltage supply wiring; 55 . . . Semiconductor layer; 55a, 55b . . . Semiconductor region; 55c . . . Surface; 57, 58 . . . Insulation layer; 59 . . . Dielectric layer; 61, 62, 63 . . . Partial metal film; 71 . . . Control circuit; 72 . . . Drive circuit; 73 . . . Support substrate; 81, 82 . . . Partial metal film; 92 . . . Transparent conductive layer; 92a . . . Metallized layer; 93 . . . Dielectric layer; 94 . . . Gap; 95 . . . Insulation portion; B1 . . . First optical image portion; B2 . . . Second optical image portion; B3 . . . Zero-order light; L . . . Straight line; G . . . Center of gravity; L1, L2 . . . Laser light; L1a . . . Polarization direction; M . . . Metal material; O . . . Lattice point (center); Pa . . . Wavefront; Q1 . . . Region; Q . . . Center; R . . . Unit constituent region; RIN . . . Inner region; ROUT . . . Outer region; Vd Drive voltage; and Vg . . . Gate voltage.

The invention claimed is:
1. A light-emitting device, comprising:
a surface emitting laser element including a first light output surface and a second light output surface opposing each other;
a light guide layer disposed on the second light output surface; and
a reflective metasurface disposed on the second light output surface via the light guide layer, wherein
the reflective metasurface includes
a light transmissive layer disposed on an opposite side of the second light output surface with respect to the light guide layer, the light transmissive layer including a dielectric layer, the light transmissive layer including a first surface located between the light guide layer and the dielectric layer, and a second surface located on an opposite side of the first surface with respect to the dielectric layer, a first metal film disposed on the first surface, and a second metal film disposed on the second surface, the second metal film reflecting, towards the light guide layer, a laser light inputted from the surface emitting laser element to the light transmissive layer via the light guide layer, a plurality of unit regions are set on the first surface of the light transmissive layer so as to constitute a one-dimensional array or a two-dimensional array, each of the plurality of unit regions includes an exposed portion of the light transmissive layer which faces the light guide layer without being blocked by the first metal film, and a width of each of the plurality of unit regions and a thickness of the light transmissive layer are shorter than a wavelength of the laser light, the reflective metasurface is configured to modulate a phase of the laser light for each of the unit regions, and the laser light that is modulated by the reflective metasurface passes through the second light output surface, and then, is outputted from the first light output surface.

2. The light-emitting device according to claim 1, wherein parts of the first metal film in two or more unit regions of the plurality of unit regions have widths along a first direction defined on the first surface that are different from each other.

3. The light-emitting device according to claim 1, wherein the light transmissive layer further includes a transparent conductive layer disposed between the dielectric layer and the light guide layer or between the dielectric layer and the second metal film, and at least one of the first metal film and the second metal film includes a plurality of metal film elements disposed in each of the plurality of unit regions in a state of being separated from one another.

4. The light-emitting device according to claim 3, further comprising:

a drive circuit configured to control a voltage applied between the first metal film and the second metal film, wherein the drive circuit is configured to individually control a voltage of the plurality of metal film elements of at least any of the first metal film and the second metal film.

5. The light-emitting device according to claim 4, wherein the drive circuit is configured to set the first metal film to a reference potential, and the first metal film extends over two or more unit regions of the plurality of unit regions.

6. The light-emitting device according to claim 3, wherein the transparent conductive layer contains at least one of indium oxide and zinc oxide whose resistance is reduced by a dopant.

7. The light-emitting device according to claim 1, wherein the surface emitting laser element includes a substrate including a main surface and a back surface opposing the main surface, and an active layer and a photonic crystal layer disposed on the main surface, and the photonic crystal layer includes a base layer and a plurality of modified refractive index regions having a refractive index different from a refractive index of the base layer, the plurality of modified refractive index regions arrayed on a reference plane perpendicular to a thickness direction of the photonic crystal layer.

8. The light-emitting device according to claim 1, wherein the surface emitting laser element is an element that outputs light that forms an optical image along a normal direction of a main surface of a substrate, a tilt direction intersecting with the normal direction, or both the normal direction and the tilt direction, and the surface emitting laser element has the substrate having the main surface and a back surface opposing the main surface, and an active layer and a phase modulation layer disposed on the main surface, the phase modulation layer includes a base layer and a plurality of modified refractive index regions having a refractive index different from a refractive index of the base layer, the plurality of modified refractive index regions constituting a two-dimensional array on a reference plane perpendicular to a thickness direction of the phase modulation layer, and in an imaginary square lattice in which a lattice point is associated with each of the plurality of modified refractive index regions set on the reference plane, a center of gravity of each of the plurality of modified refractive index regions is arranged at a position apart from a corresponding lattice point of the imaginary square lattice, the position forming a rotation angle for forming at least a part of the optical image around the corresponding lattice point with reference to a line segment connecting between adjacent lattice points.

9. The light-emitting device according to claim 1, wherein the surface emitting laser element is an element that outputs light that forms an optical image along a normal direction of a main surface of a substrate, a tilt direction intersecting with the normal direction, or both the normal direction and the tilt direction, and the surface emitting laser element has the substrate having the main surface and a back surface opposing the main surface, and an active layer and a phase modulation layer disposed on the main surface, the phase modulation layer includes a base layer and a plurality of modified refractive index regions having a refractive index different from a refractive index of the base layer, the plurality of modified refractive index regions constituting a two-dimensional array on a reference plane perpendicular to a thickness direction of the phase modulation layer, and in an imaginary square lattice in which a lattice point is associated with each of the plurality of modified refractive index regions set on the reference plane, a center of gravity of each of the plurality of modified refractive index regions is arranged on a straight line passing through lattice points of the imaginary square lattice and tilted with respect to the square lattice, and a distance, on the straight line, between a center of gravity of each of the plurality of modified refractive index regions and a corresponding lattice point is set so that at least a part of the optical image is formed.

10. The light-emitting device according to claim 7, wherein a rotational symmetry of 180° is excluded from a symmetry of a planar shape defined on the reference plane, of each of the plurality of modified refractive index regions.

11. The light-emitting device according to claim 1, wherein the dielectric layer contains at least any of aluminum oxide, silicon oxide, and magnesium fluoride.

12. The light-emitting device according to claim 1, wherein a part of the dielectric layer constitutes the first surface.

13. The light-emitting device according to claim 1, wherein the light guide layer contains at least any of aluminum oxide, silicon oxide, magnesium fluoride, and calcium fluoride.

14. The light-emitting device according to claim 1, wherein
the surface emitting laser element further has a first electrode disposed on the first light output surface, and
the first electrode has a shape surrounding a laser light output region on the first light output surface.

15. The light-emitting device according to claim 1, wherein the surface emitting laser element further has a first electrode disposed side by side with a laser light output region on the first light output surface.

16. The light-emitting device according to claim 1, wherein
the surface emitting laser element further has a second electrode disposed on the second light output surface, and
the second electrode has a shape surrounding the reflective metasurface.

17. The light-emitting device according to claim 1, further comprising:
a ¼ wavelength plate disposed between the second light output surface and the reflective metasurface, and
a polarizing plate disposed on the first light output surface.

18. The light-emitting device according to claim 8, wherein a rotational symmetry of 180° is excluded from a symmetry of a planar shape defined on the reference plane, of each of the plurality of modified refractive index regions.

19. The light-emitting device according to claim 9, wherein a rotational symmetry of 180° is excluded from a symmetry of a planar shape defined on the reference plane, of each of the plurality of modified refractive index regions.

* * * * *